(12) United States Patent
Yoshida et al.

(10) Patent No.: US 8,547,315 B2
(45) Date of Patent: Oct. 1, 2013

(54) DISPLAY DEVICE

(75) Inventors: Yasunori Yoshida, Kanagawa (JP); Hajime Kimura, Kanagawa (JP); Shinji Maekawa, Shizuoka (JP); Osamu Nakamura, Kanagawa (JP); Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/540,664

(22) Filed: Jul. 3, 2012

(65) Prior Publication Data

US 2012/0276960 A1     Nov. 1, 2012

Related U.S. Application Data

(63) Continuation of application No. 13/293,762, filed on Nov. 10, 2011, now Pat. No. 8,228,277, and a continuation of application No. 12/784,063, filed on May 20, 2010, now Pat. No. 8,102,347, which is a continuation of application No. 10/579,987, filed on May 19, 2006, now Pat. No. 7,733,315.

(30) Foreign Application Priority Data

Dec. 6, 2004    (JP) .................................. 2004-353457

(51) Int. Cl.
 *G09G 3/36*          (2006.01)
(52) U.S. Cl.
 USPC .......... 345/90; 345/100; 345/211; 315/169.1; 315/169.3; 257/207; 438/149
(58) Field of Classification Search
 USPC ............. 345/45, 60, 63, 76, 90, 92, 100, 206, 345/211, 204, 212, 214; 315/169.1–169.3; 257/59, 72, E27.113, E27.116, E29.279, 257/207; 438/149, 157, 164, 459; 445/24
 See application file for complete search history.

(56) References Cited

U.S. PATENT DOCUMENTS 4,468,659 A    8/1984    Ohba et al.
4,937,517 A    6/1990    Kurashima
(Continued)

FOREIGN PATENT DOCUMENTS

EP    0 895 219 A1    2/1999
EP    0 935 229 A1    8/1999
(Continued)

OTHER PUBLICATIONS

Korean Office Action (Application No. 2011-7026335; PCTKR08407D1) Dated Jan. 25, 2013.

(Continued)

*Primary Examiner* — Haiss Philogene
(74) *Attorney, Agent, or Firm* — Nixon Peabody LLP; Jeffrey L. Costellia

(57) ABSTRACT

The invention provides an active matrix EL display device which can perform a clear multi-gray scale color display. In particular, the invention provides a large active matrix EL display device at low cost by a manufacturing method which can selectively form a pattern. Power supply lines in a pixel portion are arranged in matrix by the manufacturing method which can selectively form a pattern. Further, capacitance between wirings is reduced by providing a longer distance between adjacent wirings by the manufacturing method which can selectively form a pattern.

23 Claims, 35 Drawing Sheets

(56) References Cited

U.S. PATENT DOCUMENTS

| | | | |
|---|---|---|---|
| 4,989,062 | A | 1/1991 | Takahashi et al. |
| 5,440,208 | A | 8/1995 | Uskali et al. |
| 5,670,792 | A | 9/1997 | Utsugi et al. |
| 5,831,709 | A | 11/1998 | Song |
| 6,058,257 | A | 5/2000 | Nojima |
| 6,087,885 | A | 7/2000 | Tobita |
| 6,118,151 | A | 9/2000 | Tsutsu |
| 6,127,704 | A | 10/2000 | Kim |
| 6,239,958 | B1 | 5/2001 | Kato et al. |
| 6,348,702 | B1 | 2/2002 | Takayama et al. |
| 6,380,558 | B1 | 4/2002 | Yamazaki et al. |
| 6,421,034 | B1 | 7/2002 | Mihara |
| 6,469,317 | B1 | 10/2002 | Yamazaki et al. |
| 6,475,845 | B2 | 11/2002 | Kimura |
| 6,476,419 | B1 | 11/2002 | Yasuda |
| 6,512,504 | B1 | 1/2003 | Yamauchi et al. |
| 6,518,941 | B1 | 2/2003 | Kimura |
| 6,522,079 | B1 | 2/2003 | Yamada |
| 6,524,895 | B2 | 2/2003 | Yamazaki et al. |
| 6,529,178 | B1 | 3/2003 | Kimura |
| 6,531,713 | B1 | 3/2003 | Yamazaki |
| 6,545,359 | B1 | 4/2003 | Ohtani et al. |
| 6,548,960 | B2 | 4/2003 | Inukai |
| 6,556,177 | B1 | 4/2003 | Katayama et al. |
| 6,580,408 | B1 | 6/2003 | Bae et al. |
| 6,580,409 | B1 | 6/2003 | Ito et al. |
| 6,583,577 | B1 | 6/2003 | Choi et al. |
| 6,593,691 | B2 | 7/2003 | Nishi et al. |
| 6,618,029 | B1 | 9/2003 | Ozawa |
| 6,633,270 | B2 | 10/2003 | Hashimoto |
| 6,682,963 | B2 | 1/2004 | Ishikawa |
| 6,700,330 | B2 | 3/2004 | Koyama |
| 6,714,178 | B2 | 3/2004 | Koyama et al. |
| 6,724,149 | B2 | 4/2004 | Komiya et al. |
| 6,765,549 | B1 | 7/2004 | Yamazaki et al. |
| 6,958,489 | B2 | 10/2005 | Kimura |
| 7,009,345 | B2 | 3/2006 | Komiya et al. |
| 7,012,290 | B2 | 3/2006 | Kimura |
| 7,029,960 | B2 | 4/2006 | Hashimoto et al. |
| 7,045,861 | B2 | 5/2006 | Takayama et al. |
| 7,109,071 | B2 | 9/2006 | Ishikawa |
| 7,148,630 | B2 | 12/2006 | Koyama et al. |
| 7,192,859 | B2 | 3/2007 | Yamazaki et al. |
| 7,221,337 | B1 | 5/2007 | Choi et al. |
| 7,236,164 | B2 | 6/2007 | Kimura |
| 7,245,297 | B2 | 7/2007 | Kimura et al. |
| 7,397,451 | B2 | 7/2008 | Ozawa |
| 7,408,193 | B2 | 8/2008 | Ishikawa |
| 7,460,094 | B2 | 12/2008 | Ozawa |
| 7,592,652 | B2 | 9/2009 | Kimura |
| 7,619,593 | B2 | 11/2009 | Fish et al. |
| 7,642,555 | B2 | 1/2010 | Ishikawa |
| 7,687,808 | B2 | 3/2010 | Umezaki |
| 7,733,315 | B2 | 6/2010 | Yoshida et al. |
| 7,859,510 | B2 * | 12/2010 | Umezaki ............. 345/100 |
| 2001/0004190 | A1 | 6/2001 | Nishi et al. |
| 2001/0022565 | A1 | 9/2001 | Kimura |
| 2001/0048408 | A1 | 12/2001 | Koyama et al. |
| 2002/0011976 | A1 | 1/2002 | Hashimoto |
| 2002/0024493 | A1 | 2/2002 | Ozawa et al. |
| 2003/0047729 | A1 | 3/2003 | Hirai et al. |
| 2003/0151568 | A1 | 8/2003 | Ozawa |
| 2003/0201496 | A1 | 10/2003 | Yamazaki et al. |
| 2004/0108978 | A1 | 6/2004 | Matsueda et al. |
| 2005/0140306 | A1 | 6/2005 | Park |
| 2007/0080917 | A1 | 4/2007 | Koyama et al. |
| 2007/0181945 | A1 | 8/2007 | Nakamura |
| 2008/0158209 | A1 | 7/2008 | Ozawa |
| 2008/0165174 | A1 | 7/2008 | Ozawa |
| 2008/0198152 | A1 | 8/2008 | Ozawa |
| 2008/0290807 | A1 | 11/2008 | Matsueda et al. |
| 2009/0315066 | A1 | 12/2009 | Kimura |

FOREIGN PATENT DOCUMENTS

| | | |
|---|---|---|
| EP | 0 949 603 A1 | 10/1999 |
| EP | 1 058 310 A2 | 12/2000 |
| EP | 1 139 454 A2 | 10/2001 |
| EP | 1 291 932 A2 | 3/2003 |
| EP | 1 505 650 A2 | 2/2005 |
| EP | 1 505 651 A2 | 2/2005 |
| EP | 1 505 652 A2 | 2/2005 |
| EP | 2 112 693 A2 | 10/2009 |
| JP | 57-041694 | 3/1982 |
| JP | 63-083798 | 6/1988 |
| JP | 04-031299 | 3/1992 |
| JP | 04-229529 | 8/1992 |
| JP | 04-234785 | 8/1992 |
| JP | 04-250492 | 9/1992 |
| JP | 05-035207 | 2/1993 |
| JP | 06-176868 | 6/1994 |
| JP | 08-129158 | 5/1996 |
| JP | 08-171081 | 7/1996 |
| JP | 09-114398 | 5/1997 |
| JP | 09-260061 | 10/1997 |
| JP | 09-281928 | 10/1997 |
| JP | 10-092576 | 4/1998 |
| JP | 10-247735 | 9/1998 |
| JP | 10-284690 | 10/1998 |
| JP | 11-024606 | 1/1999 |
| JP | 11-073158 | 3/1999 |
| JP | 11-219133 | 8/1999 |
| JP | 2000-132133 | 5/2000 |
| JP | 2000-242196 | 9/2000 |
| JP | 2001-53287 | 2/2001 |
| JP | 2001-100654 | 4/2001 |
| JP | 2001-282137 | 10/2001 |
| JP | 2001-324958 | 11/2001 |
| JP | 2002-032037 | 1/2002 |
| JP | 2002-164354 | 6/2002 |
| JP | 2003-177682 | 6/2003 |
| JP | 2004-126439 | 4/2004 |
| KR | 1999-0018059 | 3/1999 |
| KR | 1999-0025571 | 4/1999 |
| KR | 2001-0093076 | 10/2001 |
| KR | 2005-0065947 | 6/2005 |
| WO | WO 98/36407 | 8/1998 |
| WO | WO-9912150 A1 | 3/1999 |
| WO | WO 2004/086487 A1 | 10/2004 |
| WO | WO 2005-048222 A1 | 5/2005 |

OTHER PUBLICATIONS

Korean Office Action (Application No. 2007-7015518; PCTKR08407) Dated Mar. 30, 2012.

Schenk.H et al., "Polymers for Light Emitting Diodes,", Eurodisplay '99 : The 19th International Display Research Conference, Sep. 6, 1999, pp. 33-37.

Japanese Office Action (Application No. 2001-140325; J05709) Dated Aug. 24, 2010.

Chinese Patent Application No. 200580041540.3 dated May 30, 2008 with English translation.

Shimoda.T et al., "Technology for Active Matrix Light Emitting Polymer Displays,", IEDM 99: Technical Digest of International Electron Devices Meeting, 1999, pp. 107-110.

Kimura.M et al., "Low-Temperature Poly-Si TFT Driven Light-Emitting-Polymer Displays and Digital Gray Scale for Uniformity,", IDW '99 : Proceedings of the 6th International Display Workshops, 1999, pp. 171-174.

Chinese Office Action in Chinese Patent Application No. 200580041540.3 dated May 30, 2008 with English translation.

Kimura et al. "TFT-LEPD with Image Uniformity by Area Ratio Gray Scale", Euro Display 99, Sep. 6, 1999, pp. 71-74.

International Search Report for PCT/JP2005/022608 dated Mar. 14, 2006.

Written Opinion of the International Searching Authority for PCT/JP2005/022608 dated Mar. 14, 2006.

\* cited by examiner

Fig. 5A
Fig. 5B
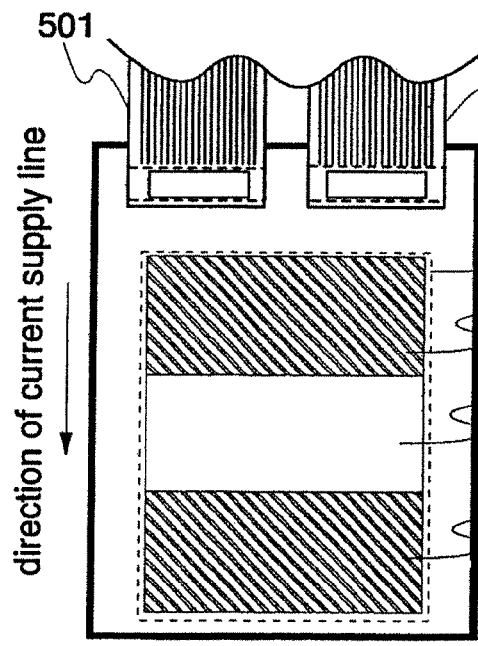
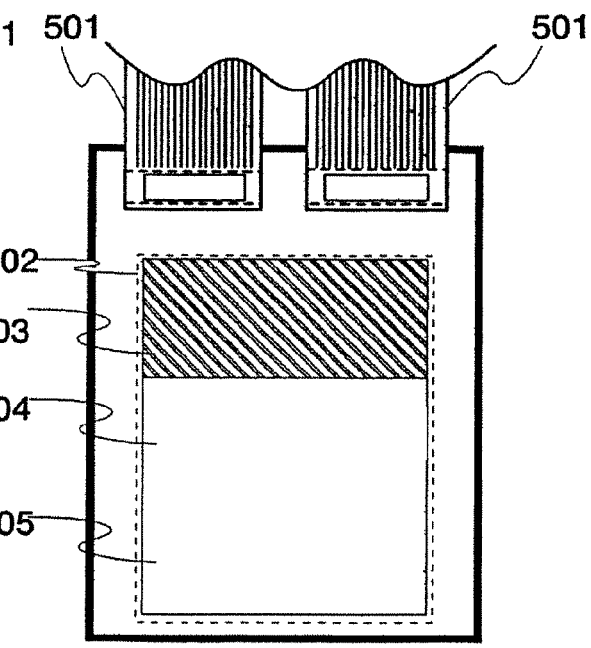

1506

1522

1520        1521

DISPLAY DEVICE

This application is a Continuation of U.S. application Ser. No. 13/293,762 filed on Nov. 10, 2011, now U.S. Pat. No. 8,228,277 which is a Continuation of U.S. application Ser. No. 12/784,063 filed on May 20, 2010, now U.S. Pat. No. 8,102,347 which is a Continuation of U.S. application Ser. No. 10/579,987 filed on May 19, 2006, now U.S. Pat. No. 7,733,315.

TECHNICAL FIELD

The present invention relates to an electronic display (electro-optic device) in which EL (electroluminescence) elements are formed over a substrate. In particular, the invention relates to a display device using a semiconductor element (element using a semiconductor thin film). Further, the invention relates to an electronic device using an EL display device in a display portion.

BACKGROUND ART

In recent years, a technique to form a thin film transistor (hereinafter referred to as a TFT in this specification) over a substrate has been drastically advanced and developed for an application to an active matrix display device. In particular, a TFT using a polycrystalline semiconductor film such as polysilicon is higher than a conventional TFT using an amorphous semiconductor film such as amorphous silicon in field effect mobility (also referred to as mobility), which enables a fast operation. Accordingly, pixels which are conventionally controlled by a driver circuit outside a substrate can now be controlled by a driver circuit formed over the same substrate as the pixels.

In an active matrix display device using such a polycrystalline semiconductor film, various circuits and elements can be formed over the same substrate. Therefore, there are various advantages such as reduction in manufacturing cost, downsizing of a display device, improvement of yield, and reduction of throughput.

Further, a research on an active matrix EL display device using an EL element as a self-luminous element has been activated. An EL display device is also referred to as an organic EL display (OELD) or an organic light emitting diode (OLED).

An EL element has a structure in which a pair of electrodes (anode and cathode) sandwich an EL layer which normally has a stacked-layer structure. Typically, there is a stacked layer structure of "a hole transporting layer, a light emitting layer, and an electron transporting layer" suggested by Tang et al. at Eastman Kodak Company. This structure has quite high light emitting efficiency and is employed for most EL display devices now being researched and developed.

Besides, a stacked-layer structure of a hole injecting layer, a hole transporting layer, a light emitting layer, and an electron transporting layer or a stacked-layer structure of a hole injecting layer, a hole transporting layer, a light emitting layer, an electron transporting layer, and an electron injecting layer over an anode may be employed as well. The light emitting layer may be doped with a phosphorescence pigment and the like.

In this specification, all layers provided between a cathode and an anode are collectively referred to as an EL layer. Therefore, the hole injecting layer, the hole transporting layer, the light emitting layer, the electron transporting layer, the electron injecting layer and the like are all included in the EL layer.

When a predetermined voltage is applied to an EL layer with the aforementioned structure from the pair of electrodes, carriers are recombined in the light emitting layer and light is emitted. In this specification, when an EL element emits light, it is referred that EL element is driven. Further in this specification, a light emitting element formed of an anode, an EL layer, and a cathode is referred to as an EL element.

It is to be noted in this specification that an EL element may utilize both light emission (phosphorescence) which occurs from a singlet excitation state and light emission (fluorescence) which occurs from a triplet excitation state.

An EL display device may be driven by an analog driving method (analog drive) and a digital driving method (digital drive). First, description is made with reference to FIGS. 1 and 2 on the analog drive of an EL display device.

FIG. 1 shows a structure of a pixel portion 100 of an analog drive EL display device. Gate signal lines (G1 to Gy) each of which is inputted with a selection signal from a gate signal line driver circuit is connected to a gate electrode of a switching TFT 101 of each pixel. One of a source region and a drain region of the switching TFT 101 of each pixel is connected to each of source signal lines (also referred to as a data signal line) (S1 to Sx) which is inputted with an analog video signal and the other is connected to a gate electrode of a driving TFT 104 and a capacitor 108 of each pixel.

One of a source region and a drain region of the driving TFT 104 of each pixel is connected to each of power supply lines (V1 to Vx) and the other is connected to an EL element 106. A potential of each of the power supply lines (V1 to Vx) is referred to as a power source potential. Each of the power supply lines (V1 to Vx) is connected to the capacitor 108 of each pixel.

The EL element 106 has an anode, a cathode, and an EL layer provided between the anode and the cathode. In the case where the anode of the EL element 106 is connected to the source region or the drain region of the driving TFT 104, the anode of the EL element 106 is a pixel electrode while the cathode thereof is a counter electrode. In the case where the cathode of the EL element 106 is connected to the source region or the drain region of the driving TFT 104, the anode of the EL element 106 is a counter electrode while the cathode thereof is a pixel electrode.

In this specification, a potential of a counter electrode is referred to as a counter potential. A power source which applies a counter potential to a counter electrode is referred to as a counter power source. A potential difference between a potential of a pixel electrode and a potential of a counter electrode is an EL driving voltage which is applied to an EL layer.

FIG. 2 shows a timing chart of the EL display device shown in FIG. 1 driven by an analog method. A period from selection of one gate signal line until the selection of a different gate signal line is referred to as one line period (L). A period from a display of one image until a display of a next image corresponds to one frame period (F). In the case of the EL display device of FIG. 1, there are y gate signal lines, therefore, y line periods (L1 to Ly) are provided in one frame period.

The power supply lines V1 to Vx are held at a certain power source potential. The counter potential which is a potential of the counter electrode is also held at a certain potential. The counter potential and the power source potential have a potential difference such that an EL element emits light.

In a first line period (L1), the gate signal line G1 is inputted with a selection signal from a gate signal line driver circuit. Then, analog video signals are sequentially inputted to the source signal lines S1 to Sx. Since all switching TFTs connected to the gate signal line G1 are turned on, the analog video signals inputted to the source signal lines S1 to Sx are inputted through the switching TFTs to the gate electrodes of the driving TFTs.

The amount of current flowing through a channel forming region of a driving TFT is controlled by a gate voltage thereof.

Here, description is made on an example where a source region of a driving TFT is connected to a power supply line and a drain region thereof is connected to an EL element.

As the source region of the driving TFT is connected to the power supply line, each pixel in a pixel portion is inputted with the same potential. At this time, when an analog signal is inputted to a source signal line, a potential difference between a potential of the signal voltage and a potential of the source region of the driving TFT becomes a gate voltage. A current flowing to an EL element depends on a gate voltage of the driving TFT. Here, luminance of the EL element is in proportion with a current flowing between opposite electrodes of the EL element. In this manner, an EL element emits light depending on a voltage of an analog video signal.

The aforementioned operation is repeated, and when analog video signals are inputted to all the source signal lines (S1 to Sx), the first line period (L1) ends. It is to be noted that the period until the analog video signals are all inputted and a horizontal retrace line period together may be one line period. Then, in a second line period (L2), the gate signal line G2 is inputted with a selection signal. Similarly to the case of the first line period (L1), analog video signals are sequentially inputted to the source signal lines (S1 to Sx).

When the selection signals are inputted to all the gate signal lines (G1 to Gy), all the line periods (L1 to Ly) end. When all the line periods (L1 to Ly) end, one frame period ends. In one frame period, all the pixels perform display to form one image. It is to be noted that all the line periods (L1 to Ly) and a vertical retrace line period together may be one frame period.

As described above, the amount of light emitted by an EL element is controlled by an analog video signal. By controlling the amount of light emission, a gray scale display is performed. This method is a so-called analog driving method, where a gray scale display is performed by changing a voltage of an analog video signal inputted to the source signal line.

Next, description is made on a digital drive of an EL display device. In a digital gray scale method, a gate-source voltage Vg of the driving TFT 104 operates in two stages: either in a region (equal to a light emission start voltage or lower) that no current flows to the EL element 106 or a region (equal to a luminance saturation voltage or higher) that the largest current flows thereto. That is, an EL element either emits light or emits no light.

An EL display mainly employs the digital gray scale method in which variations in characteristics such as a threshold value of a TFT do not easily affect a display. In the case of the digital gray scale method, however, only two gray scale levels can be displayed by itself. Therefore, a plurality of techniques to employ the digital gray scale method in combination with another method are suggested to perform a multi gray scale display.

One of these techniques is a method of using an area gray scale method and the digital gray scale method in combination. The area gray scale method is a method for displaying gray scales by controlling the area of portions which emit light. That is, one pixel is divided into a plurality of subpixels, and the number and the area of subpixels which emit light are controlled to display a gray scale. This method is disadvantageous in that high resolution and multi gray scales display cannot be easily achieved as the number of subpixels cannot be increased. Non-patent Documents 1, 2, and the like disclose the area gray scale method.

Another method to achieve a multi gray scale display is a method for using a time gray scale method and the digital gray scale method in combination. The time gray scale method is a method for displaying gray scales by utilizing a difference in light emission time. That is, one frame period is divided into a plurality of subframe periods, and gray scales are displayed by controlling the number and length of the subframe periods in which light is emitted (see Patent Document 1).

Non-patent Document 3 discloses the case of using the digital gray scale method, the area gray scale method, and the time gray scale method in combination.

Next, description is made on a constant current drive and a constant voltage drive in the case of displaying gray scales by the digital gray scale method.

The constant current drive is a driving method to operate the driving TFT 104 in a saturation region when the EL element 106 emits light and supply a constant current to all pixels. This driving method is advantageous in that a constant current can be supplied to the EL element 106 even when the EL element 106 deteriorates and V-I characteristics change, which leads to prolong life of an EL display device.

On the other hand, the constant voltage drive is a driving method to operate the driving TFT 104 in a linear region when the EL element 106 emits light and supply a constant voltage to all pixels. This driving method is advantageous in that a constant voltage can be applied to the EL element 106 even when characteristics of the driving TFT 104 vary, which leads to no variations in luminance of pixels and high display quality.

[Non-Patent Document 1]
Euro Display 99 Late News: P71 "TFT-LEPD with Image Uniformity by Area Ratio Gray Scale"
[Non-Patent Document 2]
IEDM 99: P107: "Technology for Active Matrix Light Emitting Polymer Displays"
[Non-Patent Document 3]
IDW'99: P171: "Low-Temperature Poly-Si TFT Driven Light-Emitting-Polymer Displays and Digital Gray Scale for Uniformity"
[Patent Document 1]
Japanese Patent Laid-open No. 2001-324958

DISCLOSURE OF INVENTION

The invention provides a large and high resolution EL display device with favorable yield which can be manufactured at low cost. In view of this, following problems exist.

First, description is made on problems in the case of using the digital gray scale method and the time gray scale method in combination as a driving method of an EL display device. In the case of using the digital gray scale method and the time gray scale method in combination, one frame period is divided into a plurality of subframe periods and the number and length of the subframe periods in which light is emitted are controlled to display a gray scale. That is, as compared to time which can be spent for displaying one image by the analog gray scale method, only the subframe number-th part of time can be spent to display one image in the case of using the digital gray scale method and the time gray scale method in combination, which requires a driver circuit to operate at quite a fast speed as compared to the analog gray scale method.

Further, an operating frequency of a driver circuit is limited. If one frame is divided into too many subframes or the resolution is too high, sufficient write time cannot be provided. That is, one of the problems in using the digital gray scale method and the time gray scale method in combination is insufficient write time. In view of this, write time is required to be provided as long as possible.

Next, description is made on a problem in increase of parasitic capacitance. The larger and higher resolution display device has a pixel portion with a longer wiring. Further, the number of wirings to cross the wirings is increased, which leads to increase parasitic capacitance of the wirings in the pixel portion.

When the parasitic capacitance is increased, dullness of waveform of electric signal transmitting through the wiring is increased. The dullness of the waveform prevents accurate transmission of signals and degrades display quality. That is, one of the problems in manufacturing a large and high resolution EL display device is an increase in parasitic capacitance. In view of this, parasitic capacitance is required to be as little as possible.

Next, description is made on a problem in manufacturing at low cost. At present, a TFT and an electronic circuit using a TFT are generally manufactured by stacking various thin films such as a semiconductor, an insulator and a conductor over a substrate and forming a predetermined pattern by a photolithography technique appropriately. The photolithography technique is a technique to transfer a pattern such as a circuit formed of a material which does not transmit light over a light-transmissive plane surface called a photo mask onto a substrate by utilizing light. This technique is widely used in manufacturing steps of a semiconductor integrated circuit and the like.

Manufacturing steps using the photolithography technique require a number of steps such as exposure, development, baking, and peeling even only for a mask pattern formed of a photosensitive organic resin material called a photo resist. Therefore, as the number of photolithography steps increases, manufacturing cost necessarily increases.

Next, description is made on a problem of wiring resistance. First, description is made on the case of using the analog driving method as a driving method of an EL display device.

FIG. 3 is a graph showing characteristics of a driving TFT in a saturation region (Vds>Vg−Vth). Here, Vds is a source-drain voltage, Vg is a gate-source voltage, and Vth is a threshold voltage. Reference numeral 301 denotes Id−Vg characteristics (or an Id−Vg curve). Here, Id denotes a drain current. By this graph, the amount of current flowing with any gate voltage can be known.

In the analog driving method, a driving TFT operates in a saturation region and a gate voltage is changed to change a drain current thereof.

An analog video signal inputted through a source signal line to a pixel when a switching TFT is turned on is applied to a gate electrode of a driving TFT. In this manner, a gate voltage of the driving TFT changes. At this time, the drain current is set in accordance with the ratio 1:1 to the gate voltage in accordance with the Id−Vg characteristics. In this manner, a predetermined drain current is supplied to an EL element in accordance with a voltage of an analog video signal inputted to a gate electrode of the driving TFT. The EL element emits light with the amount in accordance at the amount of the supplied current.

As described above, the amount of light emission of the EL element is controlled by an analog video signal, by which gray scale display is performed.

Here, a gate voltage of the driving TFT of each pixel changes when a potential of a source region of the driving TFT changes even with the same signal inputted from the source signal line. Here, the potential of the source region of the driving TFT is applied from the power supply line. However, a potential of the power supply line changes depending on a position in the pixel portion due to a potential drop caused by wiring resistance.

Further, in the case where wiring resistance of the power supply line is small, the case where the display device is relatively small, or the case where a current flowing through the power supply line is relatively small, the potential change of the power supply line due to a potential drop caused by wiring resistance does not have so much effect, but has a significant effect besides the above cases, in particular in the case where the display device is relatively large.

In particular, as the display device is larger, there are larger variations in distance from an external input terminal to each power supply line of a pixel portion, therefore, larger variations exist in length of wirings in a power supply line lead portion. Therefore, a change in potential of the power supply line due to a potential drop of the power supply line lead portion becomes large.

The variations in potential of the power supply line due to the aforementioned factors affect luminance of an EL element in each pixel and change display luminance, which cause display unevenness.

Hereinafter, description is made on a specific example of variations in potential of the power supply line.

As shown in FIG. 4, when a white or black box is displayed in a display screen, a phenomenon called a cross talk occurs. This is a phenomenon that a difference in luminance occurs between portions above and below the box and the portions beside the box.

Cross talk is a phenomenon that a different current flows to the driving TFTs 104 in pixels above, below, and beside the box. This difference is caused by the power supply lines V1 and V2 arranged in parallel to the source signal lines S1 and S2.

In the case where a white box is displayed in a portion of a display screen as shown in FIG. 4, the power supply line corresponding to a pixel which displays the white box has a larger potential drop due to wiring resistance as compared to a power supply line which supplies power only to pixels which do not display the white box, because current is supplied to an EL element through a source and drain of a driving TFT in the pixel which displays the white box. Therefore, there are portions above and below the white box which are darker than other pixels which do not display the white box.

Here, in the case where a display screen of a display device is small, the problem did not occur. However, with a larger display screen of the display device, the total amount of current flowing to an EL element increases in proportion with the area of the display screen.

For example, when comparing the total amount of current flowing to the EL element in a display device having a display screen of four inches diagonal and a display device having a display screen of 20 inches diagonal, the latter display screen is 25 times as large as the former, and thus the total amount of current supplied to the EL element is also about 25 times as large.

Accordingly, the aforementioned potential drop is quite a problem in a display device having a large display screen.

For example, provided that the display device having a display screen of 20 inches diagonal has a wiring with a length of 700 mm, a width of 10 mm, and sheet resistance of 0.1 ohm, when a current of 1 A flows, a potential drop of 10 V occurs and a normal display cannot be performed.

Next, description is made on problems of wiring resistance in the case of employing the constant voltage drive with the digital driving method as a driving method of an EL display device.

When the constant voltage drive is employed, a constant voltage is applied to the EL element 106 in each pixel. Therefore, an EL display device capable of displaying an image of quite high quality can be obtained with pixels whose luminance is not affected by variations in characteristics of the driving TFT 104. However, if wiring resistance is high, it is impossible to satisfy a necessary condition for performing the constant voltage drive, that a constant voltage is supplied to the EL element 106 in each pixel. Description is made on this with reference to FIGS. 5A and 5B.

FIG. 5A shows a panel in which a third of all pixels emit light at the same time. FIG. 5B shows a panel in which two third of all pixels emit light at the same time.

As different number of pixels emit light at the same time between the FIGS. 5A and 5B, different current values are supplied to the power supply lines (V1 to Vx) in a pixel portion when emitting light. Here, if there is wiring resistance in the power supply lines (V1 to Vx) in the pixel portion, a voltage drops in accordance with the amount of current. That is, in FIGS. 5A and 5B of which current values are different, a voltage applied per pixel is different. When different voltages are applied, luminance of an EL element differs between when displaying as shown in FIG. 5A and when displaying as shown in FIG. 5B.

In this manner, when luminance per pixel changes depending on a light emission rate of a displayed image, it adversely affects when displaying gray scales by the time gray scale method. For example, the case of displaying three gray scale levels are displayed continuously for the same period by the panels in FIGS. 5A and 5B. At this time, it is supposed that a display region 503 displays a gray scale 0, a display region 504 displays a gray scale 2, and a display region 505 displays a gray scale 1. However, with wiring resistance, the display region 505 displays a gray scale lower than 1 as luminance per pixel of FIG. 5A is higher than that of FIG. 5B. In this manner, with wiring resistance, desired gray scale cannot be displayed in the case of performing the constant voltage drive with the digital driving method.

This difference in luminance is larger as wiring resistance of the power supply lines (V1 to Vx) is higher. The larger a display device has a longer power supply line, which makes wiring resistance higher. That is, one of the problems in manufacturing a large and high resolution EL display device is the increase in wiring resistance. In view of this, wiring resistance is required to be as low as possible.

The invention is made in view of the aforementioned problems to provide an active matrix EL display device capable of a clear multi gray scale color display. The invention also provides a high functional electronic device using such an active matrix EL display device.

The invention provides a large and high resolution EL display device with favorable yield which can be manufactured at low cost. In view of this, a configuration of the invention is described below.

A configuration of the invention includes a display device comprising a plurality of source signal lines over an insulating surface, a plurality of gate signal lines, a plurality of power supply lines in columns, a plurality of power supply lines in rows, and a plurality of pixels arranged in matrix, wherein each of the plurality of pixels includes a switching thin film transistor, a driving thin film transistor, and a light emitting element, wherein each of the plurality of pixels is connected to one of the plurality of power supply lines in columns and one of the plurality of power supply lines in rows, and wherein an insulating thin film is formed in a portion under at least one of the plurality of source signal lines, the plurality of gate signal lines, the plurality of power supply lines in columns, and the plurality of power supply lines in rows.

Another configuration of the invention includes a method for manufacturing a display device comprising the steps of: forming a plurality of source signal lines over an insulating surface, forming a plurality of gate signal lines, forming a plurality of pixels arranged in matrix, and each of said plurality of pixels includes a switching thin film transistor, a driving thin film transistor, and a light emitting element, forming a plurality of power supply lines in columns, forming a plurality of power supply lines in rows, and connecting each of the plurality of pixels to one of the plurality of power supply lines in columns and one of the plurality of power supply lines in rows by a droplet discharging method or a printing method.

Another configuration of the invention includes a method for manufacturing a display device comprising the steps of: forming a source signal line over an insulating surface, forming a gate signal line, forming a power supply line, forming a pixel including a switching thin film transistor, a driving thin film transistor, and a light emitting element, forming an insulating thin film in a portion under at least one of the source signal line, the gate signal line, and the power supply line by a droplet discharging method or a printing method.

In the aforementioned invention, one of the plurality of source signal lines, the plurality of gate signal lines, and the plurality of power supply lines is formed by a sputtering method or a CVD method.

Here, the CVD method includes a plasma CVD method (an RF plasma CVD method, a microwave CVD method, an electron cyclotron resonant CVD method, a thermal filament CVD method and the like), an LPCVD method, and a thermal CVD method.

The invention is a personal computer using the display device in accordance with the aforementioned configuration of the invention.

The invention is a television receiver using the display device in accordance with the aforementioned configuration of the invention.

The invention is a camera such as a video camera using the display device in accordance with the aforementioned configuration of the invention.

The invention is an image reproducing device using the display device in accordance with the aforementioned configuration of the invention.

The invention is a head mounted display using the display device in accordance with the aforementioned configuration of the invention.

The invention is a portable information terminal using the display device in accordance with the aforementioned configuration of the invention.

According to the invention, a large and high resolution EL display device with favorable yield which can be manufactured at low cost can be provided. Further, as sufficient signal write time can be obtained, signals can be accurately inputted to pixels, thereby a clear image can be displayed. Further, as an effect of wiring resistance can be lessened, image quality defect due to wiring resistance can be reduced.

BRIEF DESCRIPTION OF DRAWINGS

FIGS. 5A and 5B are diagrams showing potential effects due to wiring resistance of a power supply line.

BEST MODE FOR CARRYING OUT THE INVENTION

Figure 1:
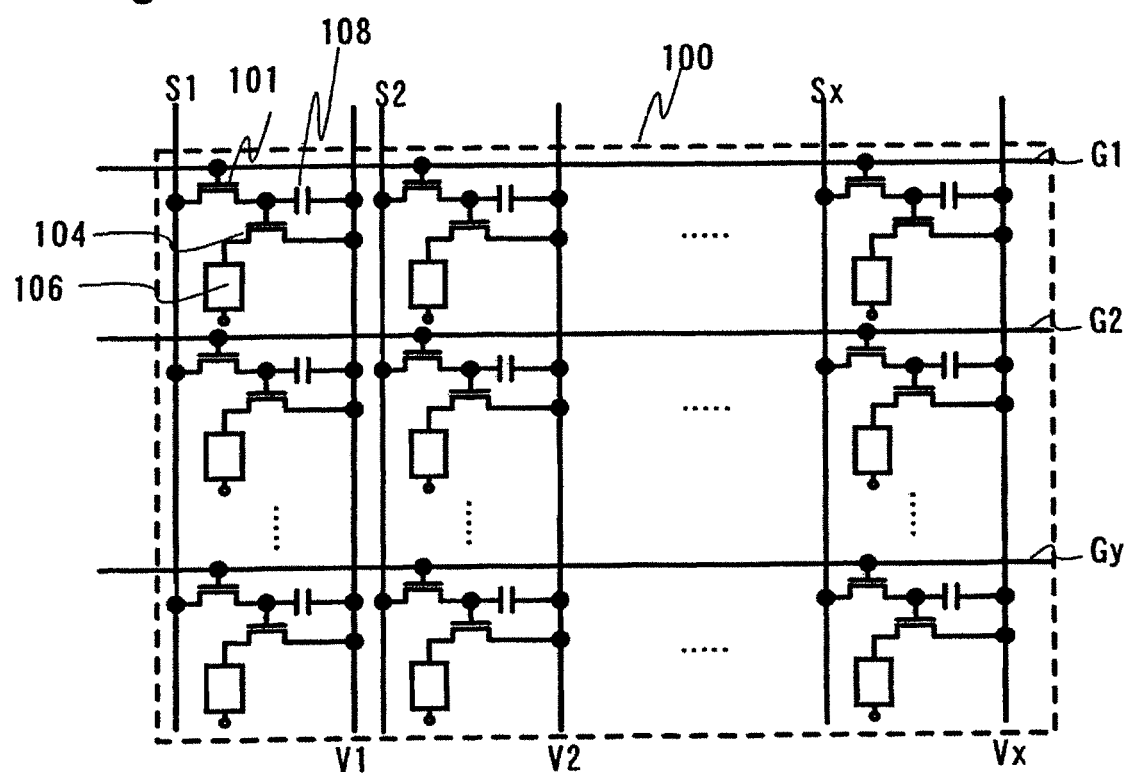
FIG. 1 is a diagram showing a pixel circuit of an EL display device.
Figure 2:
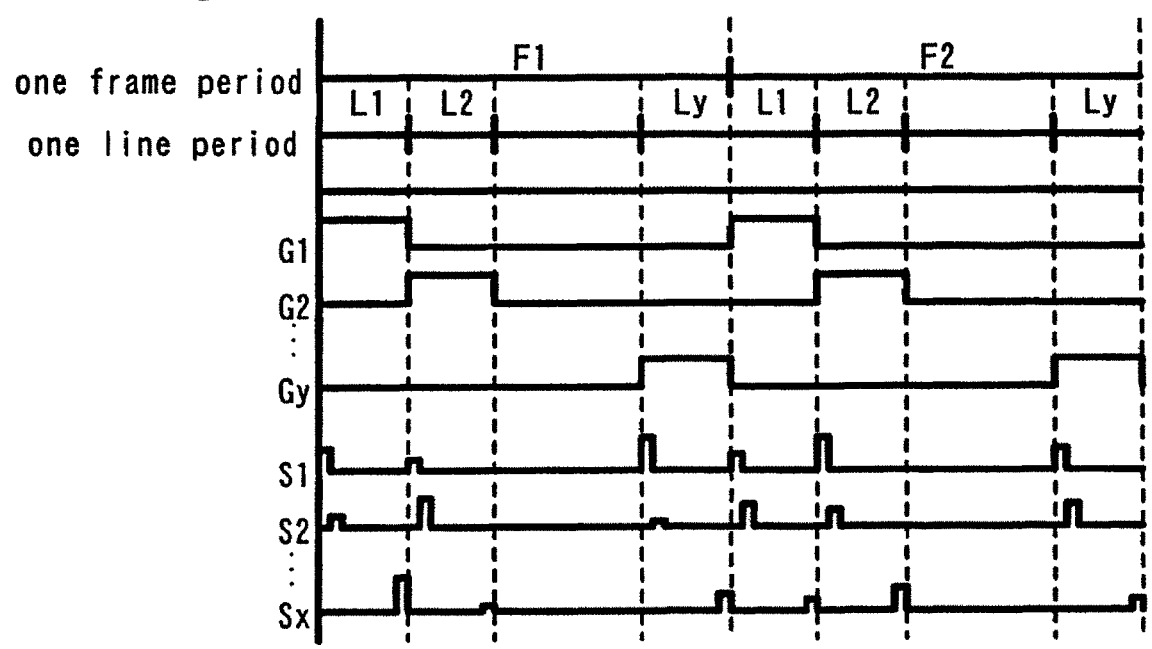
FIG. 2 is a diagram showing a driving timing of an analog drive.
Figure 3:
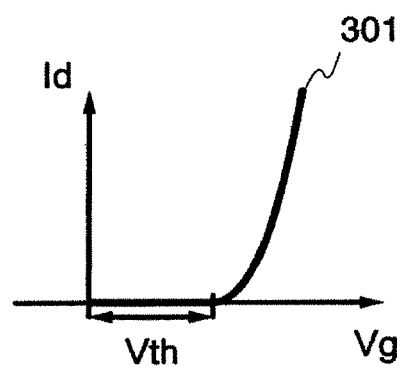
FIG. 3 is a diagram showing characteristics of a driving TFT.
Figure 4:
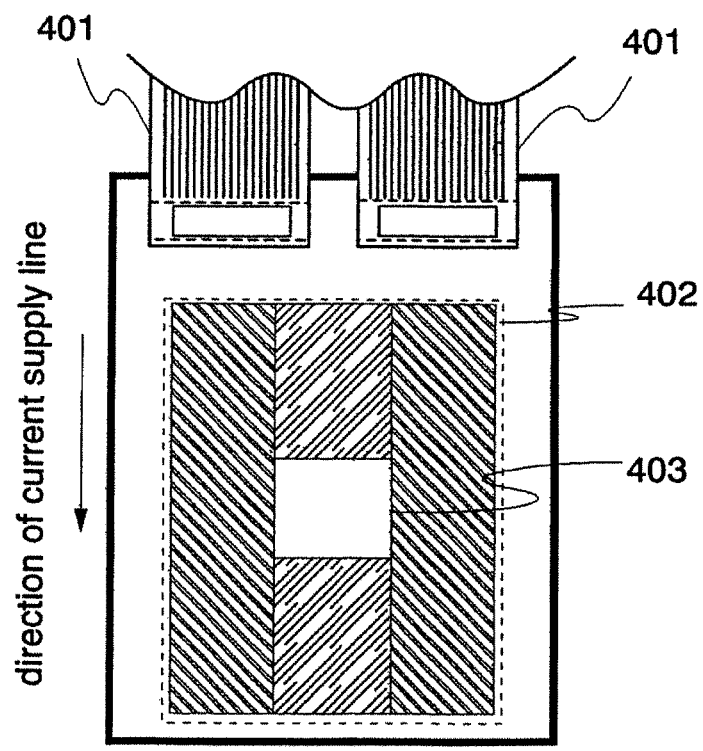
FIG. 4 is a diagram showing a cross talk by a box display.

Although the invention will be fully described by way of embodiment modes with reference to the accompanying drawings, it is to be understood that various changes and modifications will be apparent to those skilled in the art. Therefore, unless otherwise such changes and modifications depart from the scope of the invention, they should be construed as being included therein. Note that identical portions or portions having the identical function in embodiment modes are denoted by the same reference numerals and detailed descriptions thereof are omitted.

A transistor used for the invention is not exclusively limited to a certain type. It may be a thin film transistor (TFT) using a non-single crystalline semiconductor film represented by amorphous silicon or, polycrystalline silicon, a MOS transistor formed by using a semiconductor substrate or an SOI (Silicon On Insulator) substrate, a junction transistor, a bipolar transistor, a transistor using an organic semiconductor, a carbon nanotube, or the like. Furthermore, a substrate on which a transistor is mounted is not exclusively limited to a certain type. It may be a single crystalline substrate, an SOI substrate, a glass substrate, and the like.

Embodiment Mode 1

Description is made with reference to FIGS. 13A to 16B, 8, and 6A to 6C on an embodiment mode of the invention. First, it is one of the objects of the invention to manufacture an EL display device at low cost. In view of this, a TFT is manufactured by reducing the number of photolithography steps.

As a method for reducing the number of photolithography steps, a method for manufacturing a display device is suggested that one or more of patterns required for manufacturing a display panel, such as a conductive layer for forming a wiring layer or an electrode or a mask layer for forming a predetermined pattern is formed by a method which can selectively form a pattern. As the method which can selectively form a pattern, a droplet discharging method (also referred to as an ink-jetting method depending on the system) is suggested which can form a predetermined pattern by selectively discharging droplets of a composition which is blended for a specific purpose. Further, by employing a method for transferring or drawing a pattern, for example a printing method (a method for forming a pattern by screen printing, offset printing and the like) and the like, cost reduction can be achieved. That is, one of the problems in manufacturing an EL display device at low cost is the large number of photolithography steps. In view of this, the number of photolithography steps is required to be as small as possible, for which the method which can selectively form a pattern is effective.

Therefore, in this embodiment mode, an EL display device is manufactured by the droplet discharging method as one of manufacturing methods of an EL display device which can selectively form a pattern that is described below. Note that this is only an example and this embodiment mode is not limited to this method.

First, description is made with reference to FIGS. 13A to 14B on a manufacturing method of a display device including a channel protective type thin film transistor of which gate electrode, a source or drain wiring are manufactured by a means to improve adhesiveness.

A base film 801 to improve adhesiveness is formed over a substrate 800 as pre-base treatment. The substrate 800 is formed of a glass substrate such as a barium borosilicate glass and aluminoborosilicate glass, a quartz substrate, a silicon substrate, a metal substrate, a stainless substrate, or a plastic substrate with heat resistance to the processing temperature of the step in this embodiment mode. A surface of the substrate 800 may be planarized by polishing by a CMP (Chemical Mechanical Polishing) method and the like. An insulating layer may be formed over the substrate 800. The insulating layer is formed by a known method such as the CVD method, the plasma CVD method, the sputtering method, or a spin coating method using an oxide material and a nitride material each containing silicon in a single layer or stacked layers. This insulating layer is not necessarily provided, but has an effect to block a contaminant and the like from the substrate 800. In the case of forming a base layer for preventing contamination from a glass substrate, the base film 801 is formed as pre-treatment for conductive layers 802 and 803 which are formed over the base layer by the droplet discharging method.

Figure 15:
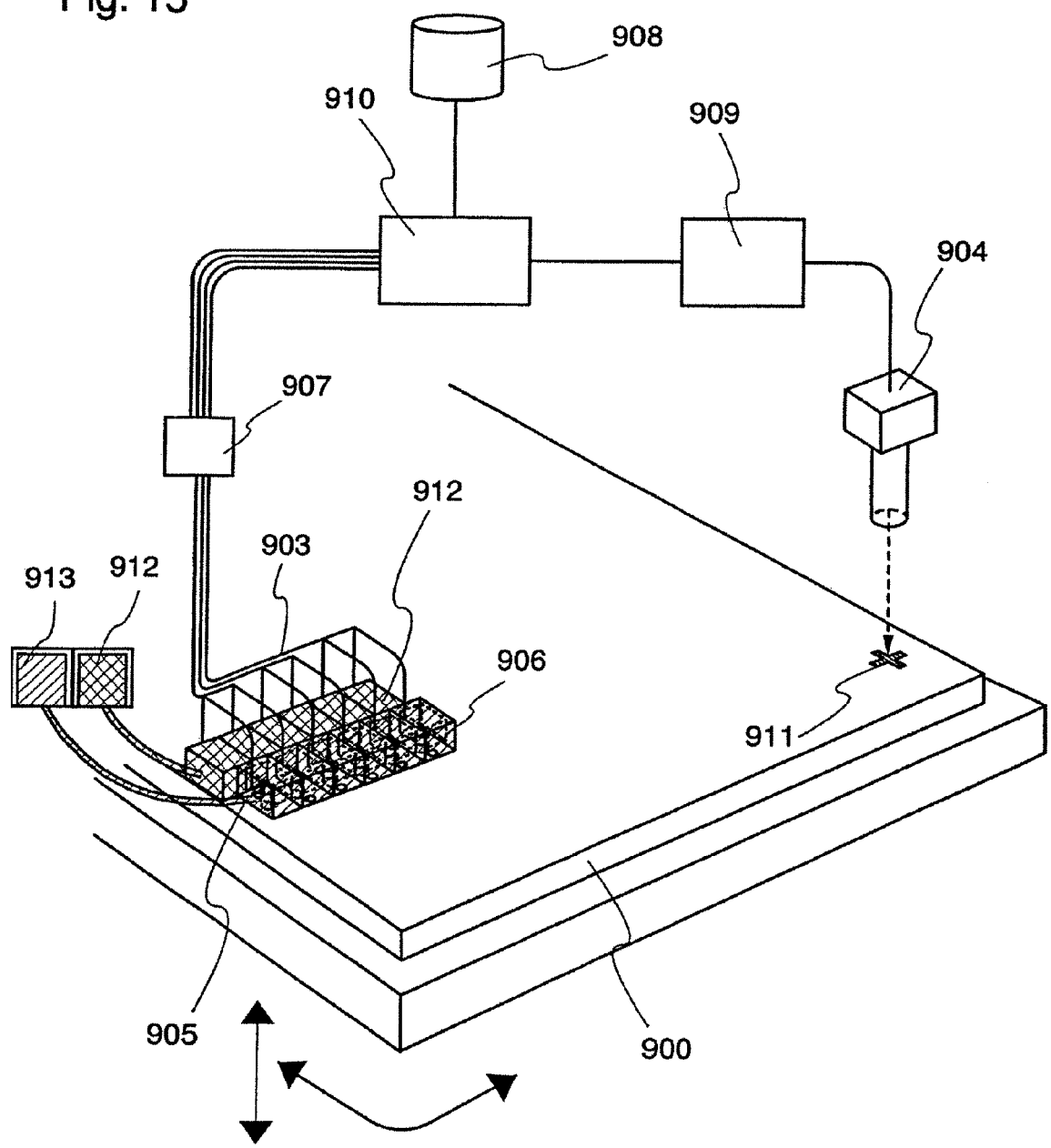
FIG. 15 is a view showing a configuration of a droplet discharging apparatus which can be applied to the invention.

FIG. 15 shows one mode of the droplet discharging apparatus used for forming a pattern. Each head 905 of a droplet discharging unit 903 is connected to a control unit 907. A computer 910 controls the control unit 907, thereby a programmed pattern can be drawn. A timing to draw may be determined, for example, on the basis of a marker 911 formed on a substrate 900. Alternatively, a base point may be determined on the basis of the edges of the substrate 900. This is detected by an image pickup unit 904 such as a CCD, and converted into a digital signal by an image processing unit 909. The computer 910 recognizes the digital signal and generates a control signal which is sent to the control unit 907. It is needless to say that data on patterns to be formed over the substrate 900 is stored in a memory medium 908, on the basis of which a control signal is sent to the control unit 907 and thus each head 905 of the droplet discharging unit 903 can be controlled independently. Using one head can discharge and draw each of a conductive material, an organic material, an inorganic material and the like. In the case of drawing in a wide region such as an interlayer film, the same material can be discharged to be drawn from a plurality of nozzles at the same time to improve throughput. In the case of using a large substrate, the head 905 freely scans over a substrate and freely set a region to draw, thereby a plurality of the same patterns can be drawn over one substrate.

In this embodiment mode, a substance having a photocatalytic function is used as the base film having a function to improve adhesiveness. The photocatalytic substance can be formed by a sol-gel method such as a dip coating method, a spin coating method, the droplet discharging method, or an ion plating method, an ion beam method, the CVD method, the sputtering method, an RF magnetron sputtering method, a plasma spray method, or an anodic oxidation method. In addition, the photocatalytic substance does not need to have continuity as a film, depending on its formation method. The photocatalytic substance can be formed by mixing and melting a salt of a constituent element, in the case of a photocatalytic substance formed of an oxide semiconductor including a plurality of metals. A solvent may be baked or dried when it is necessary to be removed in the case of forming the photocatalytic substance by an application method such as the dip coating method or the spin coating method. Specifically, it may be heated at a predetermined temperature (for example, 300° C. or higher), preferably, in an atmosphere including oxygen. For example, baking is performed using Ag as a conductive paste in an atmosphere including oxygen and nitrogen, then, an organic material such as a heat curable resin is decomposed. Therefore, Ag without containing an organic material can be obtained. Accordingly, planarity of the surface of Ag can be enhanced.

According to the thermal treatment, the photocatalytic substance can have a predetermined crystalline structure. For example, it has an anatase type or a rutile-anatase mixed type. The anatase type is formed by priority in a low temperature phase. Therefore, the photocatalytic substance may also be heated when it does not have a predetermined crystalline structure. In addition, the photocatalytic substance can be formed a plurality of times to obtain a predetermined film thickness in the case of forming by an application method.

The case of forming $TiO_x$ (typically, $TiO_2$) crystal having a predetermined crystalline structure by the sputtering method as a photocatalytic substance is described in this embodiment mode. Sputtering is performed using a metal titanium tube as a target and using an argon gas and oxygen. Further, a He gas may be introduced. The atmosphere includes much oxygen and formation pressure is set high to form $TiO_x$ having high photocatalytic activity. It is preferable to form $TiO_x$ while heating a deposition chamber or a substrate provided with an object to be treated.

The thus formed $TiO_x$ has a photocatalytic function even when it is a very thin film (about 1 nm to 1 μm).

Further, it is preferable to form the base film 801 formed of a metal material such as Ti (titanium), W (tungsten), Cr (chromium), Ta (tantalumn), Ni (nickel), or Mo (molybdenum), or oxide thereof by the sputtering method, a vapor deposition method, or the like as another pre-base treatment.

The base film 801 may be formed to be 0.01 to 10 nm in thickness. It does not necessarily have a layer structure as long as it is formed quite thin. When a high-melting point metal material is used as the base film, it is preferable to treat a base film exposed on the surface by carrying out one of the following two steps after forming the conductive layers 802 and 803 to be a gate electrode layer.

The first method is a step of insulating the base film 801 which is not overlapped with the conductive layers 802 and 803 and forming an insulating layer. In other words, the base film 801 which is not overlapped with the conductive layers 802 and 803 is oxidized and insulated. When the base film 801 is oxidized and insulated in this manner, it is preferable to form the base film 801 to be 0.01 to 10 nm in thickness, thus, the base film can be easily oxidized. Note that oxidization may be performed by exposure to an oxygen atmosphere or thermal treatment.

The second method is a step of removing the base film 801 by etching using the conductive layers 802 and 803 as masks. When this step is employed, there is no limitation in the thickness of the base film 801.

Alternatively, a method for performing plasma treatment onto a formation region (formation face) can be employed as another pre-base treatment. The plasma treatment is performed with air, oxygen, or nitrogen used as a treatment gas, with pressure from several ten Torr to 1000 Torr (133000 Pa), preferably, from 100 Torr (13300 Pa) to 1000 Torr (133000 Pa), more preferably, from 700 Torr (93100 Pa) to 800 Torr (106400 Pa), that is, atmospheric pressure or pressure in proximity of atmospheric pressure, and a pulse voltage is applied with such conditions. At this time, plasma density is set at $1\times10^{10}$ to $1\times10^{14}$ m$^{-3}$, so that so-called corona discharge or glow discharge is achieved. Surface modification can be performed without material dependence by employing plasma treatment using air, oxygen, or nitrogen as the treatment gas. Accordingly, surface modification can be performed on any material.

As another method, a substance of an organic material functioning as an adhesive may be formed to improve adhesion between a pattern to be formed by the droplet discharging method and a formation region thereof. An organic material (organic resin material) (polyimide or acrylic) or a siloxane may be used. Note that the siloxane is composed of a skeleton formed of the bond of silicon (Si) and oxygen (O), in which an organic group containing at least hydrogen (such as an alkyl group or aromatic hydrocarbon) is included as a substituent. Alternatively, a fluoro group may be used as the substituent. Further alternatively, a fluoro group and an organic group containing at least hydrogen may be used as the substituent.

Subsequently, a composition containing a conductive material is discharged, and the conductive layers 802 and 803 to function as gate electrodes later are formed.

The droplet discharging unit is a collective term for the one having a unit for discharging a droplet such as a nozzle having a discharging opening of a composition or a head provided with one or a plurality of nozzles. A diameter of the nozzle included in the droplet discharging unit is set in the range of 0.02 to 100 μm (favorably, 30 μm or less) and a volume of the composition to be discharged from the nozzle is set in the range of 0.001 to 100 pl (favorably, 10 pl or less). The volume of the composition to be discharged increases in proportion to the diameter of the nozzle. Further, it is preferable that a distance between an object to be treated and the discharging openings of the nozzle be as short as possible in order to drop the droplet on a desired position. The distance is favorably set in the range of about 0.1 to 3 mm (more favorably, 1 mm or less).

As for the composition to be discharged from the discharging opening, a conductive material dissolved or dispersed in a solvent is used. The conductive material corresponds to a fine particle or a dispersant nano-particle of a metal such as Ag, Au, Cu, Ni, Pt, Pd, Ir, Rh, W, or Al, sulfide of a metal such as Cd or Zn, oxide of Fe, Ti, Si, Ge, Zr, or Ba, or silver halide. In addition, it corresponds to indium tin oxide (ITO), indium tin oxide containing silicon oxide (ITSO), organic indium, organotin, zinc oxide, titanium nitride, or the like which is used as a light-transmissive conductive film. However, as for compositions to be discharged from the discharging opening, it is preferable to use any material selected from gold, silver, and copper, which is dissolved or dispersed in a solvent, in consideration of resistivity. It is more preferable to use silver or copper having a low resistance value. When silver or copper is used, a barrier film may be additionally provided as a measure for an impurity. A silicon nitride film or nickel boron (NiB) can be used as the barrier film.

In addition, a particle having a plurality of layers formed by coating the periphery of the conductive material with another conductive material may be used. For example, a particle having a three-layer structure in which copper is coated with nickel boron (NiB) and then silver, and the like may be used.

As for such solvents, esters such as butyl acetate and ethyl acetate; alcohols such as isopropyl alcohol and ethyl alcohol; organic solvents such as methyl ethyl ketone and acetone; or the like may be used. The viscosity of the composition is preferably 50 mPa·S (cps) or less. This is because the composition is prevented from drying or the composition is smoothly discharged from the discharging opening. The surface tension of the composition is preferably 40 mN/m or less. Note that the viscosity of the composition and the like may be appropriately adjusted in accordance with a solvent to be used and intended use. For example, the viscosity of a composition in which ITO, organic indium, or organotin is dissolved or dispersed in the solvent is 5 to 50 mPa·S, the viscosity of a composition in which silver is dissolved or dispersed in the solvent is 5 to 20 mPa·S, and the viscosity of a composition in which gold is dissolved or dispersed in the solvent is 10 to 20 mPa·S.

The conductive layer may be formed by stacking a plurality of conductive materials. In addition, the conductive layer may be formed by the droplet discharging method using silver as a conductive material, thereafter, it may be plated with copper or the like. Plating may be performed by electroplating or a chemical (electroless) plating method. Plating may be performed by soaking a substrate surface into a container filled with a solution having a plating material. A solution having a plating material may be applied so that the solution flows over the substrate surface with the substrate placed obliquely (or vertically). When the plating is performed by applying a solution with the substrate placed vertically, there is an advantage in that a process apparatus can be downsized.

The diameter of a particle of the conductive material is preferably as small as possible for preventing clogged nozzles and manufacturing a high-definition pattern, although it depends on the diameter of each nozzle, a desired shape of a pattern, and the like. Preferably, the diameter of the particle of the conductive material is 0.1 μm or less. The composition is formed by a known method such as an electrolyzing method, an atomizing method, or a wet reducing method, and the particle size thereof is typically about from 0.01 to 10 μm. Note that when a gas evaporation method is employed, a nanomolecule protected with a dispersant is as minute as about 7 nm. When each surface of particles is covered with a coating, the nanoparticles do not cohere in the solvent and are uniformly dispersed in the solvent at a room temperature, and show a property similar to that of liquid. Accordingly, it is preferable to use a coating.

When the step of discharging the composition is performed under reduced pressure, the solvent of the composition is evaporated until the discharged composition lands on an object to be treated, and thus, later steps of drying and baking the composition can be both omitted. It is preferable to perform the step under reduced pressure, since an oxide film or the like is not formed on the surface of the conductor. After discharging the composition, either or both steps of drying and baking is/are performed. Each step of drying and baking is a step of thermal treatment. For example, drying is performed for three minutes at 100° C. and baking is performed for from 15 minutes to 30 minutes at a temperature of from 200 to 350° C., each of which has a different purpose, temperature, and period. The steps of drying and baking are performed under normal pressure or reduced pressure by laser light irradiation, rapid thermal annealing, a heating furnace, or the like. Note that the timing of the thermal treatment is not particularly limited. The substrate may be heated in advance to favorably perform the steps of drying and baking. The temperature of the substrate at the time depends on a material of the substrate or the like, but it is typically 100 to 800° C. (preferably, 200 to 350° C.). According to these steps, nanoparticles contact with one another and fusion and welding are accelerated by hardening and shrinking a peripheral resin as well as evaporating the solvent in the composition or chemically removing the dispersant.

A continuous wave or pulsed wave gas laser or solid laser may be used for laser light irradiation. An excimer laser and the like can be given as a gas laser, and a laser using a crystal of YAG or YVO$_4$ which is doped with Cr, Nd, or the like can be given as a solid laser. Note that it is preferable to use a continuous wave laser in relation to the absorptance of laser light. Moreover, a so-called hybrid laser irradiation method in which a pulsed wave and a continuous wave are used in combination may be used. However, it is preferable that the thermal treatment by laser light irradiation be instantaneously performed within several microseconds to several ten seconds so that the substrate 800 is not damaged, depending on heat resistance of the substrate 800. Rapid thermal annealing (RTA) is carried out by rapidly raising the temperature and heating for several microseconds to several minutes using an infrared lamp or a halogen lamp emitting light for irradiation with ultraviolet to infrared light in an inert gas atmosphere. Since the treatment is performed instantaneously, only a thin film on a top surface can be substantially heated and a lower layer film is not affected. In other words, even a substrate having low heat resistance such as a plastic substrate is not affected either.

In addition, the aforementioned step of forming the base film 801 is carried out as pre-base treatment for a conductive layer formed by the droplet discharging method, however, this treatment step may be carried out after forming the conductive layer.

Subsequently, a gate insulating layer is formed over the conductive layers 802 and 803 (see FIG. 13A). The gate insulating layer may be formed of a known material such as an oxide or nitride material of silicon, and may be stacked layers or a single layer. For example, it may be stacked layers of three layers of a silicon nitride film, a silicon oxide film, and a silicon nitride film, or may be a single layer of these or a silicon oxynitride film, or stacked layers of two layers. A silicon nitride film is used as an insulating layer 804 and a silicon nitride oxide film is used as a gate insulating layer 805 in this embodiment mode. A silicon nitride film having dense film quality is preferably used. In the case of using silver, copper, or the like for the conductive layer formed by the droplet discharging method, forming a silicon nitride film or a NiB film thereover as a barrier film is effective in preventing an impurity from diffusing and in planarizing the surface. Note that a rare gas element such as argon is preferably included in a reactive gas and is preferably mixed in the insulating film to be formed in order to form a dense insulating film with few gate leak current at a low film-formation temperature.

Subsequently, a conductive layer (also referred to as a first electrode) 806 is formed by selectively discharging a composition containing a conductive material over the gate insulating film (see FIG. 13B). The conductive layer 806 may be formed in a predetermined pattern of a composition containing indium tin oxide (ITO), indium tin oxide containing silicon oxide (ITSO), zinc oxide (ZnO), tin oxide (SnO$_2$), or the like and by baking it when light is emitted from the substrate 800 side or when a light-transmissive EL display panel is manufactured.

Preferably, the conductive layer 806 is formed of indium tin oxide (ITO), indium tin oxide containing silicon oxide (ITSO), zinc oxide (ZnO), or the like by the sputtering method. It is more preferable to use indium tin oxide containing silicon oxide formed by the sputtering method using a target in which ITO contains silicon oxide of 2 to 10 wt %. In addition, an oxide conductive material formed using a target obtained by mixing zinc oxide (ZnO) of 2 to 20 wt % to indium oxide containing silicon oxide may be used. A mask layer may be formed by the droplet discharging method and be etched to have a desired pattern after forming the conductive layer (the first electrode) 806 by the sputtering method. In this embodiment mode, the conductive layer 806 is formed of a light-transmissive conductive material by the droplet discharging method. Specifically, it is formed of indium tin oxide or ITSO formed of ITO and silicon oxide. Although not shown, a photocatalytic substance may be formed in a region where the conductive layer 806 is formed, similarly to the case of forming the conductive layers 802 and 803. The photocatalytic substance can improve adhesiveness and the conductive layer 806 can be formed into a desired pattern to be a thin line. The conductive layer 806 becomes the first electrode which functions as a pixel electrode.

In this embodiment mode, an example of the gate insulating layer formed of three layers of a silicon nitride film, a silicon oxynitride film (silicon oxide film), and a silicon nitride film which are formed of silicon nitride is described. The conductive layer (the first electrode) 806 formed of indium tin oxide containing silicon oxide is preferably formed in close contact with an insulating layer formed of silicon nitride included in the gate insulating layer 805. Accordingly, a rate at which light generated in an electroluminescent layer is emitted outside can be enhanced.

In addition, a composition containing a particle of a metal such as Ag (silver), Au (gold), Cu (copper), W (tungsten), or Al (aluminum) as its main component can be used when generated light is emitted to an opposite side of the substrate 800 or when a reflective EL display panel is Manufactured. As another method, a first electrode layer may be formed by forming a light-transmissive conductive film or a light-reflective conductive film by the sputtering method, forming a mask pattern by the droplet discharging method, and additionally performing an etching process.

The conductive layer (the first electrode) 806 may be polished by a CMP method or by cleaning with a porous body of polyvinyl alcohol so that the surface thereof is planarized. Furthermore, the surface of the conductive layer (the first electrode) 806 may be irradiated with an ultraviolet ray or may be treated with oxygen plasma after polishing by the CMP method.

The semiconductor layer may be formed by a known method (the sputtering method, an LP (Low Pressure) CVD method, the plasma CVD method, or the like). There is no particular limitation in materials of the semiconductor layer, but the semiconductor layer is preferably formed of silicon, a silicon germanium (SiGe) alloy, or the like.

The semiconductor layer is formed of an amorphous semiconductor (typically, hydrogenated amorphous silicon) or a crystalline semiconductor (typically, polysilicon) as a material. Polysilicon includes so-called high-temperature polysilicon which has, as a main material, polycrystalline silicon formed through a process temperature of 800° C. or higher, so-called low-temperature polysilicon which has, as a main material, polycrystalline silicon formed at a process temperature of 600° C. or lower, crystalline silicon which is crystallized by adding, for example, an element for promoting crystallization, and the like.

Further, as another substance, a semi-amorphous semiconductor or a semiconductor containing a crystal phase in a part of a semiconductor layer can also be used. The semi-amorphous semiconductor means a semiconductor having an intermediate structure of an amorphous structure and a crystalline structure (including a single crystal and a poly-crystal) and having a third state which is stable in terms of free energy, and a crystalline semiconductor having short-range order and lattice distortion. Typically, it is a semiconductor layer containing silicon as a main component with lattice distortion, in which the Raman spectrum is shifted to a lower frequency side than 520 cm$^{-1}$. Further, hydrogen or halogen of at least 1 atomic % or more is contained therein to terminate a dangling bond. Here, such a semiconductor as described above is referred to as a semi-amorphous semiconductor (hereinafter, referred to as a "SAS"). The SAS is also referred to as a so-called microcrystal semiconductor (typically, microcrystalline silicon).

The SAS can be obtained by performing glow discharge decomposition (plasma CVD) on a silicon source gas. $SiH_4$ is given as a typical silicon source gas. $Si_2H_6$, $SiH_2Cl_2$, $SiHCl_3$, $SiCl_4$, $SiF_4$, or the like can be used as well. Further, $GeF_4$ or $F_2$ may be mixed. Formation of the SAS can be facilitated by using the silicon source gas diluted with hydrogen or a mixture of hydrogen and one or more of rare gases selected from helium, argon, krypton, and neon. A dilution ratio of hydrogen to the silicon source gas is, for example, preferably in the range of 2 to 1000 times in terms of a flow ratio. Although formation of the SAS by glow discharge decomposition is preferably performed under reduced pressure, the formation can also be performed by utilizing an electric discharge under atmospheric pressure. Typically, the formation may be performed in the pressure range of 0.1 to 133 Pa. A power supply frequency for generating the glow discharge is in the range of 1 to 120 MHz, preferably, in the range of 13 to 60 MHz. A high-frequency power supply may appropriately be set. A temperature for heating the substrate is preferably 300° C. or less and the temperature in the range of 100 to 200° C. may also be employed. As for impurity elements to be contained mainly at the time of forming a film, an impurity derived from an atmospheric constituent such as oxygen, nitrogen, or carbon is preferably in a concentration of $1\times10^{20}$ cm$^{-3}$ or less, and particularly, a concentration of oxygen is $5\times10^{19}$ cm$^{-3}$ or less, preferably, $1\times10^{19}$ cm$^{-3}$ or less. Further, stability of the SAS can be enhanced by promoting the lattice distortion by allowing a rare gas element such as helium, argon, krypton, or neon to be contained, thereby forming a favorable SAS. In addition, an SAS layer formed of a hydrogen-based gas may be stacked over a SAS layer formed of a fluorine-based gas as the semiconductor layer.

When a crystalline semiconductor layer is used as the semiconductor layer, a known method (a laser crystallization method, a thermal crystallization method, a thermal crystallization method using an element promoting crystallization such as nickel, or the like) may be employed as a method for manufacturing the crystalline semiconductor layer. In the case where an element promoting crystallization is not introduced, hydrogen is released until hydrogen concentration contained in an amorphous silicon film becomes $1\times10^{20}$ atoms/cm$^3$ or less by heating the amorphous silicon film for one hour at a temperature of 500° C. in nitrogen atmosphere before irradiating the amorphous silicon film with laser light. This is because a film is damaged when the amorphous silicon film containing much hydrogen is irradiated with laser light.

There is no particular limitation in a method for introducing a metal element into the amorphous semiconductor layer as long as it is a method capable of making the metal element exist on the surface of or inside the amorphous semiconductor layer. For example, the sputtering method, the CVD method, a plasma treating method (including the plasma CVD method), an adsorption method, or a method for applying a metal salt solution can be employed. Among them, the method using a solution is simple and easy and is useful in terms of easy concentration adjustment of the metal element. It is preferable that an oxide film be formed by UV light irradiation in oxygen atmosphere, a thermal oxidation method, treatment with ozone water or hydrogen peroxide including a hydroxyl radical, or the like in order to improve wettability of the surface of the amorphous semiconductor layer and to spread an aqueous solution over an entire surface of the amorphous semiconductor layer.

In addition, thermal treatment and laser light irradiation may be combined to crystallize the amorphous semiconductor layer. The thermal treatment and/or the laser light irradiation may be independently performed a plurality of times.

An organic semiconductor using an organic material may be used as a semiconductor. A low molecular weight material, a high molecular weight material, or the like is used for the organic semiconductor, and in addition, a material such as an organic pigment, a conductive high molecular weight material can be used.

An amorphous semiconductor is used as the semiconductor in this embodiment mode. A semiconductor layer 807 that is an amorphous semiconductor layer is formed, and an insulating film is formed by, for example, the plasma CVD method and is etched selectively to have a desired shape in a desired region in order to form channel protective films 809 and 810. At this time, the channel protective films 809 and 810 can be formed by exposing a back of the substrate to light using the gate electrodes as masks. In addition, polyimide, polyvinyl alcohol, or the like may be dropped as the channel protective film by the droplet discharging method. Consequently, the light-exposure step can be omitted. Then, an N-type semiconductor layer 808 is formed using a semiconductor layer having one conductivity, for example, an N-type amorphous semiconductor layer by the plasma CVD method or the like (see FIG. 13C). The semiconductor layer having one conductivity may be formed as required.

A film formed of one or a plurality of inorganic materials (silicon oxide, silicon nitride, silicon oxynitride, silicon nitride oxide, and the like), photosensitive or non-photosensitive organic materials (organic resin materials) (polyimide, acrylic, polyamide, polyimide amide, a resist, benzocyclobutene, and the like), a Low-k material having a low dielectric constant, and the like, or stacked layers of them can be used as the channel protective film. In addition, a material in which a skeletal structure is configured by the bond of silicon (Si) and oxygen (O) and which contains at least hydrogen as a substituent (for example, alkyl group or aromatic hydrocarbon) may be used. Alternatively, a fluoro group may be used as the substituent. Further alternatively, a fluoro group and an organic group containing at least hydrogen may be used as the substituent. A vapor phase growth method such as the plasma CVD method or the thermal CVD method or the sputtering method can be employed as a manufacturing method to use an inorganic material as a channel protective film. In addition, in the case of using an organic material, the droplet discharging method or the printing method (a method for forming a pattern, such as screen printing or offset printing) can be employed. An insulating film, an SOG film, or the like obtained by an application method can be used.

Subsequently, mask layers 811 and 812 formed of an insulator such as a resist or polyimide are formed. Then, the semiconductor layer 807 and the N-type semiconductor layer 808 are simultaneously patterned using the mask layers 811 and 812.

Figure 13A:
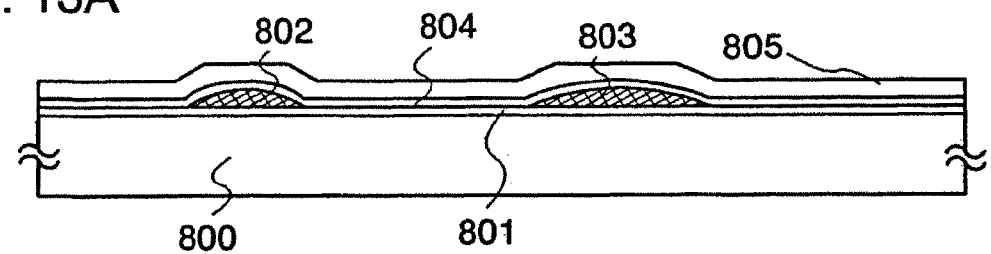
FIGS. 13A to 13D are views showing a manufacturing method of a display device to which the invention can be applied.
Figure 13B:
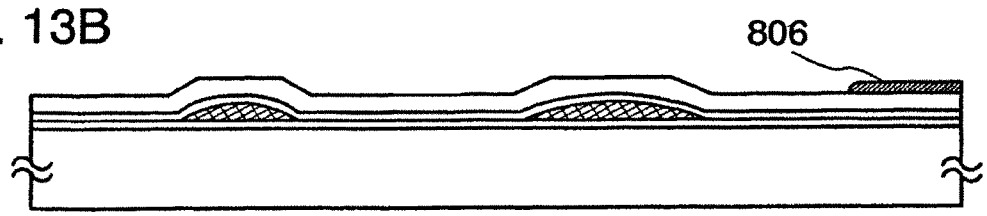
Figure 13C:
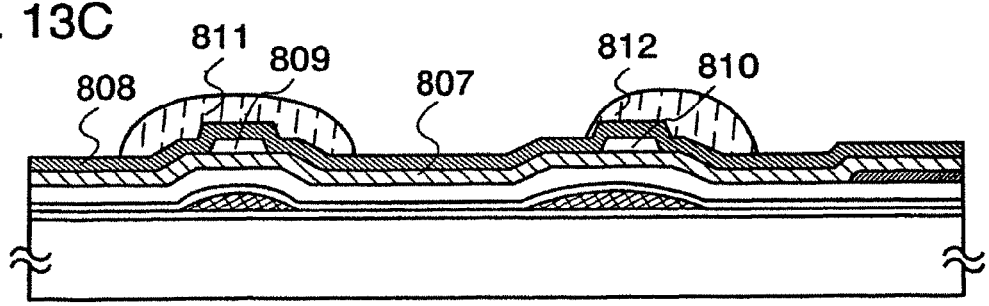
Figure 13D:
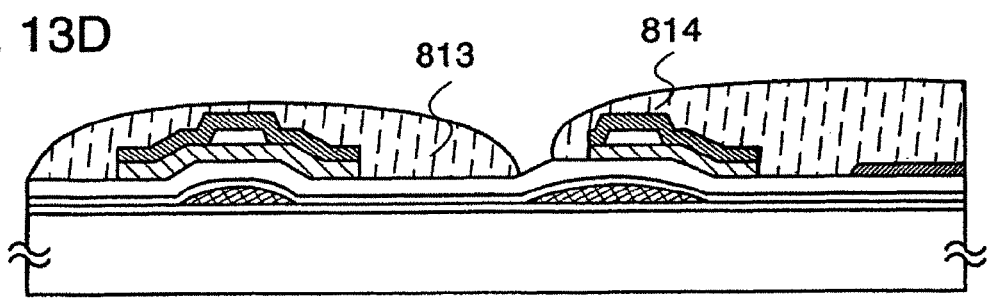

Then, mask layers 813 and 814 formed of an insulator such as a resist or polyimide are formed by the droplet discharging method (see FIG. 13D). A through-hole 818 is formed in a part of the gate insulating layers 804 and 805 by an etching process using the mask layers 813 and 814, and a part of the conductive layer 803 which is disposed on a lower layer side thereof and functions as a gate electrode layer is exposed. Either plasma etching (dry etching) or wet etching may be adopted as the etching process. However, plasma etching is suitable to treat a large substrate. A fluorine-based or chlorine-based gas such as $CF_4$, $NF_3$, $Cl_2$, or $BCl_3$ is used as an etching gas, and an inert gas such as He or Ar may be appropriately added. In addition, a local discharge process can be performed when an atmospheric pressure discharge etching process is applied, and a mask layer is not required to be entirely formed over the substrate.

Conductive layers 815, 816, and 817 are formed by discharging a composition containing a conductive material after the mask layers 813 and 814 are removed. Then, the N-type semiconductor is patterned using the conductive layers 815, 816, and 817 as masks to form an N-type semiconductor layer (see FIG. 14A). The conductive layers 815, 816, and 817 function as wiring layers. Note that the above-mentioned pre-base treatment of selectively forming a photocatalytic substance or the like in a portion where the conductive layers 815, 816, and 817 are in contact with the gate insulating layer 805 may be performed before forming the conductive layers 815, 816, and 817, although not shown. Accordingly, the conductive layer can be formed with favorable adhesiveness.

The above-mentioned step of forming the base film may be performed as pre-base treatment for the conductive layer to be formed by the droplet discharging method. In addition, the treatment step may be performed after the conductive layer is formed. Reliability of a display device can be improved since adhesion between the layers is improved in accordance with this step.

The conductive layer 817 functions as a source wiring layer or a drain wiring layer and is formed to be electrically connected to the first electrode formed before. In addition, the conductive layer 816 that is the source wiring layer or the drain wiring layer and the conductive layer 803 that is a gate electrode layer are electrically connected to each other in the through-hole 818 formed in the gate insulating layer 805. A composition containing a particle of a metal such as Ag (silver), Au (gold), Cu (copper), W (tungsten), or Al (aluminum) as its main component can be used as a conductive material for forming the wiring layer. In addition, light-transmissive indium tin oxide. (ITO), indium tin oxide containing silicon oxide (ITSO), organic indium, organotin, zinc oxide, titanium nitride, and the like may be used in combination.

The step of forming the through-hole 818 in a part of the gate insulating layers 804 and 805 may be performed after forming the conductive layers 815, 816, and 817, using the conductive layers 815, 816, and 817 as a mask to form the through-hole 818. Then, a conductive layer is formed in the through-hole 818, and the conductive layer 816 and the conductive layer 803 that is a gate electrode layer are electrically connected to each other. In this case, there is an advantage in that the steps can be simplified.

Figure 14A:
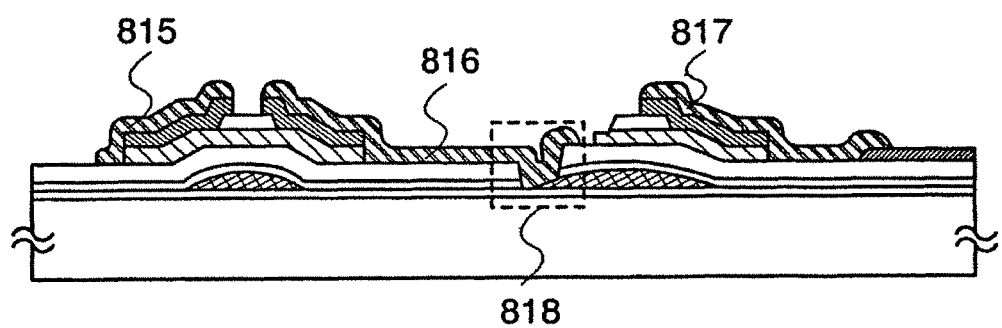
FIGS. 14A and 14B are views showing a manufacturing method of a display device to which the invention can be applied.
Figure 14B:
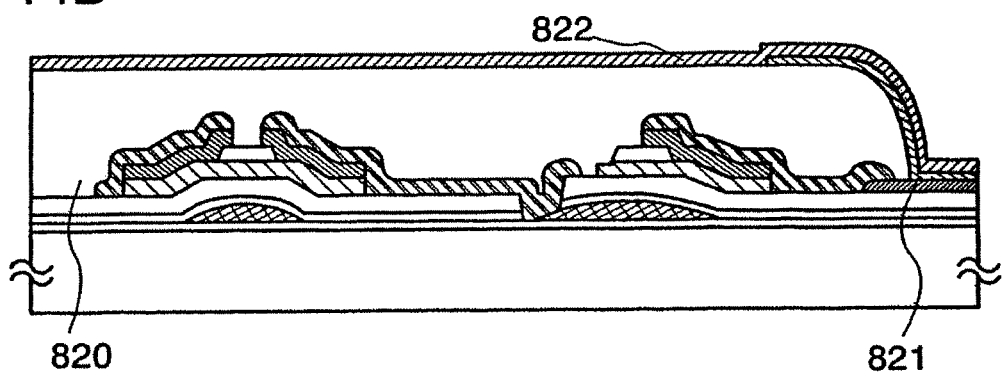

Subsequently, an insulating layer 820 to be a partition wall is formed. Although not shown, a protective layer formed of silicon nitride or silicon nitride oxide may be entirely formed under the insulating layer 820 to cover a thin film transistor. An opening is formed in the insulating layer 820 as shown in FIG. 14B by an etching process after the insulating layer is entirely formed by the spin coating method or a dipping method. The etching process is not necessarily carried out when the insulating layer 820 is formed by the droplet discharging method. When a wide region such as the insulating layer 820 is formed by the droplet discharging method, it is formed by discharging a composition from a plurality of discharging openings of nozzles of a droplet discharge apparatus and by drawing so that a plurality of lines are overlapped with each other. Consequently, a throughput is improved.

The insulating layer 820 is formed to have a through-hole corresponding to a position where a pixel is to be formed in accordance with the conductive layer 806 that is the first electrode. The insulating layer 820 can be formed by using an inorganic insulating material such as silicon oxide, silicon nitride, silicon oxynitride, aluminum oxide, aluminum nitride, or aluminum oxynitride, acrylic acid, methacrylic acid, a derivative of acrylic acid or methacrylic acid, a heat-resistant high molecular weight material such as polyimide, aromatic polyamide, or polybenzimidazole, or inorganic siloxane including a Si—O—Si bond among compounds that contain silicon, oxygen, and hydrogen and that is formed by using a siloxane material as a starting material or an organosiloxane-based insulating material in which hydrogen bonded with silicon is substituted by an organic group such as methyl or phenyl. It is preferable to form the insulating layer 820 by using a photosensitive or non-photosensitive material such as acrylic or polyimide since a side face thereof becomes such a shape that a curvature radius continuously changes and an upper-layer thin film is formed without break.

According to the above-mentioned steps, a TFT substrate for the EL display panel in which a bottom gate type (also referred to as an inversely staggered type) channel protective TFT and the first electrode (first electrode layer) are connected over the substrate 800 is completed.

Moisture adsorbed inside the insulating layer 820 or to a surface thereof is removed by performing thermal treatment at 200° C. under atmospheric pressure before forming an electroluminescent layer 821. In addition, thermal treatment is performed at a temperature of 200 to 400° C., preferably, 250 to 350° C. under reduced pressure, and the electroluminescent layer 821 is preferably formed by a vacuum vapor deposition method or the droplet discharging method under reduced pressure without being exposed to atmospheric air.

Materials which emit light of red (R), green (G), and blue (B) are selectively formed as the electroluminescent layer 821 by a vapor deposition method or the like using respective vapor-deposition mask. The materials which emit light of red (R), green (G), and blue (B) (a low molecular weight or high molecular weight material, or the like) can be formed by the droplet discharging method similarly to a color filter. This case is preferable since RGB can be separately deposited without using a mask. A conductive layer 822 that is a second electrode is stacked over the electroluminescent layer 821, and then, a display device having a display function using a light emitting element is completed (see FIG. 14B).

It is effective to provide a passivation film to cover the second electrode, although not shown. The passivation film is formed of an insulating film containing silicon nitride (SiN), silicon oxide ($SiO_2$), silicon oxynitride ($SiO_xN_y$: x>y>0), silicon nitride oxide ($SiN_xO_y$: x>y>0), aluminum nitride (AlN), aluminum oxynitride ($AlO_xN_y$: x>y>0), aluminum nitride oxide ($AlN_xO_y$: x>y>0) having larger nitrogen content than oxygen content, aluminum oxide, diamond like carbon (DLC), or a nitrogen-containing carbon film ($CN_x$), and a single layer or combined stacked layers of the insulating film can be used. For example, stacked layers of a nitrogen-containing carbon film ($CN_x$) and silicon nitride (SiN), or an organic material can be used, and stacked layers of a high molecular weight material such as a styrene polymer may be used. A siloxane resin may be used as well. Siloxane is composed of a skeleton formed of the bond of silicon (Si) and oxygen (O), in which an organic group containing at least hydrogen (such as an alkyl group or aromatic hydrocarbon) is included as a substituent. Alternatively, a fluoro group may be used as the substituent. Further alternatively, a fluoro group and an organic group containing at least hydrogen may be used as the substituent.

In this case, a film having favorable coverage is preferably used as the passivation film, and it is effective to use a carbon film, specifically, a DLC film. Since the DLC film can be formed at a temperature ranging from a room temperature to 100° C. or lower, it can be easily formed over the electroluminescent layer having low heat resistance. The DLC film can be formed by the plasma CVD method (typically, the RF plasma CVD method, a microwave CVD method, an electron cyclotron resonance (ECR) CVD method, a hot filament CVD method, or the like), a combustion flame method, the sputtering method, an ion beam vapor deposition method, a laser vapor deposition method, or the like. As a reactive gas to be used for film formation, a hydrogen gas and a hydrocarbon gas (for example, $CH_4$, $C_2H_2$, $C_6H_6$, or the like) are used. The gases are ionized by glow discharge, and ions are accelerated to collide against a cathode, to which a negative self-bias is applied, thereby a film is formed. In addition, a CN film may be formed using a $C_2H_4$ gas and an $N_2$ gas as a reactive gas. The DLC film has a high blocking effect against oxygen and can suppress oxidation of the electroluminescent layer. Therefore, a problem in that the electroluminescent layer is oxidized can be prevented during the following sealing step.

Figure 16A:
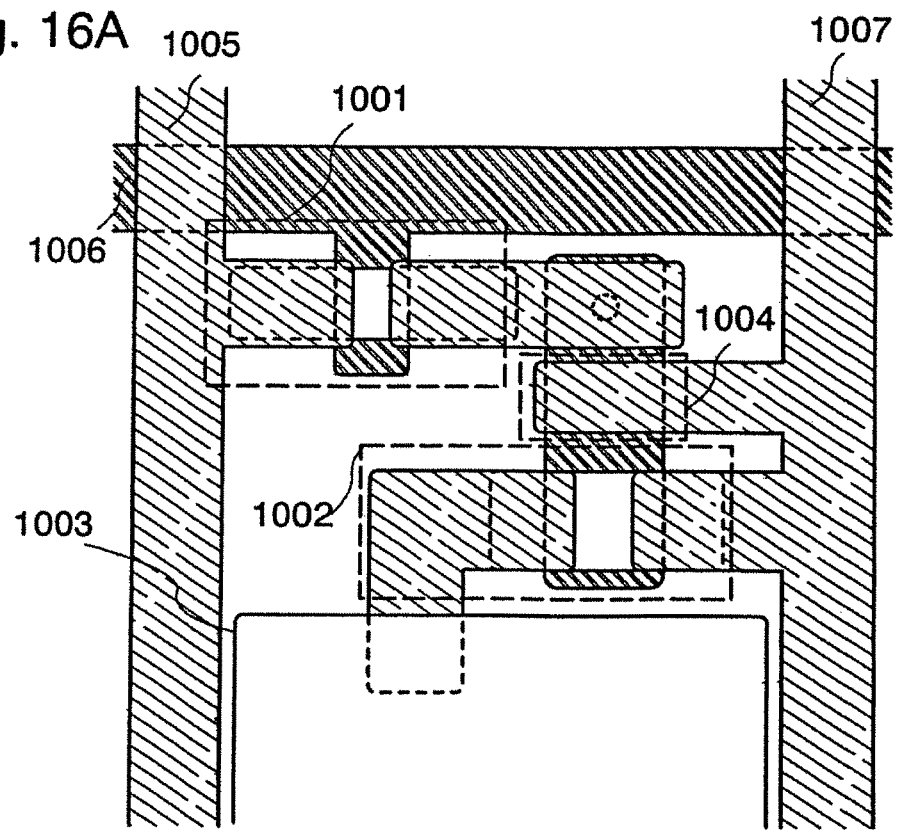
FIG. 16A is a top plan view of a pixel portion of a display device which can be applied to the invention.
Figure 16B:
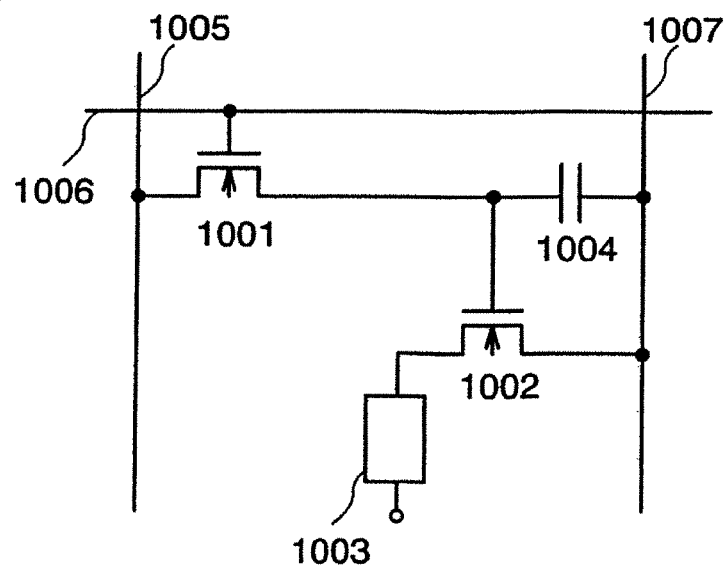
FIG. 16B is a circuit diagram thereof.

FIG. 16A is a top plan view of a pixel portion of a display device of this embodiment mode and FIG. 16B shows a circuit diagram thereof. Reference numerals 1001 and 1002 denote TFTs, 1003 denotes a light emitting element, 1004 denotes a capacitor, 1005 denotes a source line, 1006 denotes a gate line, and 1007 denotes a power supply line. The TFT 1001 is a transistor (hereinafter also referred to as a "switching transistor" or a "switching TFT") which controls a connection with the signal line. The TFT 1002 is a transistor (hereinafter also referred to as a "driving transistor" or a "driving TFT") which controls a current flowing to the light emitting element, and the driving TFT is connected in series with the light emitting element. The capacitor 1004 holds source-gate voltage of the TFT 1002 that is the driving TFT.

Figure 17:
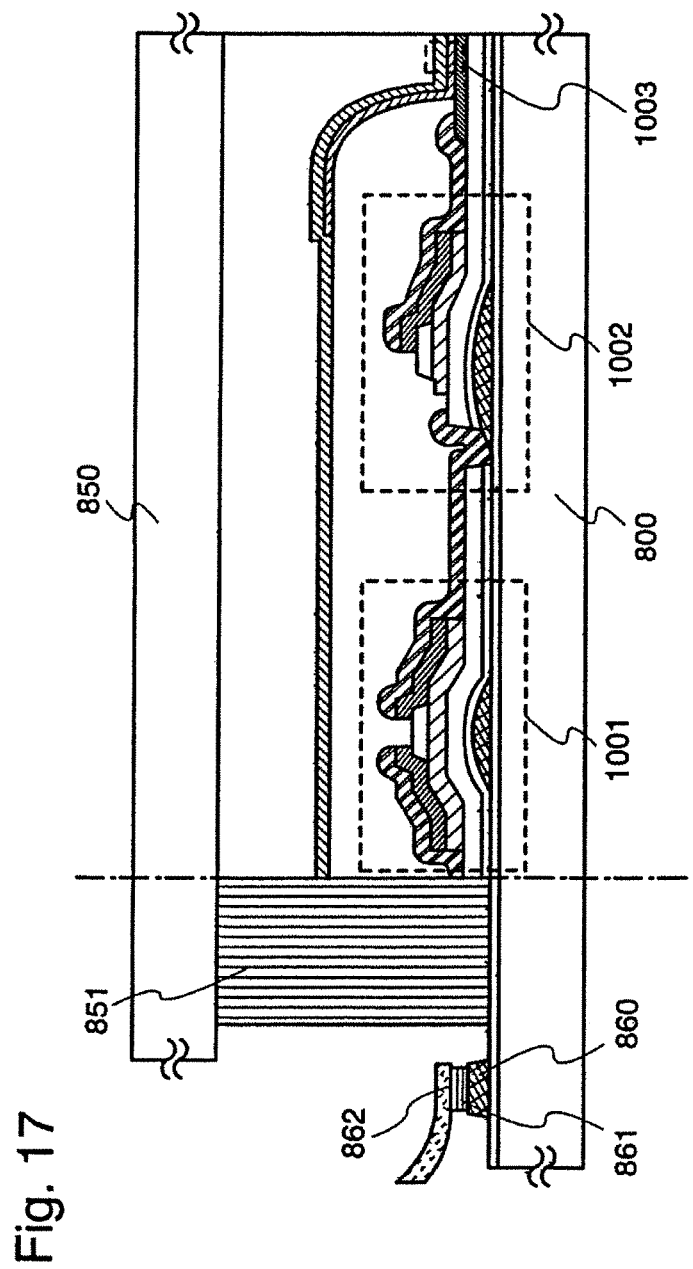
FIG. 17 is a view showing a display device which can be applied to the invention.

FIG. 17 is a detailed diagram of the display device of this embodiment mode. A substrate 800 having the switching TFT 1001 and the TFT 1002 that is a driving TFT connected to the light emitting element 1003 is firmly fixed to a sealing substrate 850 by a sealing material 851. Various signals supplied to each circuit formed over the substrate 800 are supplied from a terminal portion.

A gate wiring layer 860 is formed in the terminal portion in the same step as the conductive layers 802 and 803. It is needless to say that a photocatalytic substance is formed in a formation region of the gate wiring layer 860 similarly to the conductive layers 802 and 803. When the photocatalytic substance is formed by the droplet discharging method, adhesion between the gate wiring layer 860 and a formation region of a base can be improved. Etching which exposes the gate wiring layer 860 can be simultaneously performed when the through-hole 818 is formed in the gate insulating layer 805. A flexible printed circuit (FPC) 862 can be connected to the gate wiring layer 860 by an anisotropic conductive layer 868.

Note that the case where the light emitting element 1003 is sealed with the glass substrate is shown in the aforementioned display device. Sealing treatment is treatment for protecting the light emitting element from moisture. Any one of a method for sealing mechanically with a cover material, a method for sealing with a heat curable resin or a UV curable resin, and a method for sealing with a thin film having high barrier property such as metal oxide or nitride is employed. Glass, ceramics, plastic, or metal can be used as the cover material, and the cover material is required to transmit light when light is emitted to the cover material side. The cover material and the substrate over which the light emitting element is formed are attached to each other using a sealing material such as a heat curable resin or an ultraviolet curable resin. A sealed space is formed by curing the resin by thermal treatment or ultraviolet light irradiation treatment. It is also effective to provide a moisture absorbent material typified by barium oxide inside the sealed space. The moisture absorbent material may be provided over the sealing material in contact therewith, or in the periphery of the partition wall so as not to block light from the light emitting element. Furthermore, a space between the cover material and the substrate over which the light emitting element is formed can be filled with a heat curable resin or an ultraviolet curable resin. In this case, it is effective to add a moisture absorbent material typified by barium oxide into the heat curable resin or the ultraviolet curable resin.

As described above, the step can be omitted in this embodiment mode by not applying a light-exposure step utilizing a photo mask. In addition, an EL display panel can be easily manufactured by directly forming various patterns over a substrate by the droplet discharging method even when a glass substrate of the fifth or the following generation having a side of more than 1000 mm is used.

In addition, a highly reliable display device in which adhesiveness and peel resistance are improved can be manufactured.

Figure 8:
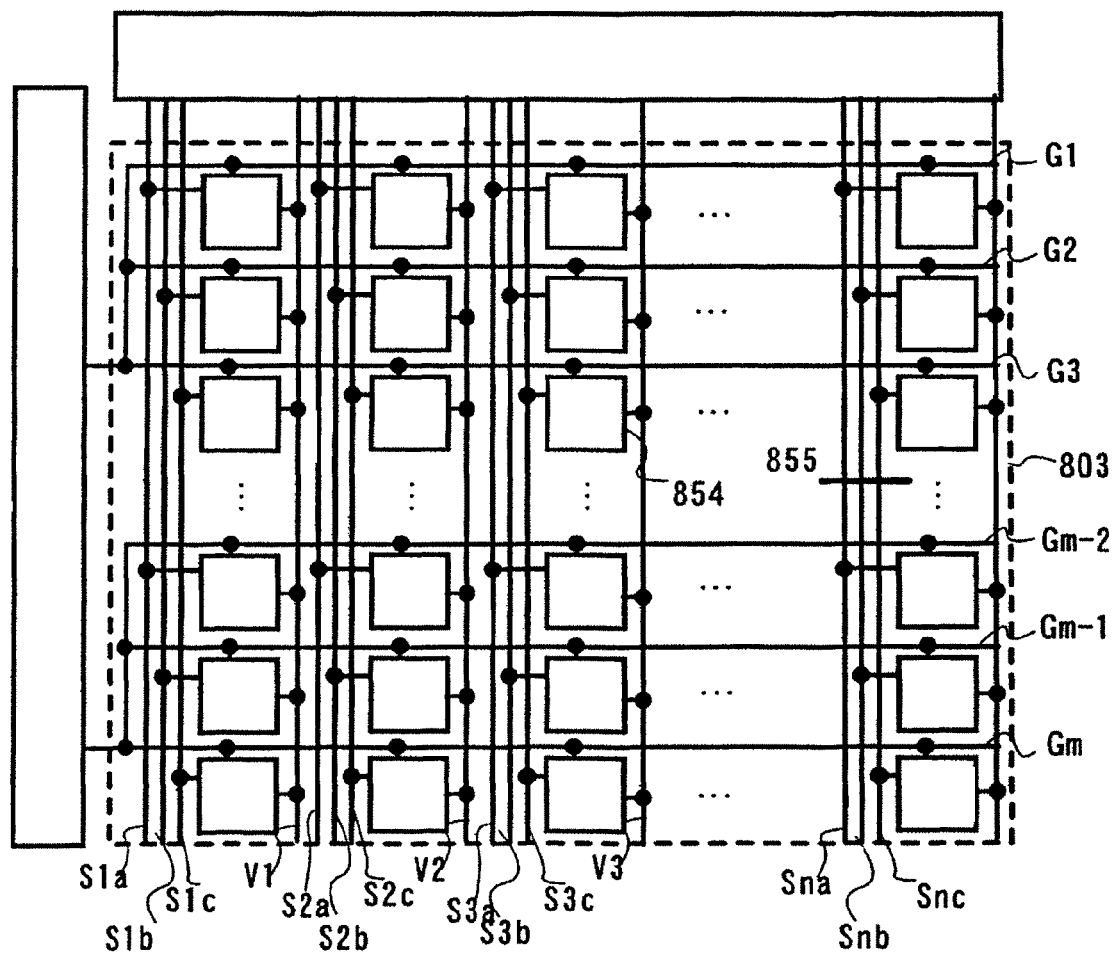
FIG. 8 is a diagram showing Embodiment Mode 1 of the invention.

FIGS. 8, 16A and 16B show circuit diagrams of a whole pixel portion of this embodiment mode. In this embodiment mode, a plurality of source signal lines are provided for one vertical column of pixels. In FIG. 8, description is made on an example where three source signal lines are provided for one vertical column of pixels.

It is to be noted that the number of the source signal lines is not limited to three and may be provided as many as required.

A circuit 854 of each pixel in FIG. 8 is described as a circuit shown in FIGS. 16A and 16B. However, this is only an example and a circuit in each pixel is not limited to the circuits in FIGS. 16A and 16B.

A pixel of row one and column one includes a gate signal line G1, a source signal line S1a which is one of the three source signal lines, a power supply line V1, a switching TFT 1001, a driving TFT 1002, an EL element 1003, and a capacitor 1004.

A connection between the pixel and circuit is described. The gate signal line G1 is connected to a gate electrode of the switching TFT 1001 and the source signal line S1a which is one of the three source signal lines is connected to a source electrode or a drain electrode of the switching TFT 1001, the power supply line V1 is connected to a source electrode or a drain electrode of the driving TFT 1002 and one electrode of the capacitor 1004. The other electrode of the capacitor 1004 is connected to the other of the source electrode and the drain electrode of the switching TFT 1002 and a gate electrode of the driving TFT 1002. The other of the source electrode and the drain electrode of the driving TFT 1002 is connected to the EL element 1003.

Further, a pixel of row two and column one includes a gate signal line G2, a source signal line S1b which is one of the three source signal lines, the power supply line V1, the switching TFT 1001, the driving TFT 1002, the EL element 1003, and the capacitor 1004.

The pixel of row two and column one is different from the pixel of row one and column one in that G2 is used instead of G1 and S1b is used instead of S1a.

A pixel of row three and column one includes a gate signal line G3, a source signal line S1c which is one of the three signal lines, the power supply line V1, the switching TFT 1001, the driving TFT 1002, the EL element 1003, and the capacitor 1004.

The pixel of row three and column one is different from the pixel of row one and column one in that G1 is used instead of G3 and S1c is used instead of S1a.

Further, in the three pixel columns described above, G1, G2, and G3 are electrically connected.

Further, the pixels of column one are the repetition of the aforementioned structure.

Further, the pixels of column two is different from the aforementioned structure in that V2 is used instead of V1, S2a is used instead of S1a, S2b is used instead of S1b, and S2c is used instead of S1c.

Further, the pixels of column n is different from the aforementioned structure in that Vn is used instead of V1, Sna is used instead of S1a, Snb is used instead of S1b, and Snc is used instead of S1c.

Further, V1 to Vn are all electrically connected to each other.

Next, description is made on how to operate the circuit of FIG. 8. First, the gate signal lines G1, G2, and G3 are turned on at the same time. While the gate signal lines G1, G2, and G3 are on, signals are written to the pixels from the source signal lines S1a, S1b, S1c, . . . , Sna, Snb, and Snc. Then, gate signal lines G4, G5, and G6 are turned on at the same time. While the gate signal lines G4, G5, and G6 are on, signals are written to the pixels from the source signal lines S1a, S1b, S1c, . . . , Sna, Snb, and Snc. These operations are repeated up to gate signal lines Gm-2, Gm-1, and Gm. The signals for one image can be written by the aforementioned operations.

When operating in this manner that the three gate signal lines operate as one group, therefore, the gate signal line is turned on three times as long as a circuit having only one signal line. That is, the problem that the write time is required to be as long as possible can be resolved.

In the case of connecting as shown in FIG. 8, however, parasitic capacitance between wirings may increase in some cases.

Accordingly, a process may be devised by utilizing the advantage of the method which can selectively form a pattern in addition to the structure of FIG. 8. In order to describe this, FIGS. 6A to 6C are referred as diagrams showing cross sections along a line 855.

Figure 6A:
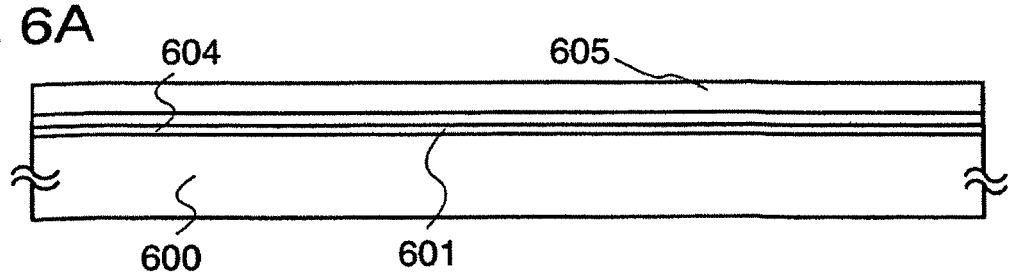
FIGS. 6A to 6C are diagrams showing structures to reduce parasitic capacitance between wirings.
Figure 6B:
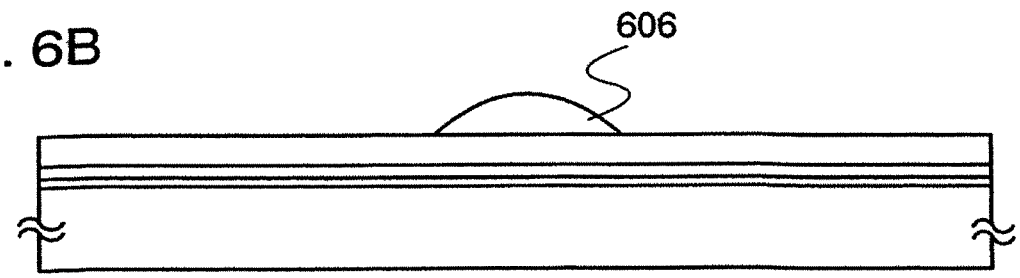
Figure 6C:
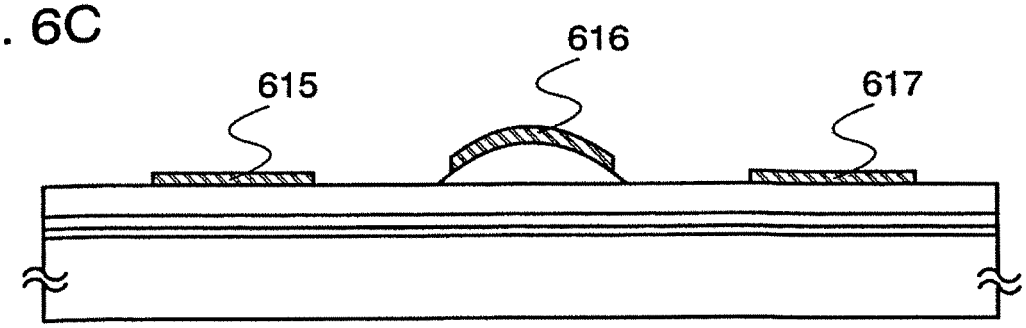

FIGS. 6A to 6C show a process applied to the substrate over which the gate insulting layer 805 is formed in the aforementioned TFT forming steps (FIG. 13A). There is no semiconductor layer in the cross section 855, therefore, a conductive layer is normally formed after forming a gate insulating layer 605 (FIG. 6A). In this embodiment mode, however, a portion of the insulating layer over which the three source signal lines are formed is further selectively formed into a pattern by the droplet discharging method after forming the gate insulating layer 605 (FIG. 6B). After that, a conductive layer is formed as described above to form a pattern (FIG. 6C).

By performing such a process, the three source signal lines are formed with and without an insulating layer 606. In this structure, a distance between wirings is longer than the case with no insulating layer 606, and thus parasitic capacitance between the wirings can be reduced. That is, the problem that parasitic capacitance is required to be as little as possible can be achieved. Further, in the structure of this embodiment mode, the longer the wiring is, the larger the effect is.

It is to be noted in this embodiment mode that the place, number, shape, and the like of the insulating layer may be freely determined as long as the insulating layer is selectively formed to keep the distance between the wirings of the same layer long. Further, the wiring formed over the insulating layer which is selectively formed is not limited to the source signal line. An insulating layer can be formed as a gate signal line or a power supply line by a similar method and parasitic capacitance can be reduced.

Embodiment Mode 2

Figure 9:
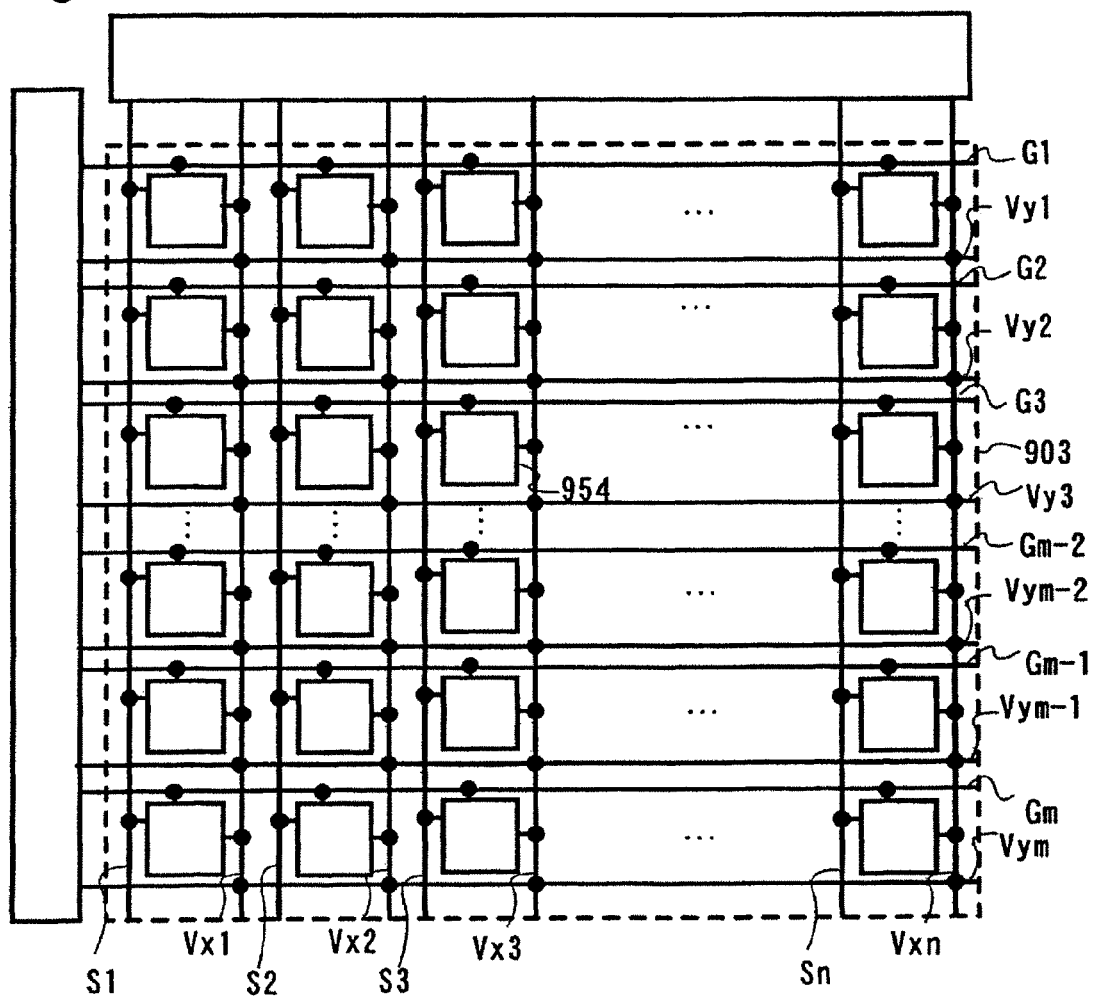
FIG. 9 is a diagram showing Embodiment Mode 2 of the invention.

Description is made with reference to FIGS. 9, 16A, and 16B on an embodiment mode of the invention.

In FIG. 9, a circuit 954 in each pixel is described as the circuit shown in FIGS. 16A and 16B. However, this is only an example and the circuit in each pixel is not limited to the circuit in FIGS. 16A and 16B.

A pixel of row one and column one of the pixel portion includes the gate signal line G1, the source signal line S1, a power supply line Vx1, a power supply line Vy1, the switching TFT 1001, the driving TFT 1002, the EL element 1003, and the capacitor 1004.

Description is made on a connection between the pixel and circuit. The gate signal line G1 is connected to the gate electrode of the switching TFT 1001, the source signal line S1 is connected to the source electrode or the drain electrode of the switching TFT 1001, the power supply line Vx1 is connected to the source electrode or the drain electrode of the driving TFT 1002 and one electrode of the capacitor 1004. The power supply line Vy1 is connected to the power supply line Vx1 and the other electrode of the capacitor 1004 is connected to the other of the source electrode or the drain electrode of the switching TFT 1001 and the gate electrode of the driving TFT 1002. The other of the source electrode or the drain electrode of the driving TFT 1002 is connected to the EL element 1003.

A pixel of row two and column one of the pixel portion includes the gate signal line G2, the source signal line S1, the power supply line Vx1, the power supply line Vy2, the switching TFT 1001, the driving TFT 1002, the EL element 1003, and the capacitor 1004.

The pixel of row two and column one of the pixel portion is different from the pixel of row one and column one in that G2 is used instead of G1 and Vy2 is used instead of Vy1.

Further, a pixel of row m and column one of the pixel portion includes a gate signal line Gm, the source signal line S1, the power supply line Vx1, a power supply line Vym, the switching TFT 1001, the driving TFT 1002, the EL element 1003, and the capacitor 1004.

Further, a pixel of row one and column n of the pixel portion is different from the pixel of row one and column one in that Sn is used instead of S1 and Vxn is used instead of Vx1.

Further, a pixel of row m and column n of the pixel portion is different from the pixel of row one and column one in that Sn is used instead of S1, Vxn is used instead of Vx1, Gm is used instead of G1, and Vym is used instead of Vy1.

Further, Vx1 to Vxn and Vy1 to Vyn are all electrically connected to each other.

In this embodiment mode, power supply lines in the pixel portion are not only the wirings (Vx1 to Vxn) provided in parallel with the source signal lines (S1 to Sn) but also provided in a vertical direction or an almost vertical direction (Vy1 to Vym), thereby voltage is supplied from each direction to the source region or the drain region of the driving TFT 1002 of the pixel. The power supply lines provided in a vertical direction or an almost vertical direction (Vy1 to Vym) are connected to the power supply lines (Vx1 to Vxn) per pixel and the power supply lines are arranged in matrix. Accordingly, a current flowing through the EL element 1003 is supplied not only in a direction parallel to the source signal lines (S1 to Sn) but also in the vertical direction. Therefore, one of the problems to be solved in the invention that wiring resistance is required to be as low as possible can be resolved.

As wiring resistance can be low, a cross talk which occurs when an EL display device is driven by the analog driving method is reduced. Further, a gray scale display defect can be reduced which occurs when an EL display device operates by the digital driving method and the constant voltage drive in combination.

However, it is one of the objects of this embodiment to manufacture an EL display device at low cost similarly to Embodiment Mode 1. Therefore, an EL display device may be manufactured through an EL display device manufacturing process by the droplet discharging method which is one of manufacturing methods of an EL display device capable of selectively forming a pattern.

Here, description is made on a problem in employing the droplet discharging method for cost reduction in manufacturing an EL display device.

FIGS. 7A to 7D are top plan views (A and B) and sectional views (C and D) of a conductive layer formed as a wiring by the droplet discharging method. When forming the conductive layer by discharging a composition containing a conductive material, the conductive layer may not be formed in a desired shape at a desired position depending on the characteristics of the conductive material to be discharged, water repellency of the base, an error of the discharged position and the like (see FIGS. 7B and 7D).

Figure 7A:
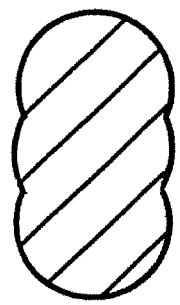
FIGS. 7A to 7D are diagrams showing shapes which cause variations in wiring resistance.
Figure 7B:
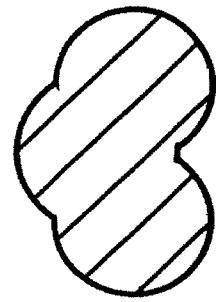
Figure 7C:
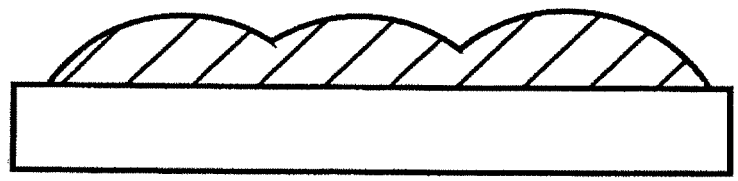
Figure 7D:

Here, resistance of wiring depends on the length of the wiring and the area of the cross section when using the same conductive material. In the case where a desired shape is not obtained as shown in FIGS. 7B and 7D, the resistance of the wiring becomes higher than the designed value. That is, the wiring formed by the droplet discharging method has more variations in wiring resistance as compared to a wiring formed by the photolithography method.

With high wiring resistance, a cross talk occurs in the case of using the analog driving method and a defect occurs in a gray scale display in the case of using the constant voltage drive in the digital driving method as described above. When the wiring resistance varies, display defects of the pixels differ depending on the power supply lines. This can be easily observed as display unevenness.

That is, one of the problems in using the droplet discharging method for cost reduction is the variations in wiring resistance. In view of this, variations in wiring resistance are required to be as little as possible.

Here, description is made in this embodiment mode on that variations in wiring resistance caused by the droplet discharging method can be reduced.

This can be described by considering all wiring resistance is connected in parallel when the power supply lines are arranged in matrix. That is, when the wiring resistance is connected in parallel, resistance of the power supply line up to a certain pixel depends on the resistance of all the power supply lines and becomes less dependent on the position of resistance which exists in the case of non-matrix arrangement.

That is, according to this embodiment mode, the object that variations in wiring resistance in the case of using the droplet discharging method are required to be as little as possible can be resolved as well as reducing the wiring resistance of the power supply line can be reduced.

It is to be noted in this embodiment mode that wirings are not required to be provided in parallel to each other and may be provided in any directions. Further, the power supply line is not required to be only one in each pixel and may be provided as many as required. Furthermore, the power supply lines are not required to be arranged in matrix in all the pixel portion and may be arranged in matrix in a portion of the pixel portion.

Further, this embodiment mode can be freely implemented in combination with Embodiment Mode 1.

Embodiment Mode 3

Figure 10:
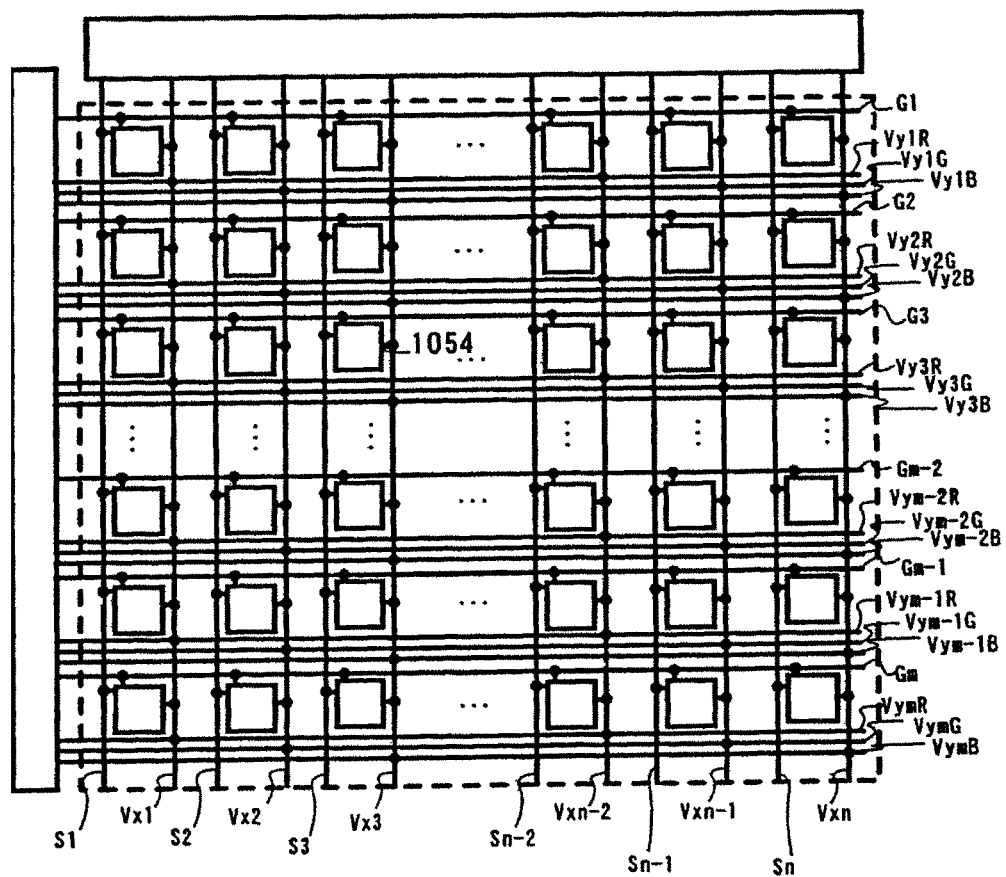
FIG. 10 is a diagram showing Embodiment Mode 3 of the invention.

Description is made with reference to FIGS. 10, 16A and 16B on an embodiment mode of the invention.

In FIG. 10, a circuit 1054 in each pixel is described as the circuit shown in FIGS. 16A and 16B. However, this is only an example and the circuit in each pixel is not limited to the circuit in FIGS. 16A and 16B.

A pixel of row one and column one of the pixel portion includes the gate signal line G1, the source signal line S1, the power supply line Vx1, a power supply line Vy1R, the switching TFT 1001, the driving TFT 1002, the EL element 1003, and the capacitor 1004.

Description is made on a connection between the pixel and circuit. The gate signal line G1 is connected to the gate electrode of the switching TFT 1001 and the source signal line S1 is connected to the source electrode or the drain electrode of the switching TFT 1001. The power supply line Vx1 is connected to the source electrode or the drain electrode of the driving TFT 1002 and one electrode of the capacitor 1004. The power supply line Vy1R is connected to the power supply line Vx1 and the other electrode of the capacitor 1004 is connected to the other of the source electrode or the drain electrode of the switching TFT 1001 and the gate electrode of the driving TFT 1002. The other of the source electrode or the drain electrode of the driving TFT 1002 is connected to the EL element 1003.

Further, a pixel of row two and column one of the pixel portion includes the gate signal line G2, the source signal line S1, the power supply line Vx1, a power supply line Vy2R, the switching TFT 1001, the driving TFT 1002, the EL element 1003, and the capacitor 1004.

The pixel of row two and column one of the pixel portion is different from the pixel of row one and column one in that G2 is used instead of G1 and Vy2R is used instead of Vy1R.

Further, a pixel of row three and column one of the pixel portion is different from the pixel of row one and column one in that G3 is used instead of G1 and Vy3R is used instead of Vy1R.

Further, the pixels of column one of the pixel portion are the repetition of the structure of the aforementioned three rows.

Further, the pixel of row one and column two of the pixel portion is different from the pixel of row one and column one in that S2 is used instead of S1, Vx2 is used instead of Vx1, and Vy1G is used instead of VyR.

Further, the pixel of row two and column two of the pixel portion is different from the pixel of row one and column two in that G2 is used instead of G1 and Vy2G is used instead of Vy1G.

Further, a pixel of row three and column two of the pixel portion is different from the pixel of row one and column two in that G3 is used instead of G1 and Vy3G is used instead of Vy1G.

Further, the pixels of column two are the repetition of the structure of the aforementioned three rows.

Further, the pixel of row one and column three of the pixel portion is different from the pixel of row one and column one in that S3 is used instead of S1, Vx3 is used instead of Vx1, and Vy1B is used instead of Vy1R.

Further, the pixel of row two and column three of the pixel portion is different from the pixel of row one and column three in that G2 is used instead of G1 and Vy2B is used instead of Vy1B.

Further, the pixel of row three and column three of the pixel portion is different from the pixel of row one and column three in that G3 is used instead of G1 and Vy3B is used instead of Vy1B.

Further, the pixels of column three are the repetition of the structure of the aforementioned three rows.

Further, Vy1R to VymR are all electrically connected to each other.

Further, Vy1G to VymG are all electrically connected to each other.

Further, Vy1B to VymB are all electrically connected to each other.

In this embodiment mode, power supply lines of the pixel portion are not only the wirings (Vx1 to Vxn) provided in parallel with the source signal lines (S1 to Sn) but also provided in a vertical direction or an almost vertical direction (Vy1R to VymB), thereby voltage is applied from each direction to the source region or the drain region of the driving TFT 1002 in each pixel of R, G and B respectively. The power supply lines provided in a vertical direction or an almost vertical direction (Vy1 to Vym) are connected to the power supply lines (Vx1 to Vxn) per pixel of R, G, and B and the power supply lines are arranged in matrix. Accordingly, a current flowing through the EL element 1003 is supplied not only in a direction parallel to the source signal lines (S1 to Sn) but also in the vertical direction. Therefore, one of the problems to be solved in the invention that wiring resistance is required to be as low as possible can be resolved. Further, different levels of voltage may be applied to R, G, and B pixels which are connected independently.

As wiring resistance can be low, a cross talk which occurs when an EL display device is driven by the analog driving method is reduced. Further, a gray scale display defect can be reduced which occurs when an EL display device operates by the digital driving method and the constant voltage drive in combination.

However, it is one of the problems to be solved in this embodiment to manufacture an EL display device at low cost similarly to Embodiment Modes 1 and 2. Therefore, an EL display device may be manufactured through an EL display device manufacturing process by the droplet discharging method which is one of manufacturing methods of an EL display device capable of selectively forming a pattern.

In the case of forming wirings by the droplet discharging method, variations occur in wiring resistance as described above. According to this embodiment mode, variations in wiring resistance caused by the droplet discharging method can be reduced.

This can be described by considering all wiring resistance is connected in parallel when the power supply lines are arranged in matrix. That is, when the wiring resistance is connected in parallel, resistance of the power supply line up to a certain pixel depends on the resistance of all the power supply lines and becomes less dependent on the position of resistance which exists in the case of non-matrix arrangement.

That is, according to this embodiment mode, the problem that variations in wiring resistance in the case of using the droplet discharging method are required to be as little as possible can be resolved as well as reducing the wiring resistance of the power supply line can be reduced.

It is to be noted in this embodiment mode that wirings are not required to be provided in parallel to each other and may be provided in any directions. Further, the power supply line is not required to be only one in each pixel and may be provided as many as required. Furthermore, the power supply lines are not required to be arranged in matrix in all the pixel portion and may be arranged in matrix in a portion of the pixel portion.

Further, this embodiment mode can be freely implemented in combination with Embodiment Modes 1 and 2.

Embodiment Mode 4

Figure 11:
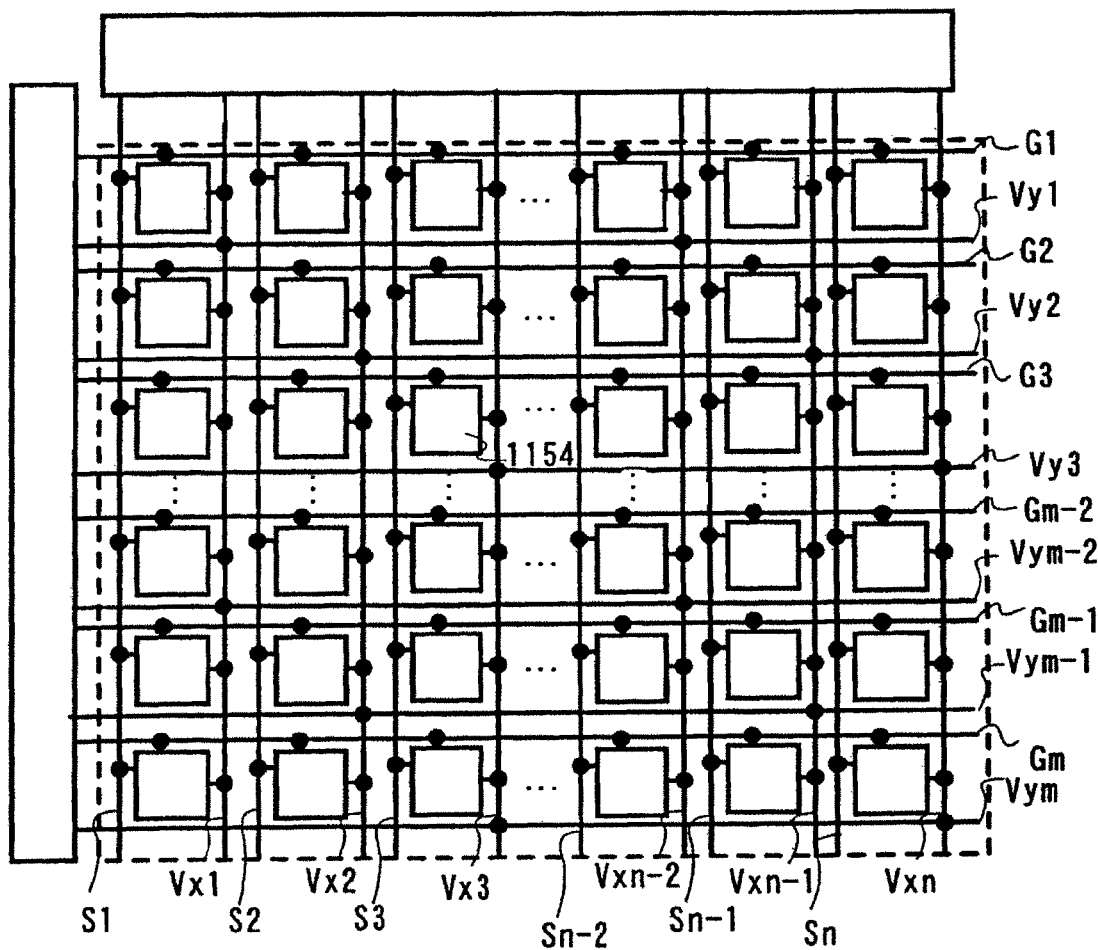
FIG. 11 is a diagram showing Embodiment Mode 4 of the invention.

Description is made with reference to FIGS. 11, 16A and 16B on an embodiment mode of the invention.

In FIG. 11, a circuit 1154 in each circuit is described as the circuit shown in FIGS. 16A and 16B. However, this is only an example and the circuit in each pixel is not limited to the circuit in FIGS. 16A and 16B.

A pixel of row one and column one includes the gate signal line G1, the source signal line S1, the power supply line Vx1, the power supply line Vy1, the switching TFT 1001, the driving TFT 1002, the EL element 1003, and the capacitor 1004.

Description is made on a connection between the pixel and circuit. The gate signal line G1 is connected to the gate electrode of the switching TFT 1001 and the source signal line S1 is connected to the source electrode or the drain electrode of the switching TFT 1001. The power supply line Vx1 is connected to the source electrode or the drain electrode of the driving TFT 1002 and one electrode of the capacitor 1004. The power supply line Vy1 is connected to the power supply line Vx1 and the other electrode of the capacitor 1004 is connected to the other of the source electrode or the drain electrode of the switching TFT 1001 and the gate electrode of the driving TFT 1002. The other of the source electrode or the drain electrode of the driving TFT 1002 is connected to the EL element 1003.

Further, a pixel of row two and column one of the pixel portion is different from the pixel of row one and column one in that G2 is used instead of G1 and may have a configuration in which Vx1 is not connected to another power supply line in order to electrically separate the power supply lines per R, G, and B.

Further, a pixel of row three and column one of the pixel portion is different from the pixel of row one and column one in that G3 is used instead of G1 and may have a configuration in which Vx1 is not connected to another power supply line in order to electrically separate the power supply lines per R, G, and B.

Further, a pixel of row four and column one of the pixel portion is different from the pixel of row one and column one in that G4 is used instead of G1 and Vy4 is used instead of Vy1.

Further, a pixel of row five and column one of the pixel portion is different from the pixel of row four and column one in that G5 is used instead of G4 and may have a configuration in which Vx1 is not connected to another power supply line in order to electrically separate the power supply lines per R, G, and B.

Further, a pixel of row six and column one of the pixel portion is different from the pixel of row four and column one in that G6 is used instead of G4 and may have a configuration in which Vx1 is not connected to another power supply line in order to electrically separate the power supply lines per R, G, and B.

Further, the pixels of column one are the repetition of the structure of the aforementioned three rows.

Further, a pixel of row one and column two of the pixel portion is different from the pixel of row one and column one in that S2 is used instead of S1 and Vx2 is used instead of Vx1 and may have a configuration in which Vx2 is not connected to another power supply line in order to electrically separate the power supply lines per R, G, and B.

Further, a pixel of row two and column two of the pixel portion is different from the pixel of row one and column two in that G2 is used instead of G1 and may have a configuration in which Vx2 is connected to another power supply line Vy2.

Further, a pixel of row three and column two of the pixel portion is different from the pixel of row one and column two in that G3 is used instead of G1 and may have a configuration in which Vx2 is not connected to another power supply line in order to electrically separate the power supply lines per R, G, and B.

Further, the pixels of column two are the repetition of the structure of the aforementioned three rows.

Further, a pixel of row one and column three of the pixel portion is different from the pixel of row one and column one in that S3 is used instead of S1 and Vx3 is used instead of Vx1, and may have a configuration in which Vx3 is not connected to another power supply line in order to electrically separate the power supply lines per R, G, and B.

Further, a pixel of row two and column three is different from the pixel of row one and column three in that G2 is used instead of G1 and has a configuration in which Vx3 is not connected to another power supply line.

Further, a pixel of row three and column three is different from the pixel of row one and column three in that G3 is used instead of G1 and may have a configuration in which Vx3 is not connected to another power supply line Vy3 in order to electrically separate the power supply lines per R, G, and B.

Further, the pixels of column three are the repetition of the structure of the aforementioned three rows.

The rest of the columns in the pixel portion has a configuration in which the configurations of the columns one to three are repeated.

Further, Vx1, Vx4, . . . , Vx(3$i$–2), Vy1, Vy4, . . . , and Vy(3$j$–2) are all electrically connected to each other (i and j are natural numbers).

Further, Vx2, Vx5, . . . , Vx(3$i$–1), Vy2, Vy5, . . . , and Vy(3$j$–1) are all electrically connected to each other (i and j are natural numbers).

Further, Vx3, Vx6, . . . , Vx(3$i$), Vy3, Vy6, . . . , and Vy(3$j$) are all electrically connected to each other (i and j are natural numbers).

In this embodiment mode, power supply lines of the pixel portion are not only the wirings (Vx1 to Vxn) provided in parallel to the source signal lines (S1 to Sn) but also provided in a vertical direction or an almost vertical direction (Vy1 to Vyn), thereby voltage is applied from each direction to the source region or the drain region of the driving TFT 1002 of the pixel of R, G, and B respectively. The power supply lines provided in a vertical direction or an almost vertical direction (Vy1 to Vym) are connected to the power supply lines (Vx1 to Vxn) per pixel of R, G, and B and the power supply lines are arranged in matrix. Accordingly, a current flowing through the EL element 1003 is supplied not only in a direction parallel to the source signal lines (S1 to Sn) but also in the vertical direction. Therefore, one of the problems to be solved in the invention that wiring resistance is required to be as low as possible can be resolved. Further, different levels of voltage may be applied to R, G, and B which are connected independently.

Further, as one power supply line is provided in parallel to a gate signal line in each pixel, wiring resistance can be reduced without drastically reducing the aperture ratio and increasing parasitic capacitance between the wirings.

As wiring resistance can be low, a cross talk which occurs when an EL display device drives by the analog driving method is reduced. Further, a gray scale display defect can be reduced which occurs when an EL display device operates by the digital driving method and the constant voltage drive in combination.

However, it is one of the problems to be solved in this embodiment mode to manufacture an EL display device at low cost similarly to Embodiment Modes 1, 2, and 3. Therefore, an EL display device may be manufactured through an EL display device manufacturing process by the droplet discharging method which is one of manufacturing methods of an EL display device which can selectively form a pattern.

In the case of forming wirings by the droplet discharging method, variations occur in wiring resistance as described above. According to this embodiment mode, variations in wiring resistance caused by the droplet discharging method can be reduced.

This can be described by considering all wiring resistance is connected in parallel when the power supply lines are arranged in matrix. That is, when the wiring resistance are connected in parallel, resistance of the power supply line up to a certain pixel depends on the resistance of all the power supply lines and becomes less dependent on the position of resistance which exists in the case of non-matrix arrangement.

That is, according to this embodiment mode, the problem in that variations in wiring resistance in the case of using the droplet discharging method are required to be as little as possible can be resolved as well as reducing the wiring resistance of the power supply line can be reduced.

It is to be noted in this embodiment mode that wirings are not required to be provided in parallel to each other and may be provided in any directions. Further, the power supply line is not required to be only one in each pixel and may be provided as many as required. Furthermore, the power supply lines are not required to be arranged in matrix in the whole pixel portion and may be arranged in matrix in a portion of the pixel portion.

Further, this embodiment mode can be freely implemented in combination with Embodiment Modes 1, 2, and 3.

Embodiment Mode 5

This embodiment mode is a combination of Embodiment Mode 1 and Embodiment Mode 2, 3, or 4. A configuration here is described with reference to FIGS. 12, 16A and 16B.

Figure 12:
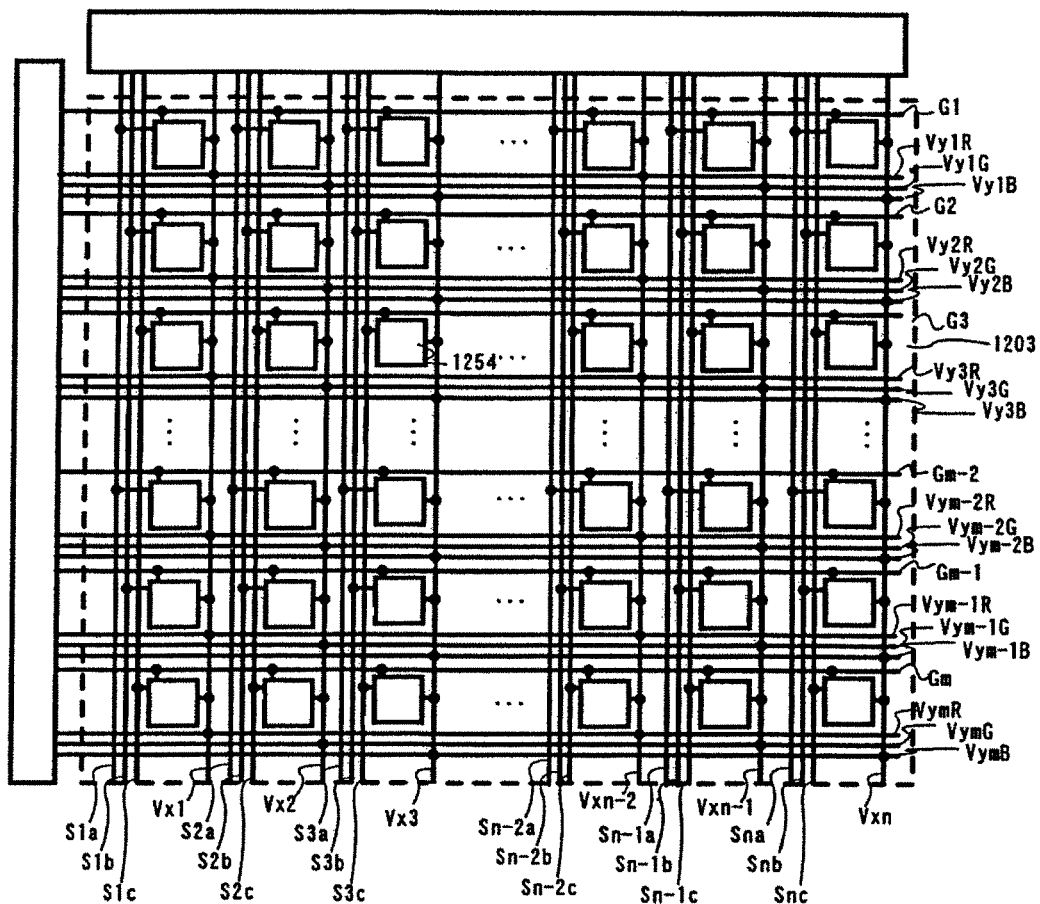
FIG. 12 is a diagram showing Embodiment Mode 5 of the invention.

FIGS. 12 and 16 show circuit diagrams of a whole pixel portion of this embodiment mode. In this embodiment mode, a plurality of source signal lines are provided for one vertical column of pixels. In FIG. 8, description is made on the case of providing three source signal lines for one vertical column of pixels.

It is to be noted that the number of the source signal lines is not limited to three and may be provided as many as required.

A circuit 1254 of each pixel in FIG. 12 is described as the circuit shown in FIGS. 16A and 16B. However, this is only an example and a circuit in each pixel is not limited to the circuit in FIG. 16.

A pixel of row one and column one includes a gate signal line G1, a source signal line S1a which is one of the three source signal lines, the power supply line Vx1, the switching TFT 1001, the driving TFT 1002, the EL element 1003, and the capacitor 1004.

A connection between the pixel and circuit is described. The gate signal line G1 is connected to a gate electrode of the switching TFT 1001 and the source signal line S1a which is one of the three source signal lines is connected to a source electrode or a drain electrode of the switching TFT 1001, the power supply line Vx1 is connected to the source electrode or the drain electrode of the driving TFT 1002 and one electrode of the capacitor 1004. The power supply line Vy1R is connected to the power supply line Vx1 and the other electrode of the capacitor 1004 is connected to the other of the source electrode or the drain electrode of the switching TFT 1001 and the gate electrode of the driving TFT 1002. The other of the source electrode or the drain electrode of the driving TFT 1002 is connected to the EL element 1003.

Further, a pixel of row two and column one of the pixel portion includes the gate signal line G2, the source signal line S1b which is one of the three source signal lines, the power supply line Vx1, the power supply line Vy2R, the switching TFT 1001, the driving TFT 1002, the EL element 1003, and the capacitor 1004.

A pixel of row two and column one is different from the pixel of row one, and column one in that G2 is used instead of G1, S1b is used instead of S1a, and Vy2R is used instead of Vy1R.

A pixel of row three and column one includes a gate signal line G3, the source signal line S1c which is one of the three signal lines, the power supply line Vx1, the power supply line Vy3R, the switching TFT 1001, the driving TFT 1002, the EL element 1003, and the capacitor 1004.

A pixel of row three and column one is different from the pixel of row one and column one in that G1 is used instead of G3, S1c is used instead of S1a, and Vy3R is used instead of Vy1R.

Further, in the three pixel columns described above, G1, G2, and G3 are electrically connected.

Further, the pixels of column one are the repetition of the aforementioned structure.

Further, the pixels of column two are different from the aforementioned structure in that Vx2 is used instead of Vx1, S2a is used instead of S1a, Sb2 is used instead of S1b, S2c is used instead of S1c, Vy1G is used instead of Vy1R, Vy2G is used instead of Vy2R, and Vy3G is used instead of Vy3R.

Further, the pixels of column three are different from the aforementioned structure in that Vx3 is used instead of Vx1, S3a is used instead of S1a, S3b is used instead of S1b, S3c is used instead of S1c, VynB is used instead of Vy1R, Vy2B is used instead of Vy2R, and Vy3B is used instead of Vy3R.

Further, the columns of the pixels after the column three are the repetition of the aforementioned structure.

Further, Vy1R to VymR are all electrically connected to each other.

Further, Vy1G to VymG are all electrically connected to each other.

Further, Vy1B to VymB are all electrically connected to each other.

According to this embodiment mode, the problem described in Embodiment Mode 1 in that the write time is required to be taken as long as possible can be resolved. Further, the problem in that parasitic capacitance is required to be as small as possible can be resolved.

Further, according to this embodiment mode, the problem described in Embodiment Mode 2, 3, or 4 in that wiring resistance is required to be as low as possible can be resolved. Further, the problem in that variations in wiring resistance are required to be as little as possible can be resolved.

Further, according to this embodiment mode, an EL display device can be manufactured at low cost as the droplet discharging method is used which can selectively form a pattern.

Embodiment Mode 6

Description is made with reference to FIGS. 18A to 19F on an embodiment mode of the invention. In this embodiment mode, a channel etch type thin film transistor is used as a thin film transistor. Therefore, description on the same portion or the portion having a similar function is omitted here.

Figure 18A:
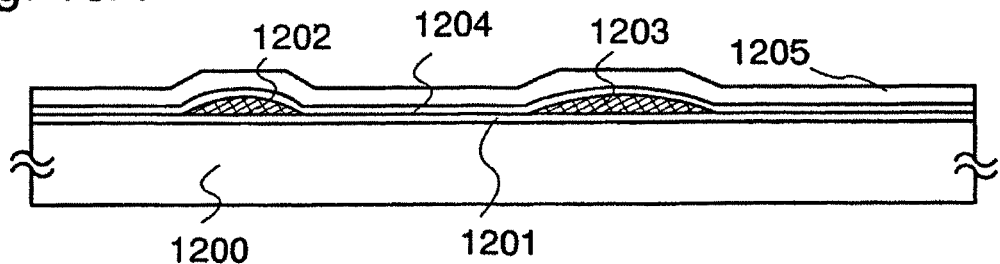
FIGS. 18A to 18D are views showing a manufacturing method of a display device to which the invention can be applied.

A base film 1201 having a function to improve adhesiveness is formed over a substrate 1200 (see FIG. 18A). An insulating layer may be formed over the substrate 1200. This insulating layer is used as a base film and is not necessarily provided, but has an effect to block a contaminant and the like from the substrate 1200. In the case of forming a base layer for preventing contamination from a glass substrate, the base film 801 is formed as pre-treatment for conductive layers 1202 and 1203 which are formed over the base layer by the droplet discharging method.

In this embodiment mode, a substance having a photocatalytic function is used as the base film having a function to improve adhesiveness.

In this embodiment mode, description is made on the case of forming a $TiO_x$ crystal having a predetermined crystalline structure as a photocatalytic substance by the sputtering method. Sputtering is performed by using a metal titanium tube as a target and an argon gas and oxygen. Further, a He gas may be introduced as well. In order to form $TiO_x$ which is highly photocatalytically active, an atmosphere containing a lot of oxygen is used with a rather high pressure. Further, $TiO_x$ is preferably formed while heating a deposition chamber or a substrate over which an object to be treated is formed.

$TiO_x$ formed in this manner formed in this manner has a photocatalytic function even in a quite thin film form.

It is preferable to form the base film 1201 using a metal material such as Ti (titanium), W (tungsten), Cr (chromium), Ta (tantalumn), Ni (nickel), and Mo (molybdenum), or oxide thereof by a sputtering method or a vapor deposition method. The base film is formed with a thickness of 0.01 to 10 nm, and does not necessarily have a layer structure as long as it is formed quite thin. In the case of using a high-melting point material as the base film, it is preferable to treat the base film exposed on the surface by carrying out one of the following two steps after forming the conductive layers 1202 and 1203 to be gate electrode layers.

The first method is a step of insulating the base film 1201 which is not overlapped with the conductive layers 1202 and 1203 to form an insulating layer. In other words, the base film 1201 which is not overlapped with the conductive layers 1202 and 1203 is oxidized and insulated. When the base film 1201 is oxidized and insulated in this manner, it is preferable to form the base film 1201 to be 0.01 to 10 nm in thickness, thus, the base film can be easily oxidized. Note that oxidization may be performed by exposing to an oxygen atmosphere or by thermal treatment.

The second method is a step of removing the base film 1201 by etching using the conductive layers 1202 and 1203 as a mask. When this step is employed, there is no limitation in the thickness of the base film 1201.

Alternatively, a method of performing plasma treatment on a formation region (formation surface) can be employed as another pre-base treatment. The plasma treatment is performed with air, oxygen, or nitrogen used as a treatment gas, with pressure from several ten Torr to 1000 Torr (133000 Pa), preferably, from 100 Torr (13300 Pa) to 1000 Torr (133000 Pa), more preferably, from 700 Torr (93100 Pa) to 800 Torr (106400 Pa), that is, atmospheric pressure or pressure in proximity of atmospheric pressure, and a pulse voltage is applied with such conditions. At this time, plasma density is set at $1 \times 10^{10}$ to $1 \times 10^{14}$ m$^{-3}$, so that so-called corona discharge or glow discharge is achieved. Surface modification can be performed without material dependence by employing plasma treatment using air, oxygen, or nitrogen as a treatment gas. Accordingly, surface modification can be performed on any material.

As another method, a substance of an organic material functioning as an adhesive may be formed to improve adhesiveness of a pattern to be formed by a droplet discharging method with a formation region thereof. An organic material (organic resin material) (polyimide or acrylic) is composed of a skeleton formed of the bond of silicon (Si) and oxygen (O), in which an organic group containing at least hydrogen (such as an alkyl group or aromatic hydrocarbon) is included as a substituent. Alternatively, a fluoro group may be used as the substituent. Further alternatively, a fluoro group and an organic group containing at least hydrogen may be used as the substituent.

Subsequently, a composition containing a conductive material is discharged, and conductive layers 1202 and 1203 to function as gate electrodes later are formed. These conductive layers 1202 and 1203 are formed by the droplet discharging method. In this embodiment mode, silver is used as a conductive material, but a stack of silver, copper and the like may be used as well. Alternatively, a single layer of copper may be used as well.

In addition, the aforementioned step of forming the base film 1201 is carried out as pre-base treatment for a conductive layer to be formed by using the droplet discharging method, however, this treatment step may be carried out after forming the conductive layer.

Subsequently, a gate insulating film is formed over the conductive layers 1202 and 1203 (see FIG. 18A). The gate insulating film may be formed of a known material such as an oxide or nitride material of silicon, and may be stacked layers or a single layer.

Figure 18B:
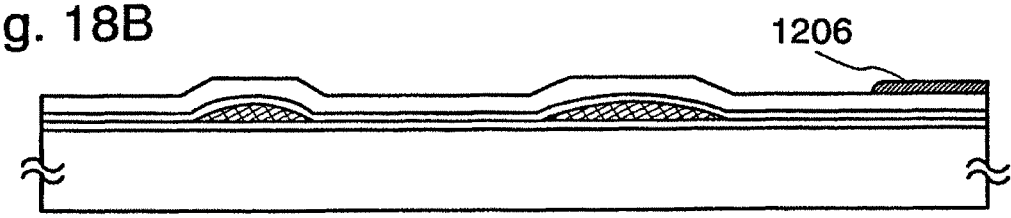
Figure 18C:
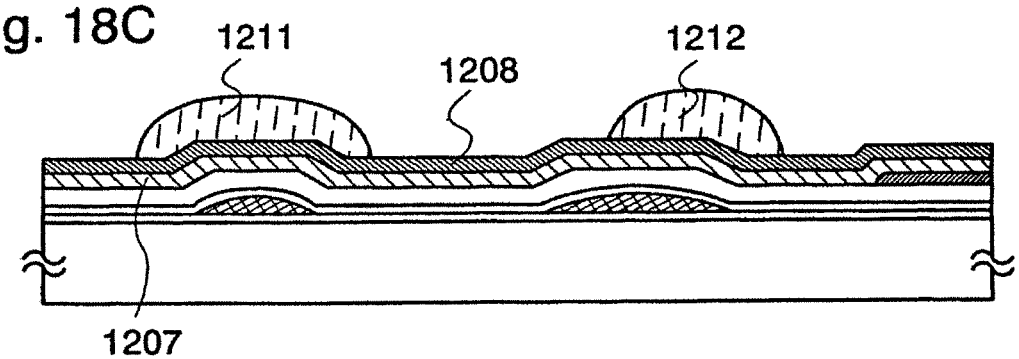

Subsequently, a conductive layer (also referred to as a first electrode) 1206 is formed by selectively discharging a composition containing a conductive material onto the gate insulating film (see FIG. 18B). The conductive layer 1206 may be formed in a predetermined pattern of a composition containing indium tin oxide (ITO), indium tin oxide containing silicon oxide (ITSO), zinc oxide (ZnO), tin oxide (SnO$_2$), or the like and by baking it when light is emitted from the substrate 1200 side or when a light-transmissive EL display panel is manufactured. Although not shown, a photocatalytic substance may be formed in a region where the conductive layer 1206 is formed similarly to the case of forming the conductive layers 1202 and 1203. With a photocatalytic substance, adhesiveness is improved and the conductive layer 1206 can be formed into a desired pattern to be a thin line. This conductive layer 1206 becomes a first electrode which functions as a pixel electrode.

The semiconductor layer may be formed by a known method (the sputtering method, the LPCVD method, the plasma CVD method, or the like). There is no particular limitation in materials of the semiconductor layer, but the semiconductor layer is preferably formed of silicon, a silicon germanium (SiGe) alloy, or the like.

The semiconductor layer formed of an amorphous semiconductor (typically, hydrogenated amorphous silicon), a semi-amorphous semiconductor, a semiconductor of which semiconductor layer partially has a crystal phase, a crystalline semiconductor (typically polysilicon), or an organic semiconductor as a material.

In this embodiment mode, an amorphous semiconductor is used as a semiconductor. A semiconductor layer 1207 is formed and a semiconductor layer having one conductivity, for example an N-type semiconductor layer 1208 is formed by the plasma CVD method and the like (see FIG. 12C). The semiconductor layer having one conductivity may be formed as required.

Subsequently, mask layers 1211 and 1212 each of which is formed of an insulator such as resist and polyimide are formed, and then the semiconductor layer 1207 and the N-type semiconductor layer 1208 are patterned at the same time by using the mask layers 1211 and 1212.

Figure 18D:
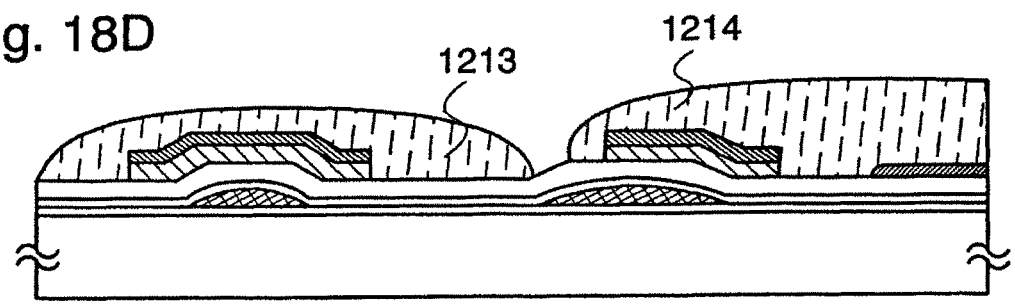

Subsequently, mask layers 1213 and 1214 formed of an insulator such as resist and polyimide are formed by the droplet discharging method (see FIG. 18D). By using the mask layers 1213 and 1214, a through hole 1218 is formed in a portion of the gate insulating layers 1204 and 1205 by an etching process, thereby exposing a portion of the conductive layer 1203 which functions as a gate electrode provided on a lower layer side.

Figure 19A:
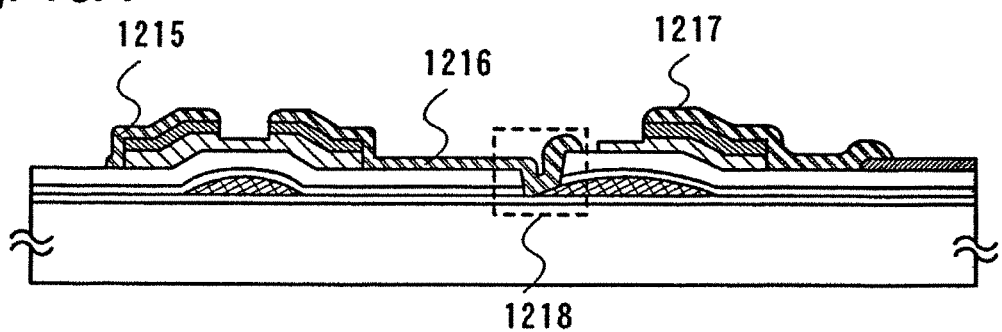
FIGS. 19A and 19B are views showing a manufacturing method of a display device to which the invention can be applied.

After removing the mask layers 1213 and 1214, conductive layers 1215, 1216, and 1217 are formed by discharging a composition containing a conductive material, and the N-type semiconductor layer is patterned with the conductive layers 1215, 1216, and 1217 as masks to form an N-type semiconductor layer (see FIG. 19A). It is to be noted that before forming the conductive layers 1215, 1216, and 1217, a photocatalytic substance may be selectively formed in a portion where the conductive layers 1215, 1216, and 1217 are in contact with the gate insulating layer 1205. Accordingly, a conductive layer can be formed with favorable adhesiveness.

The conductive layer 1217 functions as a source wiring layer or a drain wiring layer and is formed to be electrically connected to the conductive layer 1206 as a first electrode formed in advance. The conductive layer 1216 as a source wiring layer or a drain wiring layer and the conductive layer 1203 as a gate electrode layer are electrically connected through the through hole 1218 formed in the gate insulating layer 1205.

A step of forming the through hole 1218 in a portion of the gate insulating layers 1204 and 1205 may be performed after forming the conductive layers 1215, 1216, and 1217 with the conductive layers 1215, 1216, and 1217 to be the wiring layers as masks. Then, a conductive layer is formed in the through hole 1218, and then the conductive layer 1216 and the conductive layer 1203 as a gate electrode layer are electrically connected. In this case, it is advantageous in that the manufacturing steps can be simplified.

Figure 19B:
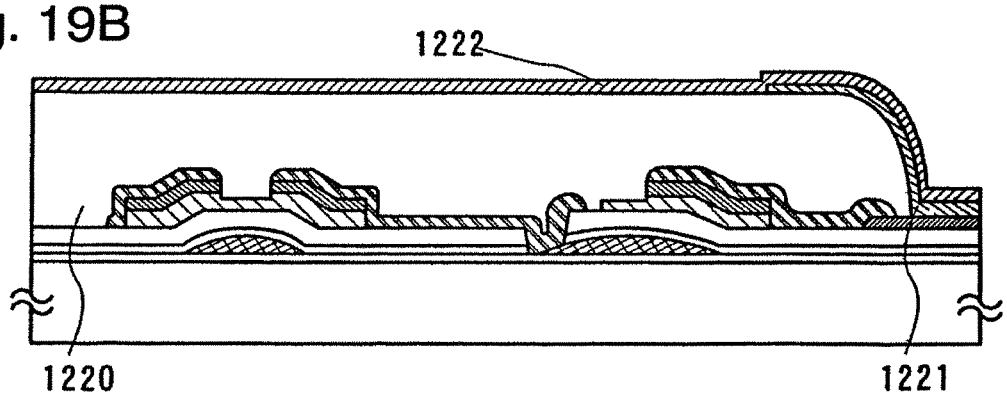

Subsequently, an insulating layer 1220 to be a partition wall is formed. An opening is formed in the insulating layer 1220 as shown in FIG. 19B by an etching process after the insulating layer is entirely formed by the spin coating method or the dipping method. The etching process is not necessarily carried out when the insulating layer 1220 is formed by the droplet discharging method.

The insulating layer 1220 is formed with the through hole having an opening portion provided in accordance with a position where a pixel is formed corresponding to the conductive layer 1206 as the first electrode.

By the aforementioned steps, a TFT substrate in which a bottom gate type (also referred to as an inversely staggered type) channel etch type TFT and the conductive layer 1206 as the first electrode are connected over the substrate 1200 is completed.

By stacking an electroluminescent layer 1221 over the conductive layer 1206 as the first electrode and a conductive layer 1222 thereover, a display device having a display function using a light emitting element is completed (see FIG. 19B).

As described above, the step can be omitted in this embodiment mode by not applying a light exposure step utilizing a photo mask. In addition, an EL display panel can be easily manufactured by directly forming various patterns over a substrate with a droplet discharging method even when a glass substrate of the fifth or the following generation having a side of more than 1000 mm is used.

Furthermore, a highly reliable display device of which adhesiveness and peeling resistance are improved can be manufactured.

Embodiment Mode 7

Figure 20A:
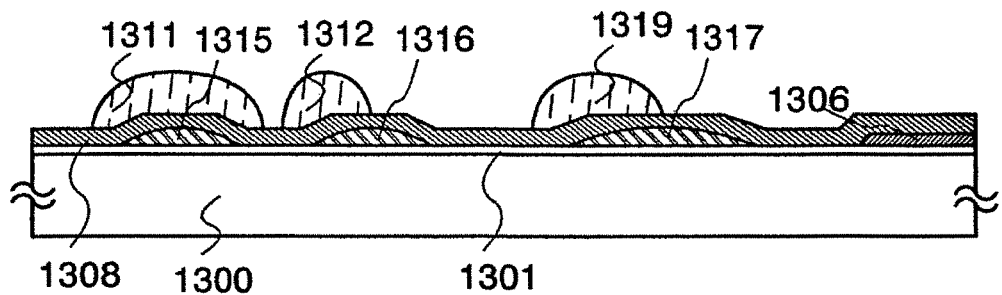
FIGS. 20A to 20D are views showing a manufacturing method of a display device to which the invention can be applied.
Figure 20B:
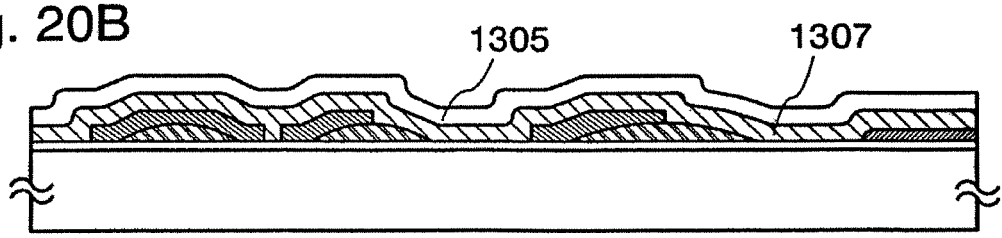
Figure 20C:
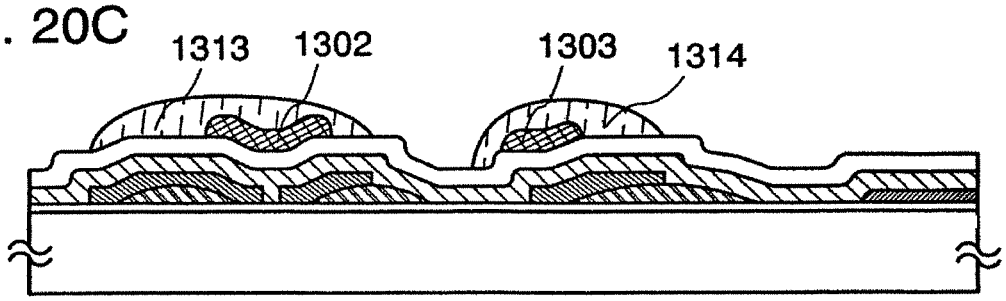
Figure 20D:
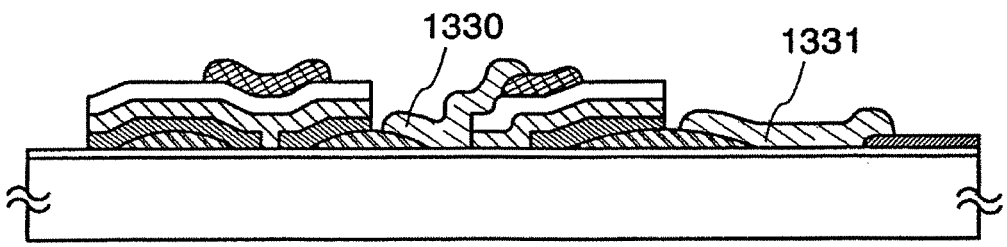
Figure 21:
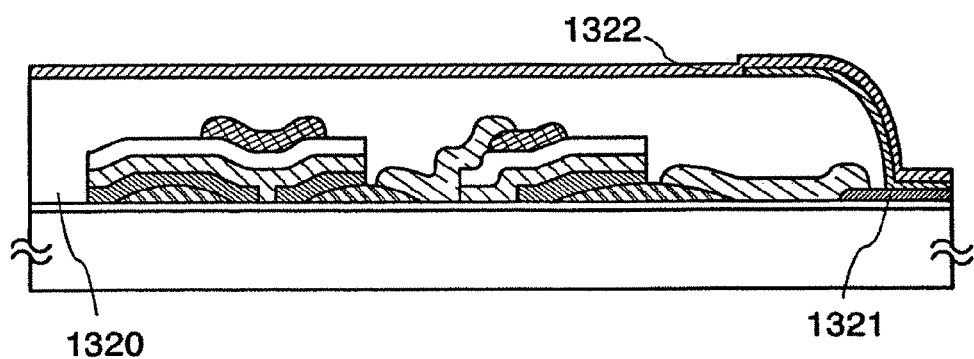
FIG. 21 is a view showing a manufacturing method of a display device to which the invention can be applied.

Description is made with reference to FIGS. 20A to 21 on an embodiment mode of the invention. This embodiment mode is different from Embodiment Mode 1 in that a top gate (also referred to as a forward staggered) type thin film transistor is used as a thin film transistor. Accordingly, description on the same portion or portion having a similar function is omitted.

A base film 1301 having a function to improve adhesiveness is formed over a substrate 1300 (see FIG. 20A). It is to be noted that an insulating layer may be formed over the substrate 1300. This insulating layer is not necessarily provided, but has an effect to block a contaminant and the like from the substrate 1300. In the case of using a forward staggered thin film transistor as in this embodiment mode, a semiconductor layer is in direct contact with a substrate, therefore, a base layer is not required. In the case of forming a base layer for preventing contamination from a glass substrate, the base film 1301 is formed over the base layer by the droplet discharging method as pre-treatment for conductive layers 1315, 1316, and 1317 in forming regions thereof.

In this embodiment mode, a substance having a photocatalytic function is used as the base film 1301 having a function to improve adhesiveness.

In this embodiment mode, description is made on the case of forming a $TiO_x$ crystal having a predetermined crystalline structure as a photocatalytic substance by the sputtering method. Sputtering is performed by using a metal titanium tube as a target and an argon gas and oxygen. Further, a He gas may be introduced as well. In order to form $TiO_x$ which is highly photocatalytically active, an atmosphere containing a lot of oxygen is used with a rather high pressure. Further, $TiO_x$ is preferably formed while heating a deposition chamber or a substrate over which an element is formed.

$TiO_x$ formed in this manner has a photocatalytic function even in a quite thin film form.

It is preferable to form a base film 1301 formed of a metal material such as Ti (titanium), W (tungsten), Cr (chromium), Ta (tantalumn), Ni (nickel), and Mo (molybdenum), or oxide thereof. The base film 1301 is to be formed with a thickness of 0.01 to 10 nm, and does not necessarily have a layer structure as long as it is formed quite thin. In the case of using a high-melting point material as the base film, it is preferable to treat the base film exposed on the surface by carrying out one of the following two steps after forming the conductive layers 1315, 1316, and 1317 to be source wiring layers or drain wiring layers.

The first method is a step of insulating the base film 1301 which is not overlapped with the conductive layers 1315, 1316, and 1317 to form an insulating layer. In other words, the base film 1301 which is not overlapped with the conductive layers 1315, 1316, and 1317 is oxidized and insulated. When the base film 1301 is oxidized and insulated in this manner, it is preferable to form the base film 1301 to be 0.01 to 10 nm in thickness, thus, the base film can be easily oxidized. Note that oxidization may be performed by exposing to an oxygen atmosphere or by thermal treatment.

The second method is a step of removing the base film 1301 by etching using the conductive layers 1315, 1316, and 1317 which function as source wiring layers or drain wiring layers as masks. When this step is employed, there is no limitation in the thickness of the base film 1301.

Alternatively, a method for performing plasma treatment on a formation region (formation surface) can be employed as another pre-base treatment. The plasma treatment is performed with air, oxygen, or nitrogen used as a treatment gas, with pressure from several ten Torr to 1000 Torr (133000 Pa), preferably, from 100 Torr (13300 Pa) to 1000 Torn (133000 Pa), more preferably, from 700 Torr (93100 Pa) to 800 Torr (106400 Pa), that is, atmospheric pressure or pressure in proximity of atmospheric pressure, and a pulse voltage is applied under such conditions. At this time, plasma density is set at $1 \times 10^{10}$ to $1 \times 10^{14}$ m$^{-3}$, so that so-called corona discharge or glow discharge is achieved. Surface modification can be performed without material dependence by employing plasma treatment using air, oxygen, or nitrogen as a treatment gas. Accordingly, surface modification can be performed on any material.

As another method, an organic material-based substance which functions as an adhesive may be formed to improve adhesion between a pattern formed by the droplet discharging method and a forming region thereof. An organic material (organic resin material) (polyimide or acrylic) is composed of a skeleton formed of the bond of silicon (Si) and oxygen (O), in which an organic group containing at least hydrogen (such as an alkyl group or aromatic hydrocarbon) is included as a substituent. Alternatively, a fluoro group may be used as the substituent. Further alternatively, a fluoro group and an organic group containing at least hydrogen may be used as the substituent.

Subsequently, a composition containing a conductive material is discharged, and conductive layers 1315, 1316, and 1317 to function as source wiring layers or drain wiring layers later are formed. These conductive layers 1315, 1316, and 1317 are formed by the droplet discharging method.

As the conductive material used for forming the conductive layers 1315, 1316, and 1317, a composition containing as a main component a particle of a metal such as Ag (silver), Au (gold), Cu (copper), W (tungsten), and Al (aluminum) can be used. In particular, a source wiring layer or a drain wiring layer which are preferably low in resistance are preferably formed by using any one of gold, silver, and copper dissolved or dispersed in a solvent in consideration of resistivity. More preferably, silver and copper which are low resistant are used. As for such solvents, esters such as butyl acetate, alcohols such as isopropyl alcohol, organic solvents such as acetone, or the like may be used. The surface tension and viscosity are appropriately controlled by controlling the concentration of the solvent and adding a surfactant and the like.

Subsequently, a conductive layer (also referred to as a first electrode) 1306 is formed by selectively discharging a composition containing a conductive material (see FIG. 20A). The conductive layer 1306 may be formed in a predetermined pattern of a composition containing indium tin oxide (ITO), indium tin oxide containing silicon oxide (ITSO), zinc oxide (ZnO), tin oxide ($SnO_2$), or the like and by baking it when light is to be emitted from the substrate 1300 side or when a light-transmissive EL display panel is to be manufactured. Although not shown, a photocatalytic substance may be formed in a region where the conductive layer 1306 is formed similarly to the case of forming the conductive layers 1315, 1316, and 1317. With a photocatalytic substance, adhesiveness is improved and the conductive layer 1306 can be formed into a thin desired pattern to be a thin line. This conductive layer 1306 becomes a first electrode which functions as a pixel electrode.

The step of forming the base film 1301 described above is performed as pre-base treatment for a conductive layer formed by the droplet discharging method, however, this treatment may be performed after forming the conductive layers 1315, 1316, and 1317. For example, by forming a titanium oxide film and an N-type semiconductor layer thereover though not shown, adhesion between the conductive layer and the N-type semiconductor layer is improved.

After forming the N-type semiconductor layer over the whole surface of the conductive layers 1315, 1316, and 1317, the N-type semiconductor layer provided between the conductive layers 1315 and 1316 and between the conductive layers 1316 and 1317 is removed by etching using mask layers 1311, 1312, and 1319 formed of an insulator such as resist and polyimide. A semiconductor layer having one conductivity may be formed as required. Then, a semiconductor layer 1307 formed of an amorphous semiconductor (hereinafter referred to as an AS) or an SAS is formed by a vapor phase method or the sputtering method. In the case of employing the plasma CVD method, the AS is formed by using $SiH_4$ as a semiconductor material gas or a mixed gas of $SiH_4$ and $H_2$. The SAS is formed of a mixed gas in which $SiH_4$ is diluted with $H_2$ by 3 to 1000 times. When the SAS is formed of the above kind of gas, the semiconductor layer has favorable crystallinity on a surface side. The SAS is suitable for a top gate type TFT in which the gate electrode is formed in an upper layer of the semiconductor layer.

Subsequently, a gate insulating layer 1305 is formed with a single layer or a stacked-layer structure by the plasma CVD method or the sputtering method. A stack of three layers of an insulating layer formed of silicon nitride, an insulating layer formed of silicon oxide, and an insulating layer formed of silicon nitride is particularly a preferable structure.

Next, gate electrode layers 1302 and 1303 are formed by the droplet discharging method. A composition containing a particle of a metal such as Ag (silver), Au (gold), Cu (copper), W (tungsten), or Al (aluminum), as its main component can be used as a conductive material for forming the gate electrode layers 1302 and 1303.

The semiconductor layer 1307 and the gate insulating layer 1305 are formed in a position corresponding to the source wiring layers and the drain wiring layers (the conductive layers 1315, 1316, and 1317) using the mask layers 1313 and 1314 formed by the droplet discharging method. In other words, the semiconductor layer and the gate insulating layer are formed to straddle over the conductive layers 1315 and 1316.

Subsequently, conductive layers 1330 and 1331 are formed by the droplet discharging method. The conductive layer 1316 and the gate electrode layer 1303, and the conductive layer 1317 and the conductive layer 1306 as the first electrode are electrically connected to each other.

The source wiring layer or drain wiring layer and the gate electrode layer may be directly connected through the gate electrode layer without using the conductive layer 1330. In that case, a through-hole is formed in the gate insulating layer 1305 and a part of the conductive layers 1316 and 1317 that are the source wiring or drain wirings is exposed before the gate electrode layers 1302 and 1303 are formed. After that, the gate electrode layers 1302, 1303 and the conductive layer 1331 are formed by the droplet discharging method. At this time, the gate electrode layer 1303 is a wiring which also serves as the conductive layer 1330, and is connected to the conductive layer 1316. Either dry etching or wet etching may be employed for etching, however, plasma etching which is dry etching is more preferable.

Subsequently, an insulating layer 1320 to be a partition wall is formed. Although not shown, a protective layer formed of silicon nitride or silicon nitride oxide may be entirely formed under the insulating layer 1320 to cover a thin film transistor. An opening is formed in the insulating layer 1320 as shown in FIG. 21 by an etching process after the insulating layer is entirely formed by the spin coating method or the dipping method. The etching process is not necessarily carried out when the insulating layer 1320 is formed by the droplet discharging method. When a wide region such as the insulating layer 1320 is formed by the droplet discharging method, a throughput is improved by forming by discharging a composition from a plurality of discharging openings of nozzles in a droplet discharging apparatus and drawing so that a plurality of lines are overlapped with each other.

The insulating layer 1320 is formed to have a through-hole corresponding to a position where a pixel is to be formed in accordance with the conductive layer 1306 as the first electrode.

According to the aforementioned steps, a TFT substrate is completed in which a top gate type (also referred to as an inversely staggered type) TFT and the conductive layer 1306 as the first electrode layer are connected over the substrate 1300.

Moisture adsorbed in the insulating layer 1320 or to a surface thereof is removed by performing thermal treatment at 200° C. under atmospheric pressure before forming an electroluminescent layer 1321. In addition, thermal treatment is performed at a temperature of 200 to 400° C., preferably, 250 to 350 under reduced pressure, and the electroluminescent layer 1321 is preferably formed by the vacuum vapor deposition method or the droplet discharging method under reduced pressure without being exposed to an atmospheric air.

The electroluminescent layer 1321 and a conductive layer 1322 are stacked over the conductive layer 1306 as the first electrode, and then, a display device having a display function using a light emitting element is completed (see FIG. 21).

As described above, the step can be omitted in this embodiment mode by not applying a light exposure step utilizing a photo mask. In addition, an EL display panel can be easily manufactured by directly forming various patterns over a substrate by the droplet discharging method even when a glass substrate of the fifth or the following generation having a side of more than 1000 mm is used.

Furthermore, a display device of which adhesiveness and peeling resistance are improved and reliability is high can be manufactured.

Embodiment Mode 8

An embodiment mode of the invention is described with reference to FIGS. 22A to 23B. This embodiment mode is different from Embodiment Mode 1 in that a thin film transistor and a first electrode are connected differently. Therefore, description on the same portion or a portion having a similar function is omitted.

A base film 1401 for improving adhesiveness is formed over a substrate 1400 as pre-base treatment. The case of forming TiO$_x$ crystal having a predetermined crystalline structure as a photocatalytic substance by the sputtering method is described in this embodiment mode. Sputtering is performed using a metal titanium tube as a target and using an argon gas and oxygen. Further, a He gas may be introduced. The atmosphere includes much oxygen and formation pressure is set high to form TiO$_x$ having high photocatalytic activity. It is preferable to form TiO$_x$ while heating a deposition chamber or a substrate provided with an object to be treated.

The thus formed TiO$_x$ has a photocatalytic function even when it is a very thin film.

Further, it is preferable to form the base film 1401 formed of a metal material such as Ti (titanium), W (tungsten), Cr (chromium), Ta (tantalum), Ni (nickel), or Mo (molybdenum), or oxide thereof by a sputtering method, a vapor deposition method, or the like as another pre-base treatment. The base film 1401 may be formed to be 0.01 to 10 nm in thickness. It does not necessarily have a layer structure as long as it is formed quite thin. When a high-melting point metal material is used as the base film, it is preferable to treat a base film exposed on the surface by carrying out either of the following two steps after forming conductive layers 1402 and 1403 to be gate electrode layers.

The first method is a step of insulating the base film 1401 which is not overlapped with the conductive layers 1402 and 1403 and forming an insulating layer. In other words, the base film 1401 which is not overlapped with the conductive layers 1402 and 1403 is oxidized and insulated. When the base film 1401 is oxidized and insulated in this manner, it is preferable to form the base film 1401 to be 0.01 to 10 nm in thickness, thus, the base film can be easily oxidized. Note that oxidization may be performed by exposing to an oxygen atmosphere or by thermal treatment.

The second method is a step of removing the base film 1401 by etching using the conductive layers 1402 and 1403 as masks. When this step is employed, there is no limitation in the thickness of the base film 1401.

Alternatively, a method for performing plasma treatment on a formation region (formation face) can be employed as another pre-base treatment. The plasma treatment is performed with air, oxygen, or nitrogen used as a treatment gas, with pressure from several ten Torr to 1000 Torr (133000 Pa), preferably, from 100 Torr (13300 Pa) to 1000 Torr (133000 Pa), more preferably, from 700 Torr (93100 Pa) to 800 Torr (106400 Pa), that is, atmospheric pressure or pressure in proximity of atmospheric pressure, and a pulse voltage is applied under such conditions. At this time, plasma density is set at $1 \times 10^{10}$ to $1 \times 10^{14}$ m$^{-3}$, so that so-called corona discharge or glow discharge is achieved. Surface modification can be performed without material dependence by employing plasma treatment using air, oxygen, or nitrogen as a treatment gas. Accordingly, surface modification can be performed on any material.

As another method, a substance of an organic material functioning as an adhesive may be formed to improve adhesion between a pattern to be formed by the droplet discharging method and a formation region thereof. An organic material (organic resin material) (polyimide or acrylic) or a material in which a skeletal structure is configured by the bond of silicon (Si) and oxygen (O) and which contains at least hydrogen as a substituent or which contains at least one of fluorine, an alkyl group, and aromatic hydrocarbon as a substituent may be used.

Subsequently, a composition containing a conductive material is discharged, and conductive layers 1402 and 1403 to function as a gate electrode later are formed. These conductive layers 1402 and 1403 are formed by the droplet discharging method, In this embodiment mode, silver is used as a conductive material, but a stack of silver, copper and the like may be used as well. Alternatively, a single layer of copper may be used as well.

In addition, the aforementioned step of forming the base film 1401 is carried out as pre-base treatment for a conductive layer to be formed by the droplet discharging method, however, this treatment step may be carried out after forming the conductive layer.

Figure 22A:
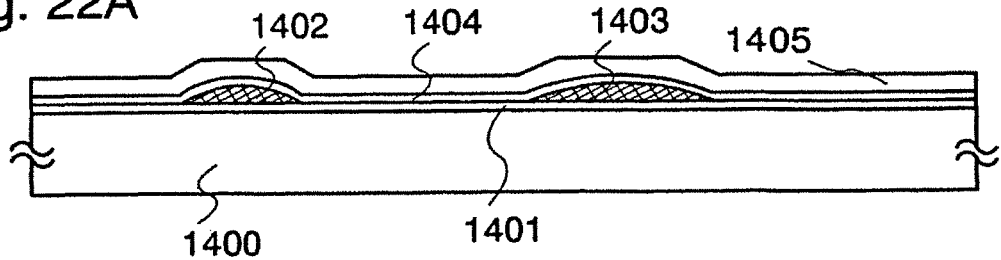
FIGS. 22A to 22D are views showing a manufacturing method of a display device to which the invention can be applied.
Figure 22B:
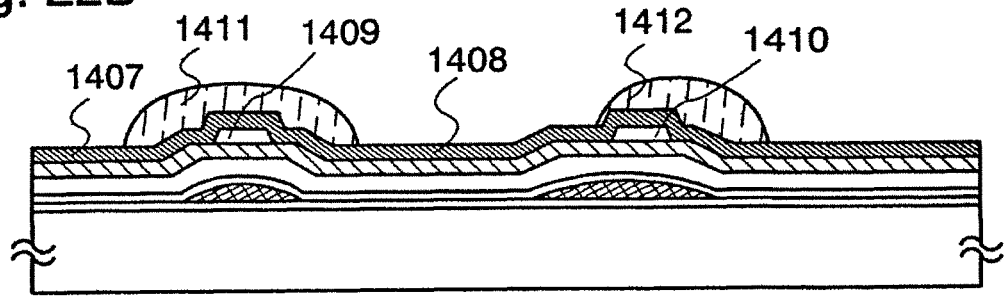

Subsequently, a gate insulating film is formed over the conductive layers 1402 and 1403 (see FIG. 22A). The gate insulating film may be formed of a known material such as an oxide or nitride material of silicon, and may be stacked layers or a single layer.

The semiconductor layer may be formed by a known method (the sputtering method, the LPCVD method, the plasma CVD method, or the like). There is no particular limitation in materials of the semiconductor layer, but the semiconductor layer is preferably formed of silicon, a silicon germanium (SiGe) alloy, or the like.

The semiconductor layer uses an amorphous semiconductor (typically, hydrogenated amorphous silicon), a semi-amorphous semiconductor, a semiconductor of which semiconductor layer partially has a crystal phase, a crystalline semiconductor (typically polysilicon), or an organic semiconductor as a material.

An amorphous semiconductor is used as the semiconductor in this embodiment mode. A semiconductor layer 1407 is formed and an insulating film is formed by, for example, the plasma CVD method and is selectively etched to have a desired shape in a desired region in order to form channel protective films 1409 and 1410. In addition, the channel protective film may be formed using polyimide, polyvinyl alcohol, or the like by the droplet discharging method or the printing method (a method which can form a pattern, such as the screen printing method and the offset printing method). Thereafter, a semiconductor layer having one conductivity, for example, an N-type semiconductor layer 1408 is formed by the plasma CVD method or the like. The semiconductor layer having one conductivity may be formed as required.

Subsequently, mask layers 1411 and 1412 formed of an insulator such as a resist or polyimide are formed. Then, the semiconductor layer 1407 and the N-type semiconductor layer 1408 are simultaneously patterned using the mask layers 1411 and 1412.

Figure 22C:
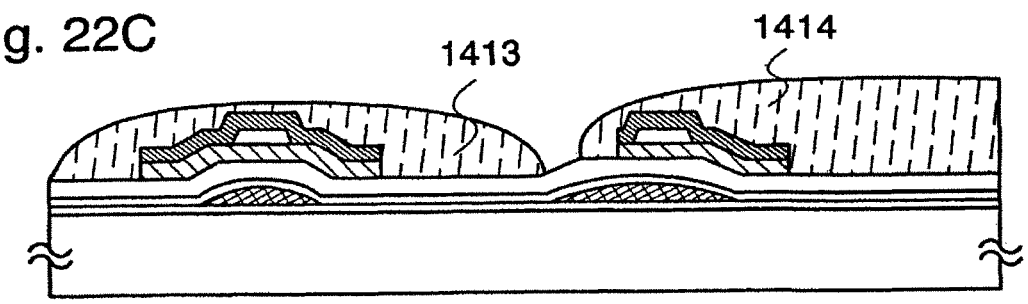

Then, mask layers 1413 and 1414 formed of an insulator such as a resist or polyimide are formed by the droplet discharging method (see FIG. 22C). A through-hole 1418 is formed in a part of the gate insulating layers 1404 and 1405 by an etching process using the mask layers 1413 and 1414, and a part of the conductive layer 1403 which is disposed on a lower layer side thereof and functions as a gate electrode layer is exposed. Either plasma etching (dry etching) or wet etching may be adopted as the etching process. In addition, a local discharge process can be performed when an atmospheric pressure discharge etching process is applied, and a mask layer does not need to be entirely formed over the substrate.

Conductive layers 1415, 1416, and 1417 are formed by discharging a composition containing a conductive material after the mask layers 1413 and 1414 are removed. Then, the N-type semiconductor layer is patterned using the conductive layers 1415, 1416, and 1417 as masks (see FIG. 22D). Note that the aforementioned base pre-base treatment to selectively form a photocatalytic substance or the like in a portion where the conductive layers 1415, 1416, and 1417 are to be in contact with the gate insulating layer 1405 may be performed before forming the conductive layers 1415, 1416, and 1417, although not shown. Accordingly, the conductive layer can be formed with favorable adhesion with the stacked upper and lower layers.

Figure 22D:
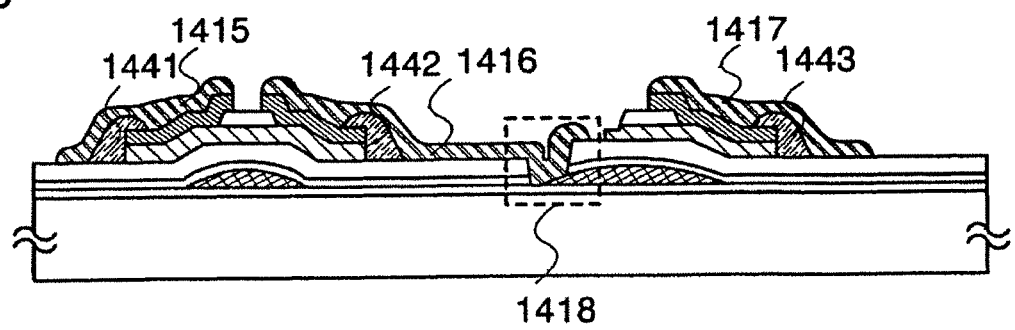

Further, the conductive layers 1415, 1416, and 1417 that are wiring layers are formed to cover the N-type semiconductor layer and the semiconductor layer as shown in FIG. 22D. The semiconductor layer is etched. Therefore, the wiring layer might not be able to cover a steep step and might be disconnected. Therefore, insulating layers 1441, 1442, and 1443 are formed to reduce a step, and the step may be smoothed. The insulating layers 1441, 1442, and 1443 can be selectively formed without a mask or the like when the droplet discharging method is employed. The step can be smoothed by the insulating layers 1441, 1442, and 1443, and the wiring layer to cover the insulating layers can be formed with favorable coverage without a defect such as break. The insulating layers 1441, 1442, and 1443 can be formed of an inorganic insulating material such as silicon oxide, silicon nitride, silicon oxynitride, aluminum oxide, aluminum nitride, or aluminum oxynitride, acrylic acid, methacrylic acid, a derivative of acrylic acid or methacrylic acid, a heat-resistant high molecular weight material such as polyimide, aromatic polyamide, or polybenzimidazole, or inorganic siloxane including a Si—O—Si bond among compounds that contain silicon, oxygen, and hydrogen and that is formed by using a siloxane-based material as a starting material or an organosiloxane-based insulating material in which hydrogen bonded with silicon is substituted by an organic group such as methyl or phenyl.

Figure 23A:
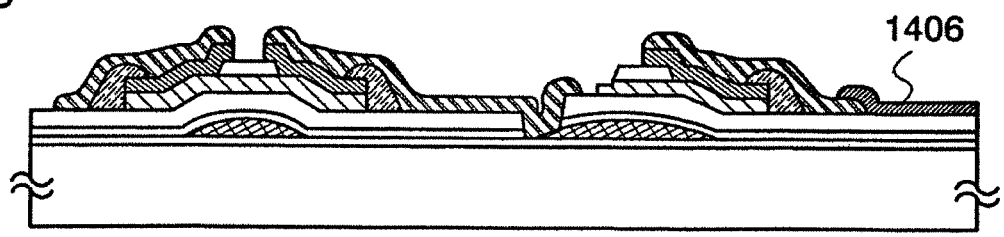
FIGS. 23A and 23B are views showing a manufacturing method of a display device to which the invention can be applied.

Subsequently, a conductive layer (also referred to as a first electrode) 1406 is formed by selectively discharging a composition containing a conductive material onto the gate insulating film to be in contact with the conductive layer 1417 which functions as the source wiring layer or a drain wiring layer (see FIG. 23A). The conductive layer 1406 may be formed by forming a predetermined pattern of a composition containing indium tin oxide (ITO), indium tin oxide containing silicon oxide (ITSO), zinc oxide (ZnO), tin oxide (SnO$_2$), or the like and by baking it when light is emitted from the substrate 1400 side or when a transmissive EL display panel is manufactured. Although not shown, pre-base treatment such as formation of a photocatalytic substance may be performed similarly to the case of forming the conductive layers 1402 and 1403 in a region where the conductive layer 1406 is to be formed. The pre-base treatment can improve adhesiveness and the conductive layer 1406 can be formed into a desired pattern to be a thin line. The conductive layer 1406 becomes the first electrode which functions as a pixel electrode.

In addition, the conductive layer 1416 that is the source wiring layer or the drain wiring layer and the conductive layer 1403 that is the gate electrode layer are electrically connected to each other in the through-hole 1418 formed in the gate insulating layer 1405. A composition containing a particle of a metal such as Ag (silver), Au (gold), Cu (copper), W (tungsten), or Al (aluminum) as its main component can be used as a conductive material for forming the wiring layer. In addition, light-transmissive indium tin oxide (ITO), indium tin oxide containing silicon oxide (ITSO), organic indium, organotin, zinc oxide, titanium nitride, and the like may be used in combination.

The through-hole 1418 may be formed after forming the conductive layers 1415, 1416, 1417, and 1406 using the conductive layers 1415, 1416, 1417, and 1406 as masks to form the through-hole 1418. Then, a conductive layer is formed in the through-hole 1418, and the conductive layer 1416 and the conductive layer 1403 as the gate electrode layer are electrically connected to each other.

Figure 23B:
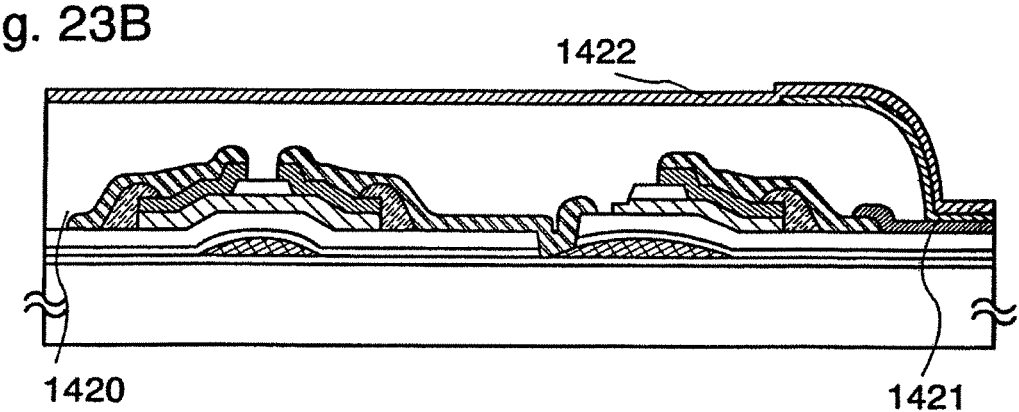

Subsequently, an insulating layer 1420 to be a partition wall is formed. Although not shown, a protective layer formed of silicon nitride or silicon nitride oxide may be entirely formed under the insulating layer 1420 to cover a thin film transistor. An opening is formed in the insulating layer 1420 as shown in FIG. 23B by an etching process after the insulating layer is entirely formed by the spin coating method or the dipping method. The etching process is not necessarily carried out when the insulating layer 1420 is formed by the droplet discharging method. When a wide region such as the insulating layer 1420 is formed by the droplet discharging method, a throughput is improved by forming by discharging a composition from a plurality of discharging openings of nozzles in a droplet discharge apparatus and drawing so that a plurality of lines are overlapped with each other.

The insulating layer 1420 is formed to have a through-hole corresponding to a position where a pixel is to be formed in accordance with the conductive layer 1406 that is the first electrode.

By the aforementioned steps, a TFT substrate is completed in which a bottom gate type (also referred to as an inversely staggered type) channel protective TFT and the conductive layer (the first electrode layer) 1406 are connected over the substrate 1400.

By stacking an electroluminescent layer 1421 and a conductive layer 1422 over the conductive layer 1406 as the first electrode, a display device having a display function using a light emitting element is completed (see FIG. 23B).

As described above, the step can be omitted in this embodiment mode by not applying a light exposure step utilizing a photo mask. In addition, an EL display panel can be easily manufactured by directly forming various patterns over a substrate by the droplet discharging method even when a glass substrate of the fifth or the following generation having a side of more than 1000 mm is used.

Furthermore, a display device of which adhesiveness and peeling resistance are improved and reliability is high can be manufactured.

Embodiment Mode 9

An embodiment mode of the invention is described with reference to FIGS. 24A to 25B. This embodiment mode is different from Embodiment Mode 6 in that a thin film transistor and a first electrode are connected differently. Therefore, description of the same portion or a portion having a similar function is omitted.

A base film 1501 for improving adhesiveness is formed over a substrate 1500 as pre-base treatment. In this embodiment mode, description is made on the case of forming a TiO$_x$ crystal having a predetermined crystalline structure as a photocatalytic substance by the sputtering method. Sputtering is performed by using a metal titanium tube as a target and an argon gas and oxygen. Further, a He gas may be introduced as well. In order to form TiO$_x$ which is highly photocatalytically active, an atmosphere containing a lot of oxygen is used with a rather high pressure. Further, TiO$_x$ is preferably formed while heating a deposition chamber or a substrate over which an object to be treated is formed.

TiO$_x$ formed in this manner has a photocatalytic function even in a thin film form.

It is preferable to form a base film 1501 using a metal material such as Ti (titanium), W (tungsten), Cr (chromium), Ta (tantalumn), Ni (nickel), and Mo (molybdenum), or oxide thereof. The base film 1501 is to be formed with a thickness of 0.01 to 10 nm, and does not necessarily have a layer structure as long as it is formed quite thin. In the case of using a high-melting point material as the base film, it is preferable to treat the base film exposed on the surface by carrying out one of the following two steps after forming the conductive layers 1502 and 1503 to be gate electrode layers.

The first method is a step of insulating the base film 1501 which is not overlapped with the conductive layers 1502 and 1503 and forming an insulating layer. In other words, the base film 1501 which is not overlapped with the conductive layers 1502 and 1503 is oxidized and insulated. When the base film 1501 is oxidized and insulated in this manner, it is preferable to form the base film 1501 to be 0.01 to 10 nm in thickness, thus, the base film can be easily oxidized. Note that oxidization may be performed by exposing to an oxygen atmosphere or by thermal treatment.

The second method is a step of removing the base film 1501 by etching using the conductive layers 1502 and 1503 as masks. When this step is employed, there is no limitation in the thickness of the base film 1501.

Alternatively, a method for performing plasma treatment on a formation region (formation surface) can be employed as another pre-base treatment. The plasma treatment is performed with air, oxygen, or nitrogen used as a treatment gas, with pressure from several ten Torr to 1000 Torr (133000 Pa), preferably, from 100 Torr (13300 Pa) to 1000 Torr (133000 Pa), more preferably, from 700 Torr (93100 Pa) to 800 Torr (106400 Pa), that is, atmospheric pressure or pressure in proximity of atmospheric pressure, and a pulse voltage is applied under such conditions. At this time, plasma density is set from $1 \times 10^{10}$ to $1 \times 10^{14}$ m$^{-3}$, so that so-called corona discharge or glow discharge is achieved. Surface modification can be performed without material dependence by employing plasma treatment using air, oxygen, or nitrogen as a treatment gas. Accordingly, surface modification can be performed on any material.

As another method, an organic material-based substance which functions as an adhesive may be formed to improve adhesion between a pattern formed by the droplet discharging method and a forming region thereof. An organic material (organic resin material) (polyimide or acrylic) is composed of a skeleton formed of the bond of silicon (Si) and oxygen (O), in which an organic group containing at least hydrogen (such as an alkyl group or aromatic hydrocarbon) is included as a substituent. Alternatively, a fluoro group may be used as the substituent. Further alternatively, a fluoro group and an organic group containing at least hydrogen may be used as the substituent.

Subsequently, a composition containing a conductive material is discharged, and conductive layers 1502 and 1503 to function as gate electrode layers later are formed. These conductive layers 1502 and 1503 are formed by the droplet discharging method. In this embodiment mode, silver is used as the conductive material, however, a stack of silver, copper, and the like as well as a single layer of copper may be used.

The step of forming the base film 1501 described above is performed as pre-base treatment for a conductive layer formed by the droplet discharging method, however, this treatment may be performed after forming the conductive layers 1502 and 1503.

Figure 24A:
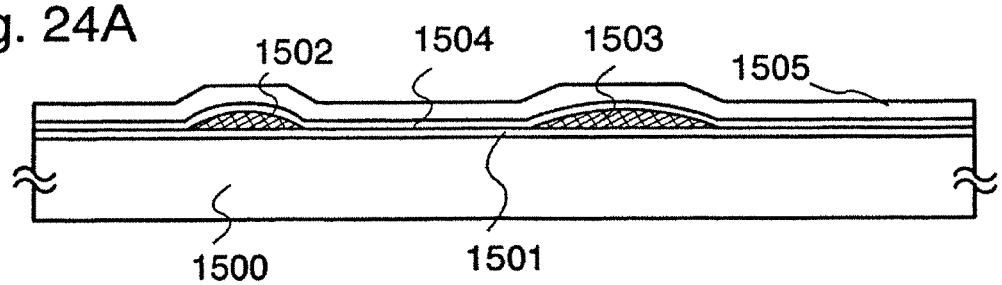
FIGS. 24A to 24D are views showing a manufacturing method of a display device to which the invention can be applied.
Figure 24B:
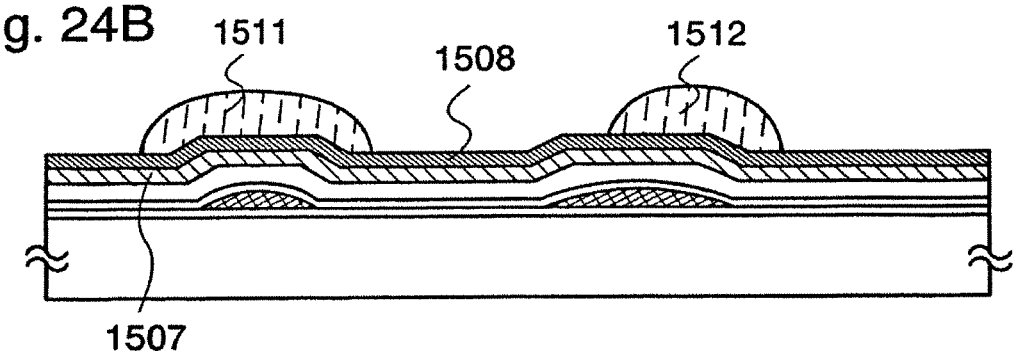

Subsequently, a gate insulating film is formed over the conductive layers 1502 and 1503 (see FIG. 24A). The gate insulating film may be formed of a known material such as an oxide or nitride material of silicon, and may be stacked layers or a single layer.

The semiconductor layer may be formed by a known method (the sputtering method, the LPCVD method, the plasma CVD method, or the like). There is no particular limitation in materials of the semiconductor layer, but the semiconductor layer is preferably formed of silicon, a silicon germanium (SiGe) alloy, or the like.

The semiconductor layer uses an amorphous semiconductor (typically, hydrogenated amorphous silicon), a semi-amorphous semiconductor, a semiconductor of which semi-conductor layer partially has a crystal phase, a crystalline semiconductor (typically polysilicon), or an organic semi-conductor as a material.

In this embodiment mode, an amorphous semiconductor is used as the semiconductor. A semiconductor layer 1507 is formed, and then a semiconductor layer having one conductivity, for example, an N-type semiconductor layer 1508 is formed by the plasma CVD method or the like. The semiconductor layer having one conductivity may be formed as required.

Subsequently, mask layers 1511 and 1512 formed of an insulating material such as a resist or polyimide are formed. Then, the semiconductor layer 1507 and the N-type semiconductor layer 1508 are simultaneously patterned using the mask layers 1511 and 1512 (see FIG. 24B).

Figure 24C:
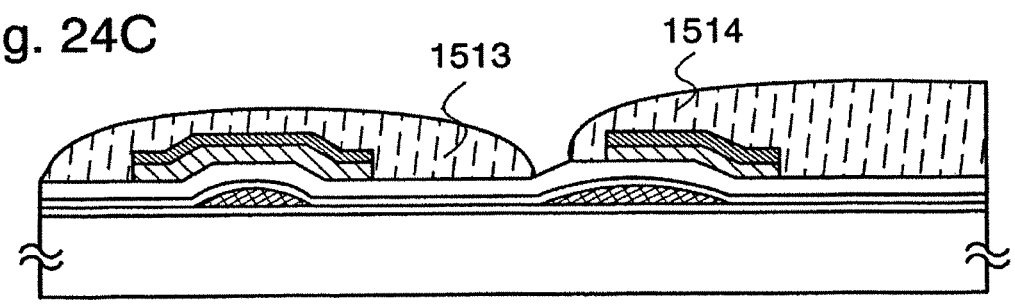
Figure 24D:
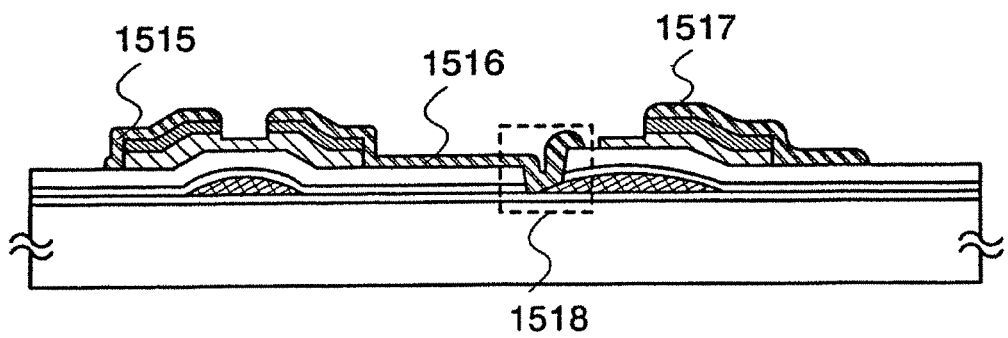

Then, mask layers 1513 and 1514 formed of an insulator such as a resist or polyimide are formed by using the droplet discharging method (see FIG. 24C). A through-hole 1518 is formed in a part of the gate insulating layers 1504 and 1505 by an etching process using the mask layers 1513 and 1514, and a part of the conductive layer 1503 disposed on a lower layer side thereof and to function as a gate electrode layer is exposed. Either plasma etching (dry etching) or wet etching may be adopted as the etching process. In addition, a local discharge process can be performed when an atmospheric pressure discharge etching process is applied, and a mask layer does not need to be entirely formed over the substrate.

Conductive layers 1515, 1516, and 1517 are formed by discharging a composition containing a conductive material after the mask layers 1513 and 1514 are removed. Then, the N-type semiconductor layer is patterned using the conductive layers 1515, 1516, and 1517 as masks to form an N-type semiconductor layer (see FIG. 24D). Note that the aforementioned pre-base treatment to selectively form a photocatalytic substance or the like in a portion where the conductive layers 1515, 1516, and 1517 are to be in contact with the gate insulating layer 1505 may be performed before forming the conductive layers 1515, 1516, and 1517, although not shown. Accordingly, the conductive layer can be formed with favorable adhesion with the stacked upper and lower layers.

Figure 25A:
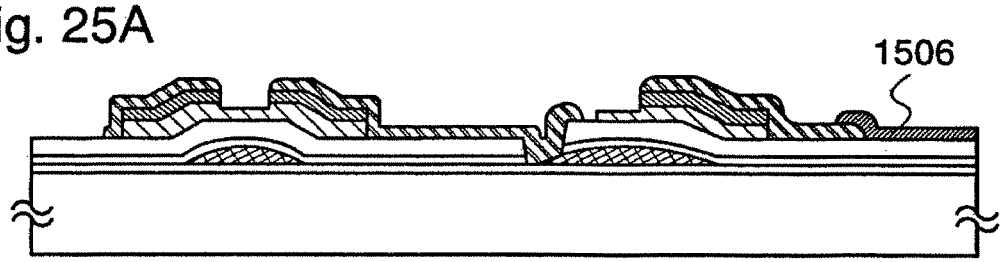
FIGS. 25A and 25B are views showing a manufacturing method of a display device to which the invention can be applied.

Subsequently, a conductive layer (also referred to as a first electrode) 1506 is formed by selectively discharging a composition containing a conductive material onto the gate insulating film to be in contact with the conductive layer 1517 which functions as the source wiring layer or the drain wiring layer (see FIG. 25A). The conductive layer 1506 may be formed by forming a predetermined pattern of a composition containing indium tin oxide (ITO), indium tin oxide containing silicon oxide (ITSO), zinc oxide (ZnO), tin oxide (SnO$_2$), or the like and by baking it when light is to be emitted from the substrate 1500 side or when a light transmissive EL display panel is to be manufactured. Although not shown, pre-base treatment such as formation of a photocatalytic substance may be performed similarly to the case of forming the conductive layers 1502 and 1503 in a region where the conductive layer 1506 is to be formed. The pre-base treatment can improve adhesiveness and the conductive layer 1506 can be formed into a desired pattern to be a thin line. The conductive layer 1506 becomes the first electrode which functions as a pixel electrode.

In addition, the conductive layer 1516 that is the source wiring layer or drain wiring layer and the conductive layer 1503 that is the gate electrode layer are electrically connected to each other in the through-hole 1518 formed in the gate insulating layer 1505. A composition containing a particle of a metal such as Ag (silver), Au (gold), Cu (copper), W (tungsten), or Al (aluminum) as its main component can be used as a conductive material for forming the conductive layer. In addition, light-transmissive indium tin oxide (ITO), indium tin oxide containing silicon oxide (ITSO), organic indium, organotin, zinc oxide, titanium nitride, and the like may be used in combination.

The step of forming the through-hole 1518 may be performed using the conductive layers 1515, 1516, 1517, and 1506 as masks after forming the conductive layers 1515, 1516, 1517, and 1506. Then, a conductive layer is formed in the through-hole 1518, and the conductive layer 1516 and the conductive layer 1503 as the gate electrode layer are electrically connected to each other.

Figure 25B:
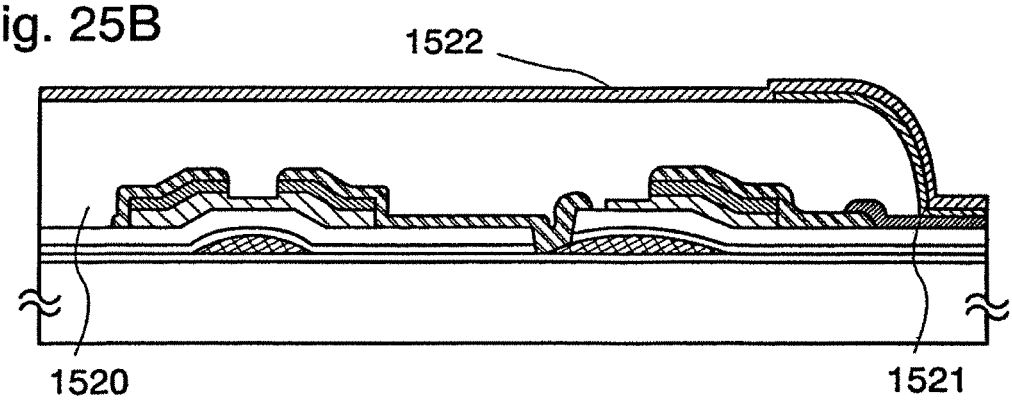

Subsequently, an insulating layer 1520 to be a partition wall is formed. Although not shown, a protective layer formed of silicon nitride or silicon nitride oxide may be entirely formed under the insulating layer 1520 to cover a thin film transistor. An opening is formed in the insulating layer 1520 as shown in FIG. 25B by an etching process after the insulating layer is entirely formed by the spin coating method or the dipping method. The etching process is not necessarily required when the insulating layer 1520 is formed by the droplet discharging method. When the a wide region such as the insulating layer 1520 is formed by the droplet discharging method, a throughput is improved by forming by discharging a composition from a plurality of discharging openings of nozzles in a droplet discharge apparatus and drawing so that a plurality of lines are overlapped with each other.

The insulating layer 1520 is formed to have a through-hole corresponding to a position where a pixel is to be formed in accordance with the conductive layer 1506 as the first electrode.

By the aforementioned steps, a TFT substrate is completed in which a bottom gate type (also referred to as an inversely staggered type) TFT and the conductive layer (the first electrode layer) 1506 are connected over the substrate 1500.

By stacking an electroluminescent layer 1521 and a conductive layer 1522 over the conductive layer 1506 as the first electrode, a display device having a display function using a light emitting element is completed (see FIG. 25B).

As described above, the step can be omitted in this embodiment mode by not applying a light exposure step utilizing a photo mask. In addition, an EL display panel can be easily manufactured by directly forming various patterns over a substrate by the droplet discharging method even when a glass substrate of the fifth or the following generation having a side of more than 1000 mm is used.

Furthermore, a display device of which adhesiveness and peeling resistance are improved and reliability is high can be manufactured.

Embodiment Mode 10

An embodiment mode of the invention is described with reference to FIGS. 26A to 27. This embodiment mode is different from Embodiment Mode 7 in that a thin film transistor and a first electrode are connected differently. Therefore, description of the same portion or a portion having a similar function is omitted.

Figure 26A:
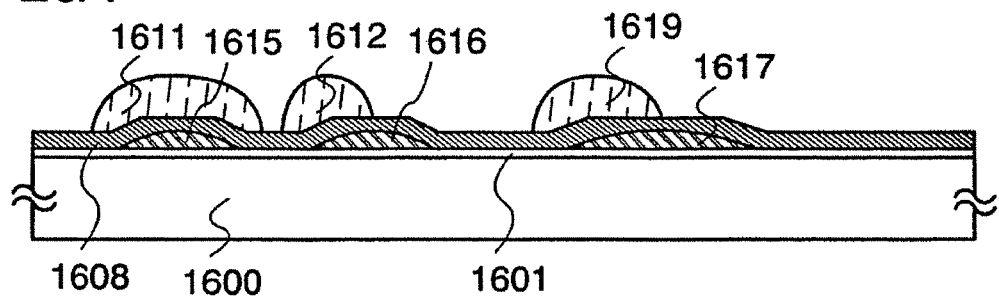
FIGS. 26A to 26D are views showing a manufacturing method of a display device to which the invention can be applied.

A base film 1601 having a function to improve adhesiveness is formed over a substrate 1600 (see FIG. 26A). An insulating layer may be formed over the substrate 1600. This insulating layer is not necessarily provided, but has an effect to block a contaminant and the like from the substrate 1600. In the case of using a staggered thin film transistor as in this embodiment mode, the base layer is effective since a semiconductor layer is in direct contact with the substrate. In the case of forming the base layer for preventing contamination from a glass substrate, the base film 1601 is formed as pretreatment in forming regions of the conductive layers 1615, 1616, and 1617 by the droplet discharging method.

In this embodiment mode, a substance having a photocatalytic function is used as the base film 1601 having a function to improve adhesiveness.

In this embodiment mode, description is made on the case of forming a $TiO_x$ crystal having a predetermined crystalline structure as a photocatalytic substance by the sputtering method. Sputtering is performed by using a metal titanium tube as a target and an argon gas and oxygen. Further, a He gas may be introduced as well. In order to form $TiO_x$ which is highly photocatalytically active, an atmosphere containing a lot of oxygen is used with a rather high pressure. Further, $TiO_x$ is preferably formed while heating a deposition chamber or a substrate over which an element is formed.

$TiO_x$ formed in this manner has a photocatalytic function even in a thin film form.

It is preferable to form a base film 1601 formed of a metal material such as Ti (titanium), W (tungsten), Cr (chromium), Ta (tantalumn), Ni (nickel), and Mo (molybdenum), or oxide thereof. The base film 1601 is to be formed with a thickness of 0.01 to 10 nm, and does not necessarily have a layer structure as long as it is formed quite thin. In the case of using a high-melting point material as the base film, it is preferable to treat the base film exposed on the surface by carrying out one of the following two steps after forming the conductive layers 1615, 1616, and 1617 to be source wiring layers or drain wiring layers.

The first method is a step of insulating the base film 1601 which is not overlapped with the conductive layers 1615, 1616, and 1617 to be a source wiring layer or a drain wiring layer and forming an insulating layer. In other words, the base film 1601 which is not overlapped with the conductive layers 1615, 1616, and 1617 to be a source wiring layer or a drain wiring layer is oxidized and insulated. When the base film 1601 is oxidized and insulated in this manner, it is preferable to form the base film 1601 to be 0.01 to 10 nm in thickness, thus, the base film can be easily oxidized. Note that oxidization may be performed by exposing to an oxygen atmosphere or by thermal treatment.

The second method is a step of removing the base film 1601 by etching using the conductive layers 1615, 1616, and 1617 to be source wiring layers or drain wiring layers as masks. When this step is employed, there is no limitation in the thickness of the base film 1601.

Alternatively, a method for performing plasma treatment on a formation region (formation surface) can be employed as another pre-base treatment. The plasma treatment is performed with air, oxygen, or nitrogen used as a treatment gas, with pressure from several ten Torr to 1000 Torr (133000 Pa), preferably, from 100 Torr (13300 Pa) to 1000 Torr (133000 Pa), more preferably, from 700 Torr (93100 Pa) to 800 Torr (106400 Pa), that is, atmospheric pressure or pressure in proximity of atmospheric 80 pressure, and a pulse voltage is applied under such conditions. At this time, plasma density is set at $1\times10^{10}$ to $1\times10^{14}$ m$^{-3}$, so that so-called corona discharge or glow discharge is achieved. Surface modification can be performed without material dependence by employing plasma treatment using air, oxygen, or nitrogen as a treatment gas. Accordingly, surface modification can be performed on any material.

As another method, a substance of an organic material functioning as an adhesive may be formed to improve adhesion between a pattern to be formed by the droplet discharging method and a formation region thereof. An organic material (organic resin material) (polyimide or acrylic) or a material in which a skeletal structure is configured by the bond of silicon (Si) and oxygen (O) and which contains at least hydrogen as a substituent or which contains at least one of fluorine, an alkyl group, and aromatic hydrocarbon as a substituent may be used.

Subsequently, a composition containing a conductive material is discharged, and the conductive layers 1615, 1616, and 1617 to be source wiring layers or drain wiring layers are formed. These conductive layers 1615, 1616, and 1617 are formed by the droplet discharging method.

As the conductive material used for forming the conductive layers 1615, 1616, and 1617, a composition containing as a main component a particle of a metal such as Ag (silver), Au (gold), Cu (copper), W (tungsten), and Al (aluminum) can be used. In particular, a source wiring layer or a drain wiring layer which are preferably low in resistance are preferably formed by using any one of gold, silver, and copper dissolved or dispersed in a solvent in consideration of resistivity. More preferably, silver and copper which are low resistant are used. Further, a particle having a plurality of layers formed by coating the periphery of the conductive material with another conductive material may be used. For example, a particle having a three-layer structure in which the periphery of copper is coated with nickel boron (NiB) and then silver thereover, and the like may be used. As for such solvents, esters such as butyl acetate, alcohols such as isopropyl alcohol, organic solvents such as acetone, or the like may be used. The surface tension and viscosity are appropriately controlled by controlling the concentration of the solvent and adding a surfactant and the like.

The step of forming the base film 1601 described above is performed as pre-base treatment for a conductive layer formed by the droplet discharging method, however, this treatment may be performed after forming the conductive layers 1615, 1616, and 1617. For example, by forming a titanium oxide film and an N-type semiconductor layer thereover though not shown, adhesion between the conductive layer and the N-type semiconductor layer is improved.

After forming the N-type semiconductor layer over the whole surface of the conductive layers 1615, 1616, and 1617, the N-type semiconductor layer provided between the conductive layers 1615 and 1616 and between the conductive layers 1616 and 1617 is removed by etching using mask layers 1611, 1612, and 1619 formed of an insulator such as resist and polyimide. A semiconductor layer having one conductivity may be formed as required. Then, a semiconductor layer 1607 formed of an AS or an SAS is formed by a vapor phase method or the sputtering method. In the case of employing the plasma CVD method, the AS is formed by using SiH$_4$ as a semiconductor material gas or a mixed gas of SiH$_4$ and H$_2$. The SAS is formed of a mixed gas in which SiH$_4$ is diluted with H$_2$ by 3 to 1000 times. When the SAS is formed from the above kind of gas, the semiconductor layer has favorable crystallinity on a surface side thereof. The SAS is suitable for a top gate type TFT in which the gate electrode is formed in an upper layer of the semiconductor layer.

Figure 26B:
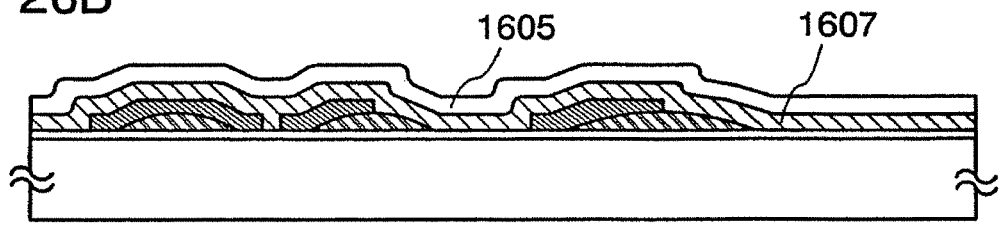

Subsequently, a gate insulating layer 1605 is formed with a single layer or a stacked-layer structure by the plasma CVD method or the sputtering method (see FIG. 26B). A stack of three layers of an insulating layer formed of silicon nitride, an insulating layer formed of silicon oxide, and an insulating layer formed of silicon nitride is particularly a preferable structure.

Figure 26C:
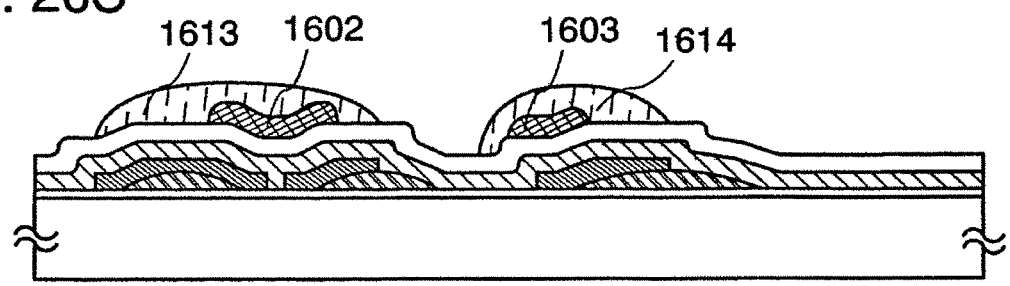
Figure 26D:
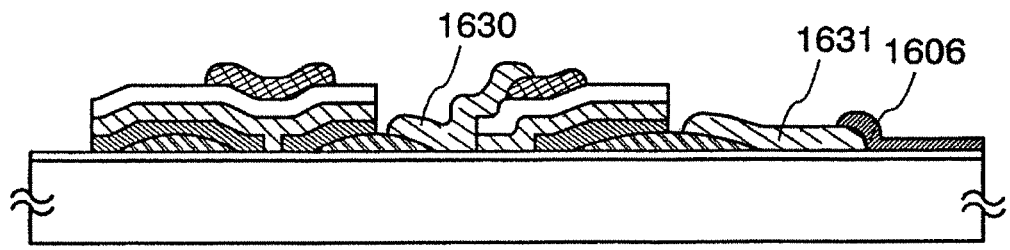

Next, conductive layers 1602 and 1603 as the gate electrode layers are formed by the droplet discharging method (see FIG. 26C). A composition containing a particle of a metal such as Ag (silver), Au (gold), Cu (copper), W (tungsten), or Al (aluminum), as its main component can be used as a conductive material for forming the gate electrode layers 1602 and 1603.

The semiconductor layer 1607 and the gate insulating layer 1605 are formed in a position corresponding to the source wiring layers and the drain wiring layers (the conductive layers 1615, 1616, and 1617) using the mask layers 1613 and 1614 formed by the droplet discharging method. In other words, the semiconductor layer and the gate insulating layer are formed to straddle over the conductive layers 1615 and 1616.

Subsequently, conductive layers 1630 and 1631 are formed by the droplet discharging method and electrically connected to the conductive layer 1616 and the conductive layer 1603.

Subsequently, a conductive layer (also referred to as a first electrode) 1606 is formed by selectively discharging a composition containing a conductive material so as to contact the conductive layer 1631. Alternatively, the conductive layer 1606 may have a structure to have direct contact with the conductive layer 1617. The conductive layer 1606 may be formed in a predetermined pattern of a composition containing indium tin oxide (ITO), indium tin oxide containing silicon oxide (ITSO), zinc oxide (ZnO), tin oxide (SnO$_2$), or the like and by baking it when light is emitted from the substrate 1600 side or when a light-transmissive EL display panel is manufactured. Although not shown, a photocatalytic substance may be formed in a region where the conductive layer 1606 is formed similarly to the case of forming the conductive layers 1615, 1616, and 1617. With a photocatalytic substance, adhesiveness is improved and the conductive layer 1606 can be formed into a thin desired pattern to be a thin line. This conductive layer 1606 becomes a first electrode which functions as a pixel electrode.

The source wiring layer or drain wiring layer and the gate electrode layer may be directly connected through the gate electrode layer without using the conductive layer 1630. In that case, a through-hole is formed in the gate insulating layer 1605 and a part of the conductive layers 1616 and 1617 that are the source or drain wirings is exposed before the conductive gate electrode layers 1602 and 1603 are formed. After that, the conductive gate electrode layers 1602, 1603 and the conductive layer 1631 are formed by the droplet discharging method. At this time, the conductive layer 1603 is a wiring which also serves as the conductive layer 1630, and is connected to the conductive layer 1616. Either dry etching or wet etching may be employed for etching, however, plasma etching which is dry etching is more preferable.

Subsequently, an insulating layer 1620 to be a partition wall is formed. Although not shown, a protective layer formed of silicon nitride or silicon nitride oxide may be entirely formed under the insulating layer 1620 to cover a thin film transistor. An opening is formed in the insulating layer 1620 as shown in FIG. 27 by an etching process after the insulating layer is entirely formed by the spin coating method or the dipping method. The etching process is not necessarily carried out when the insulating layer 1620 is formed by the droplet discharging method. When a wide region such as the insulating layer 1620 is formed by the droplet discharging method, a throughput is improved by forming by discharging a composition from a plurality of discharging openings of nozzles in a droplet discharge apparatus and drawing so that a plurality of lines are overlapped with each other.

The insulating layer 1620 is formed to have a through-hole corresponding to a position where a pixel is to be formed in accordance with the conductive layer 1606 as the first electrode.

By the aforementioned steps, a TFT substrate is completed in which a top gate type (also referred to as a staggered type) TFT and the conductive layer 1606 are connected over the substrate 1600.

Moisture adsorbed in the insulating layer 1620 or to a surface thereof is removed by performing thermal treatment at 200° C. under atmospheric pressure before forming an electroluminescent layer 1621. In addition, thermal treatment is performed at a temperature of 200 to 400° C., preferably, 250 to 350° C. under reduced pressure, and the electroluminescent layer 1621 is preferably formed by a vacuum vapor deposition method or the droplet discharging method under reduced pressure without being exposed to an atmospheric air.

Figure 27:
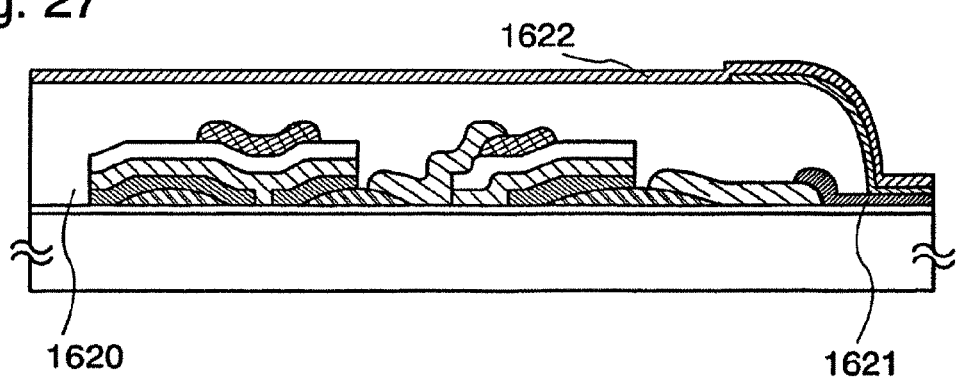
FIG. 27 is a view showing a manufacturing method of a display device to which the invention can be applied.

By stacking an electroluminescent layer 1621 and a conductive layer 1622 over the conductive layer 1606 as the first electrode, a display device having a display function using a light emitting element is completed (see FIG. 27).

As described above, a step can be omitted in this embodiment mode by not applying a light exposure step utilizing a photo mask. In addition, an EL display panel can be easily manufactured by directly forming various patterns over a substrate by the droplet discharging method even when a glass substrate of the fifth or the following generation having a side of more than 1000 mm is used.

Furthermore, a display device of which adhesiveness and peeling resistance are improved and reliability is high can be manufactured.

Embodiment Mode 11

An embodiment mode of the invention is described with reference to FIGS. 28A to 29B. This embodiment mode is different from Embodiment Mode 1 in that the conductive layer 816 as the wiring layer which passes through the gate electrode layer 805 and the conductive layer 803 as the gate electrode layer are connected differently. Therefore, description on the same portion or a portion having a similar function is omitted.

Figure 28A:
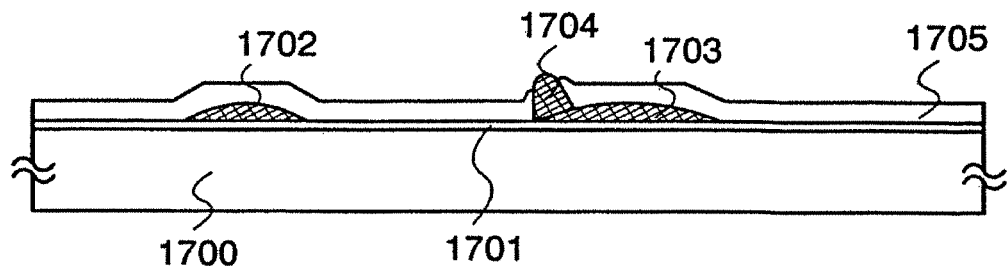
FIGS. 28A to 28D are views showing a manufacturing method of a display device to which the invention can be applied.

A base film 1701 to improve adhesiveness is formed over a substrate 1700 (see FIG. 28A). It is to be noted that an insulating layer may be formed over the substrate 1700.

In this embodiment mode, a substance having a photocatalytic function is used as the base film 1701 having a function to improve adhesiveness.

The case of forming $TiO_x$ crystal having a predetermined crystalline structure by the sputtering method as a photocatalytic substance is described in this embodiment mode. Sputtering is performed using a metal titanium tube as a target and using an argon gas and oxygen. Further, a He gas may be introduced. The atmosphere includes much oxygen and formation pressure is set high to form $TiO_x$ having high photocatalytic activity. It is preferable to form $TiO_x$ while heating a deposition chamber or a substrate provided with an object to be treated.

The thus formed $TiO_x$ has a photocatalytic function even in a quite thin film form.

It is preferable to form a base film 1701 using a metal material such as Ti (titanium), W (tungsten), Cr (chromium), Ta (tantalumn), Ni (nickel), and Mo (molybdenum), or oxide thereof by the sputtering method, the vapor deposition method and the like as pre-base treatment. The base film is to be formed with a thickness of 0.01 to 10 nm, and does not necessarily have a layer structure as long as it is formed quite thin. In the case of using a high-melting point material as the base film, it is preferable to treat the base film exposed on the surface by carrying out one of the following two steps after forming the conductive layers 1702 and 1703 to be gate electrode layers.

The first method is a step of insulating the base film 1701 which is not overlapped with the conductive layers 1702 and 1703 and forming an insulating layer. In other words, the base film 1701 which is not overlapped with the conductive layers 1702 and 1703 is oxidized and insulated. When the base film 1701 is oxidized and insulated in this manner, it is preferable to form the base film 1701 to be 0.01 to 10 nm in thickness, thus, the base film can be easily oxidized. Note that oxidization may be performed by exposing to an oxygen atmosphere or by thermal treatment.

The second method is a step of removing the base film 1701 by etching using the conductive layers 1702 and 1703 as masks. When this step is employed, there is no limitation in the thickness of the base film 1701.

Alternatively, a method for performing plasma treatment on a formation region (formation face) can be employed as another pre-base treatment. The plasma treatment is performed with air, oxygen, or nitrogen used as a treatment gas, with pressure from several ten Torr to 1000 Torr (133000 Pa), preferably, from 100 Torr (13300 Pa) to 1000 Torr (133000 Pa), more preferably, from 700 Torr (93100 Pa) to 800 Torr (106400 Pa), that is, atmospheric pressure or pressure in proximity of atmospheric pressure, and a pulse voltage is applied under such conditions. At this time, plasma density is set at $1 \times 10^{10}$ to $1 \times 10^{14}$ $m^{-3}$, so that so-called corona discharge or glow discharge is achieved. Surface modification can be performed without material dependence by employing plasma treatment using air, oxygen, or nitrogen as a treatment gas. Accordingly, surface modification can be performed on any material.

As another method, a substance of an organic material functioning as an adhesive may be formed to improve adhesion between a pattern to be formed by the droplet discharging method and a formation region thereof. An organic material (organic resin material) (polyimide or acrylic) or a material in which a skeletal structure is configured by the bond of silicon (Si) and oxygen (O) and which contains at least hydrogen as a substituent or which contains at least one of fluorine, an alkyl group, and aromatic hydrocarbon as a substituent may be used.

Subsequently, a composition containing a conductive material is discharged, and the conductive layers 1702 and 1703 to be source wiring layers or drain wiring layers are formed. These conductive layers 1702 and 1703 are formed by the droplet discharging method.

A conductor 1704 which functions as a pillar is formed by locally discharging a composition containing a conductive material after the conductive layer 1703 is formed. The conductor 1740 is preferably formed to be cylindrical by depositing the discharged composition so that a pattern in a lower layer and a pattern in an upper layer easily make contact with each other when the cylindrical conductor 1740 is used. The conductor 1704 may be formed of the same material as that of the conductive layer 1703 or be formed of a different material. It may be formed by discharging the composition to be stacked.

After the conductive layer 1703 is formed, the aforementioned pre-base treatment may be performed on the conductive layer 1703 to improve the adhesiveness again. Further, it is preferable to perform pre-base treatment similarly, after the conductor 1704 to be a pillar is formed. Layers can have favorable adhesion when pre-base treatment such as forming a photocatalytic substance such as $TiO_x$ is performed.

Subsequently, a gate insulating film is formed over the conductive layers 1702 and 1703 (see FIG. 28A).

Figure 28B:
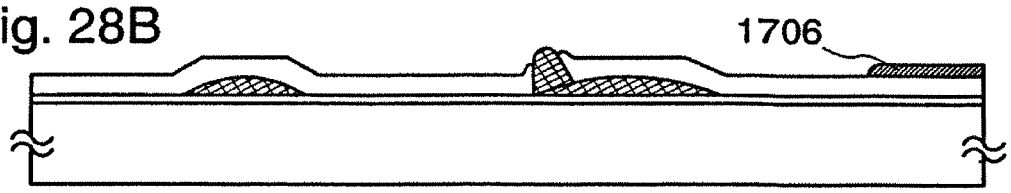
Figure 28C:
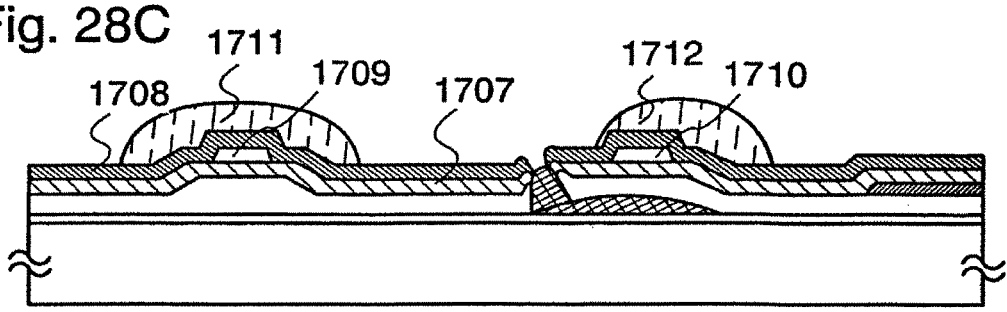
Figure 28D:
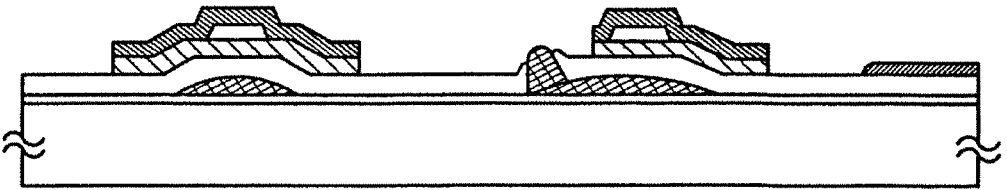

Then, a conductive layer (also referred to as a first electrode) 1706 is formed by selectively discharging a composition containing a conductive material onto the gate insulating film (see FIG. 28B). Although not shown, a photocatalytic substance may be formed similarly to the case of forming the conductive layers 1702 and 1703 in a region where the conductive layer 1706 is formed. The photocatalytic substance can improve adhesiveness and the conductive layer 1706 can be formed into a desired pattern to be a thin line. The conductive layer 1706 becomes the first electrode to function as a pixel electrode.

An amorphous semiconductor is used as the semiconductor in this embodiment mode. A semiconductor layer 1707 that is an amorphous semiconductor layer is formed, and an insulating film is formed by, for example, the plasma CVD method and is selectively etched to have a desired shape in a desired region in order to form channel protective films 1709 and 1710. At this time, the channel protective films 1709 and 1710 can be formed by exposing a back of the substrate to light using the gate electrode as a mask. In addition, polyimide, polyvinyl alcohol, or the like may be dropped as the channel protective film by the droplet discharging method. Consequently, an exposure step can be omitted. Thereafter, a semiconductor layer having one conductivity, for example, an N-type semiconductor layer 1708 using an N-type amorphous semiconductor layer is formed by the plasma CVD method or the like (see FIG. 28C). The semiconductor layer having one conductivity may be formed as required.

Subsequently, mask layers 1711 and 1712 formed of an insulator such as a resist or polyimide are formed, and the semiconductor layer 1707 and the N-type semiconductor layer 1708 are simultaneously patterned using the mask layers 1711 and 1712.

In this embodiment mode, a conductor to be connected to the conductive layer 1703 which is a gate electrode layer by the conductor 1704 which functions as a pillar passes through the gate electrode layer 1705 and exists on the gate insulating layer 1705. Therefore, a step of opening a through-hole in the gate insulating layer can be omitted.

Conductive layers 1715, 1716, and 1717 are formed by discharging a composition containing a conductive material. Then, the N-type semiconductor layer is patterned using the conductive layers 1715, 1716, and 1717 as masks. Note that a photocatalytic substance may be selectively formed in a portion where the conductive layers 1715, 1716, and 1717 are in contact with the gate insulating layer 1705 before forming the conductive layers 1715, 1716, and 1717, although not shown. Accordingly, the conductive layer can be formed with favorable adhesion.

The conductive layer 1717 functions as a source wiring layer or a drain wiring layer and is formed to be electrically connected to the first electrode formed beforehand. The conductive layer 1716 which is a source wiring layer or a drain wiring layer can be electrically connected to the conductive layer 1703 which is the gate electrode layer through the conductor 1704 (see FIG. 29A). When the insulating layer or the like is left over the conductor 1704 which functions as a pillar, it may be removed by etching or the like.

Subsequently, an insulating layer 1720 to be a partition wall is formed.

The insulating layer 1720 is formed to have a through-hole corresponding to a position where a pixel is to be formed in accordance with the conductive layer 1706 that is the first electrode.

By the above-mentioned steps, a TFT substrate for the EL display panel in which a bottom gate type (also referred to as an inversely staggered type) channel protective TFT and the first electrode (first electrode layer) are connected over the substrate 1700 is completed.

Figure 29A:
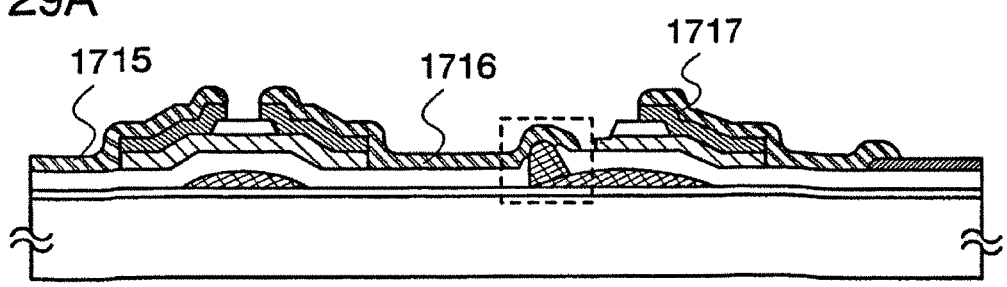
FIGS. 29A and 29B are views showing a manufacturing method of a display device to which the invention can be applied.
Figure 29B:
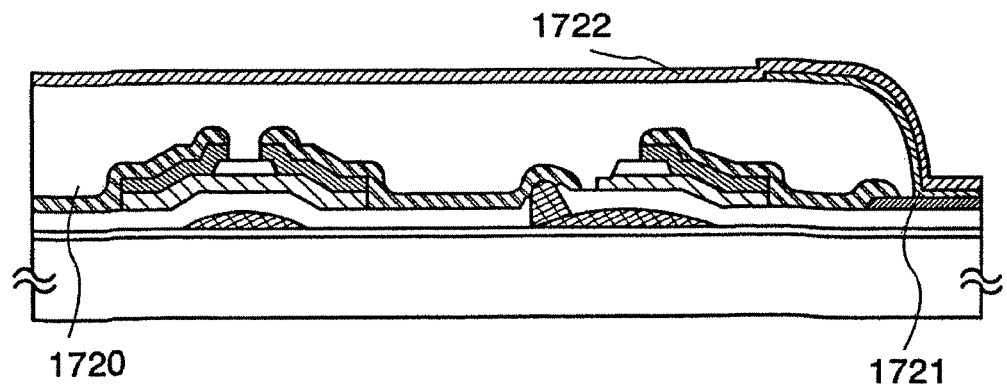

An electroluminescent layer 1721 and a conductive layer 1722 are stacked over the conductive layer 1706 that is the first electrode, and then, a display device having a display function using a light emitting element is completed (see FIG. 29B).

As described above, the step can be omitted in this embodiment mode by not applying a light exposure step utilizing a photo mask. In addition, an EL display panel can be easily manufactured by directly forming various patterns over a substrate by the droplet discharging method even when a glass substrate of the fifth or the following generation having a side of more than 1000 mm is used.

In addition, a highly reliable display device of which adhesiveness and peel resistance are improved can be manufactured. A connecting method of using a pillar for a through-hole in this embodiment mode can be implemented freely in combination with the above embodiment modes.

Embodiment Mode 12

A thin film transistor can be formed by applying the invention, and a display device can be formed by using the thin film transistor. In the case of using a light emitting element as a display element and using an N-type transistor as a transistor for driving the light emitting element, light emitted from the light emitting element is any one of the bottom emission, top emission, and dual emission. Here, a stacked structure of a light emitting element for any case is described with reference to FIGS. 30A to 30C.

A transistor 1851 that is a channel protective thin film transistor formed in Embodiment Mode 1 by applying the invention is used in this embodiment.

First, the case where light is emitted to a substrate 1850 side, that is, the case of bottom emission is described with reference to FIG. 30A. In this case, a source wiring or a drain wiring 1852 and 1853, a first electrode 1854, an electroluminescent layer 1855, and a second electrode 1856 are sequentially stacked so as to be electrically connected to a transistor 1851. Next, the case where light is emitted to an opposite side of the substrate 1850, that is, the case of top emission is described with reference to FIG. 30B. A source wiring or a drain wiring 1861 and 1862, a first electrode 1863, an electroluminescent layer 1864, and a second electrode 1865 are sequentially stacked, so as to be electrically connected to the transistor 1851. Even if the first electrode 1863 transmits light, the light is reflected by the wiring 1862 and emitted to the opposite side to the substrate 1850 in the above structure. Note that a light-transmissive material is not required to be used for the first electrode 1863 in this structure. Lastly, the case where light is emitted to the substrate 1850 side and to the opposite side thereto, that is, the case of dual emission is described with reference to FIG. 30C. A source wiring or a drain wiring 1870 and 1871, a first electrode 1872, an electroluminescent layer 1873, and a second electrode 1874 are sequentially stacked so as to be electrically connected to the transistor 1851. At this time, dual emission is realized when both the first electrode 1872 and the second electrode 1874 are formed of a light-transmissive material or formed thin enough to transmit light.

The light emitting element has a structure in which the electroluminescent layer is sandwiched between the first electrode and the second electrode. It is necessary to select materials of the first electrode and the second electrode in consideration of a work function. Both the first electrode and the second electrode can be an anode or a cathode depending on a pixel structure. Since polarity of a driving TFT is an N-channel type in this embodiment mode, the first electrode is preferably a cathode and the second electrode is preferably an anode. When polarity of the driving TFT is a P-channel type, the first electrode is preferably an anode and the second electrode is preferably a cathode.

When the first electrode is an anode, the electroluminescent layer is preferably formed by sequentially stacking an HIL (hole injecting layer), an HTL (hole transporting layer), an EML (light emitting layer), an ETL (electron transporting layer), and an EIL (electron injecting layer) from an anode side. When the first electrode is a cathode, a structure of the electroluminescent layer becomes the reverse. It is preferable to sequentially stack an EIL (electron injecting layer), an ETL (electron transporting layer), an EML (light emitting layer), an HTL (hole transporting layer), an HIL (hole injecting layer), and an anode that is the second electrode from a cathode side. Note that the electroluminescent layer can have a single-layer structure or a combined structure as well as a stacked-layer structure.

Materials showing luminescence of red (R), green (G), and blue (B) may be selectively formed as the electroluminescent layer by the vapor deposition method using respective vapor deposition masks or the like. The materials showing luminescence of red (R), green (G), and blue (B) (such as a low molecular weight or high molecular weight material) can be formed by the droplet discharging method, which is preferable since coloring of RGB can be separately performed in this case without using a mask similarly to a color filter.

In specific, CuPc or PEDOT is used as the HIL, α-NPD is used as the HTL, BCP or Alq$_3$ is used, as the ETL, BCP:Li or CaF$_2$ is used, as the EIL, respectively. In addition, Alq$_3$ doped with a dopant corresponding to respective luminescence colors of R, G, and B (DCM or the like in the case of R, and DMQD or the like in the case of G) may be used as the EML, for example.

Note that the electroluminescent layer is not limited to the above material. For example, a hole injecting property can be enhanced by co-evaporating oxide such as molybdenum oxide (MoO$_x$: x=2 to 3) and α-NPD or rubrene instead of using CuPc or PEDOT. An organic material (including a low molecular weight material or a high molecular weight material) or a composite material of an organic material and an inorganic material can be used as the material of the electroluminescent layer.

Figure 30A:
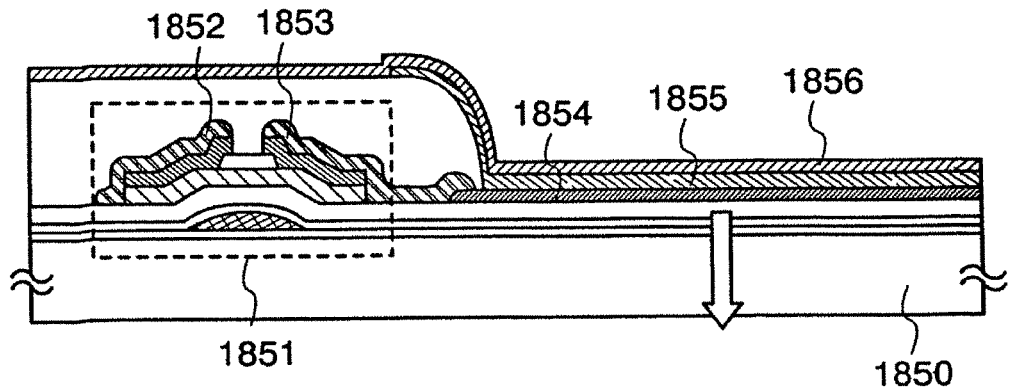
FIGS. 30A to 30C are views showing a display device to which the invention can be applied.
Figure 30B:
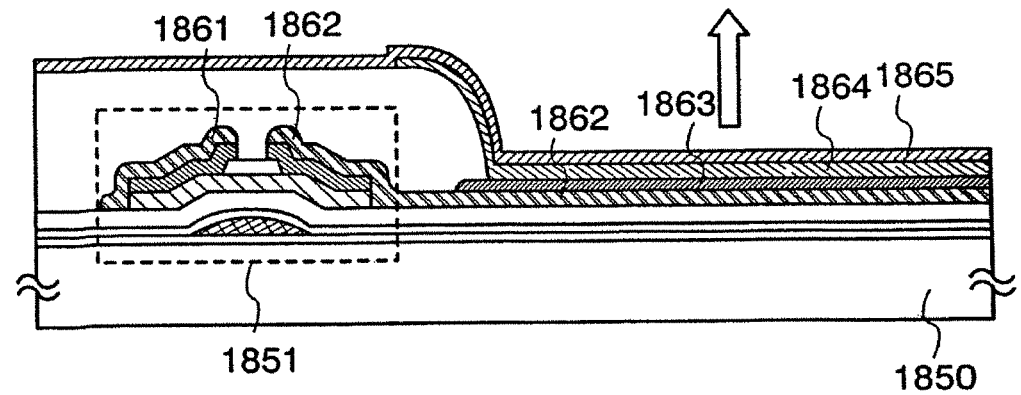
Figure 30C:
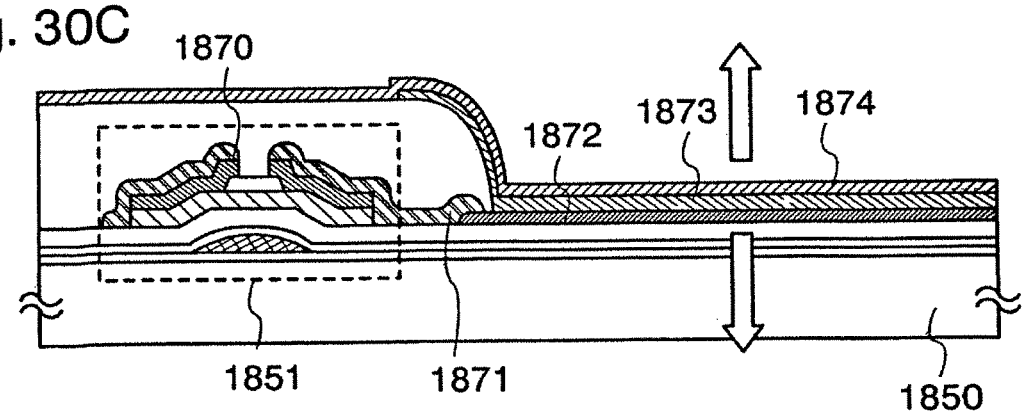

In addition, a color filter may be formed on an counter substrate of the substrate 1850, although not shown in FIGS. 30A to 30C. The color filter can be formed by the droplet discharging method, in that case, photoplasma treatment can be performed as the aforementioned pre-base treatment. The color filter can be formed in a desired pattern with favorable adhesion due to the base film of the invention. High-definition display can be performed by using the color filter. This is because the color filter can adjust a broad peak to be sharp in each emission spectrum of RGB.

The case of forming materials showing each luminescence of RGB is described hereinabove, however, full color display can be performed also by forming a material showing luminescence of a single color and using the material with a color filter or a color conversion layer in combination. For example, in the case of forming an electroluminescent layer showing white or orange luminescence, full color display can be performed by separately providing a color filter, a color conversion layer, or a combination of a color filter and a color conversion layer. For example, the color filter or the color conversion layer may be formed over a second substrate (sealing substrate), and then, be attached to the substrate. As described above, the material showing luminescence of a single color, the color filter, and the color conversion layer can all be formed by the droplet discharging method.

It is needless to say that display of single color luminescence may be performed. For example, an area color type display device may be formed by using single color luminescence. A passive matrix display portion is suitable for the area color type which can display mainly text and symbols.

A material having a low work function can be used for the cathode in the above structure, for example, Ca, Al, CaF, MgAg, AlLi, or the like is preferable. The electroluminescent layer may be any one of a single-layer type, a stacked-layer type, and a mixed-layer type having no interface between layers. Any of the following materials can be used: a singlet material, a triplet material, a combined material thereof, an organic material including a low molecular weight material, a high molecular weight material, and an intermediate molecular weight material, an inorganic material typified by molybdenum oxide which is superior in an electron injecting property, and a composite material of an organic material and an inorganic material. The first electrodes 1854, 1863, and 1872 are formed by using a light-transmissive conductive film which transmits light, for example, a light-transmissive conductive film in which indium oxide is mixed with zinc oxide (ZnO) of 2 to 20 wt % as well as ITO or ITSO. Note that plasma treatment in an oxygen atmosphere or heat treatment in a vacuum atmosphere is preferably performed before forming the first electrodes 1854, 1863, and 1872. A partition wall (also referred to as a bank) is formed by using a material containing silicon, an organic material, or a compound material. In addition, a porous film may be used. Note that it is preferable to form the partition wall by using a photosensitive or non-photosensitive material such as acrylic or polyimide, since a side face thereof becomes a shape in which a curvature radius continuously changes and an upper-layer thin film is formed without break. This embodiment mode can be freely implemented in combination with the above embodiment mode.

Embodiment Mode 13

An appearance of a panel that is one mode of a display device to which the invention is applied is described with reference to FIG. 31.

Figure 31:
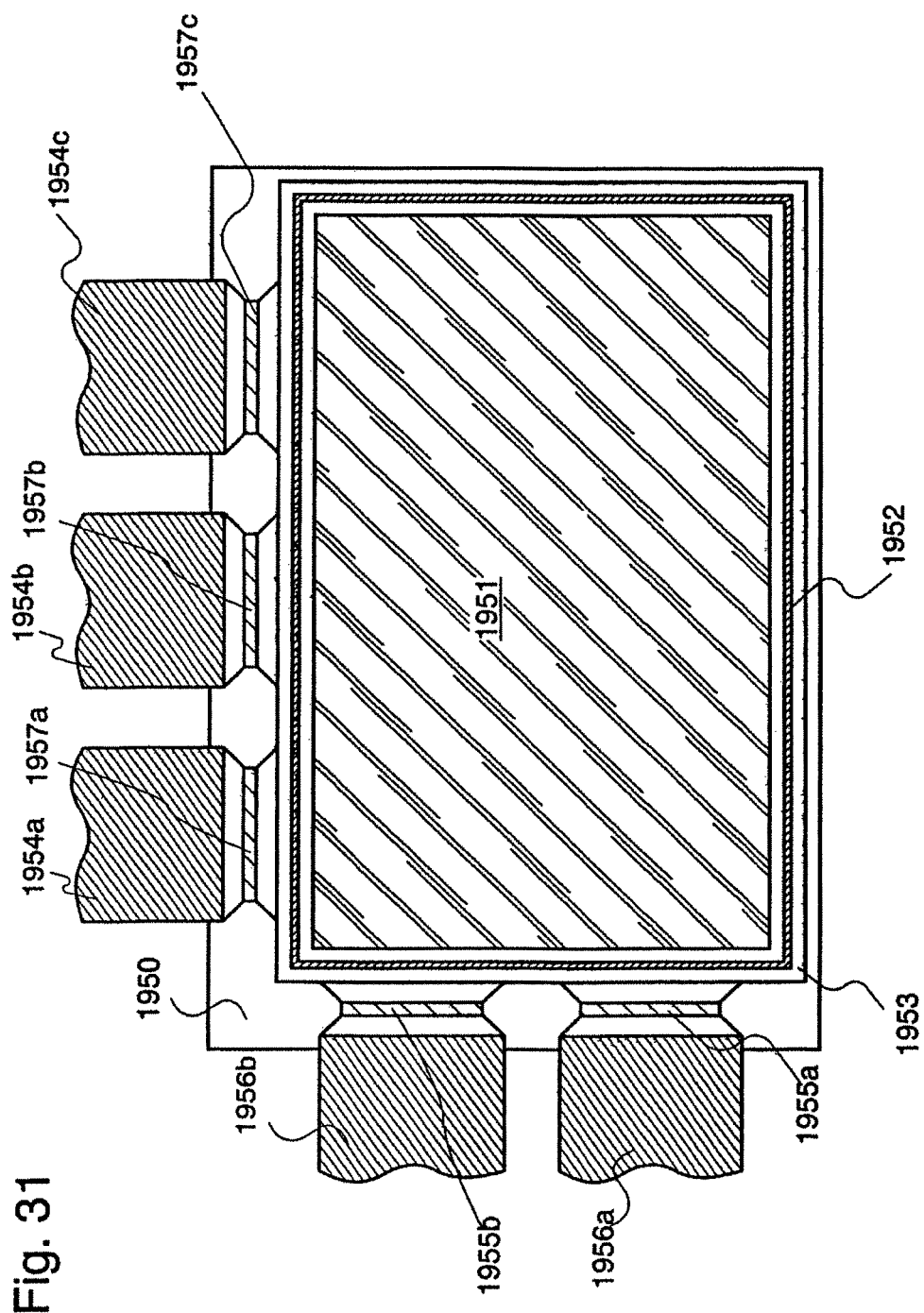
FIG. 31 is a top plan view of a panel which is one mode of a semiconductor device to which the invention is applied.

In a panel shown in FIG. 31, a driver IC in which a driver circuit is formed around a pixel portion 1951 is mounted by a COG (Chip On Glass) method. It is needless to say that the driver IC may be mounted by a TAB (Tape Automated Bonding) method as well.

A substrate 1950 is fixed to an counter substrate 1953 with a sealing material 1952. The pixel portion 1951 may utilize an EL element as a display medium. Driver ICs 1955*a* and 1955*b*, and driver ICs 1957*a*, 1957*b*, and 1957*c* may each be an integrated circuit formed by using a single crystalline semiconductor, or an equivalent formed by using a TFT which is manufactured by using a polycrystalline semiconductor. A signal or power is supplied to the driver ICs 1955*a* and 1955*b*, and the driver ICs 1957*a*, 1957*b*, and 1957*c* through FPCs 1954*a*, 1954*b* and 1954*c*, and FPCs 1956*a* and 1956*b*, respectively.

Embodiment Mode 14

Figure 32:
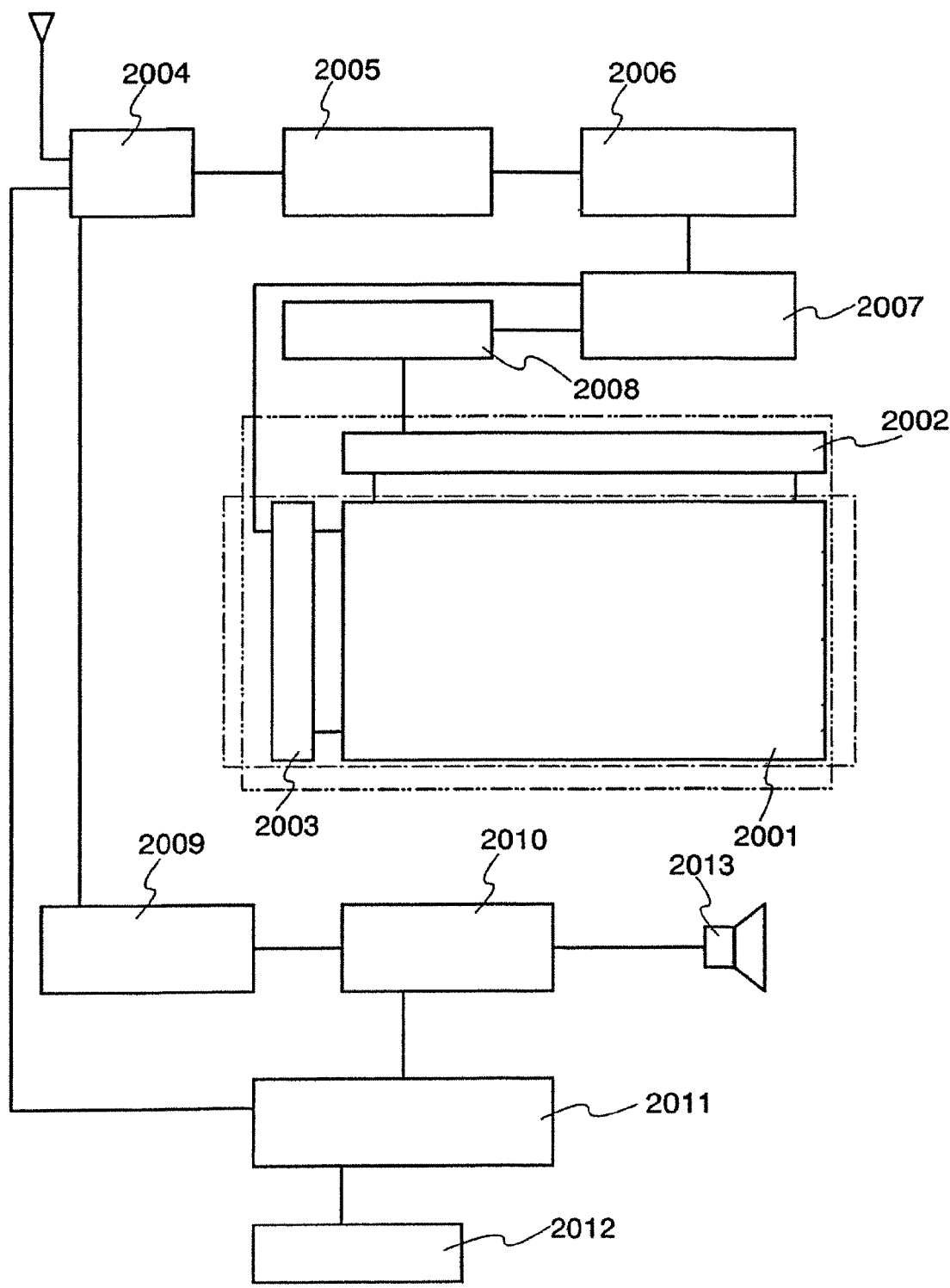
FIG. 32 is a block diagram showing a major configuration of an electronic device of the invention.

An EL TV set can be completed by using a display device formed in accordance with the invention. FIG. 32 is a block diagram showing a main structure of the EL TV set. An EL display panel includes, as a structure as shown in FIG. 31, the case that a scan line driver circuit and a signal line driver circuit are mounted on a pixel portion 1951 and in a periphery thereof by the COG method, that only a pixel portion is formed and the scan line driver circuit and the signal line driver circuit are mounted by the TAB method, and that a TFT is formed using an SAS, a pixel portion and the scan line driver circuit are integrated over a substrate, and the signal line driver circuit is separately mounted as a driver IC, however, any mode may be employed.

Another external circuit may be composed of a video signal amplifier circuit 2005 which amplifies a video signal among signals received by a tuner 2004, a video signal processing circuit 2006 which converts a signal to be outputted therefrom into a chrominance signal corresponding to each color of red, green, and blue, a control circuit 2007 which converts the video signal so as to be inputted to a driver IC, and the like on an input side of a video signal. The control circuit 2007 outputs a signal to both a scan line side and a signal line side. In the case of digital drive, a signal divider circuit 2008 may be provided on the signal line side, and an input digital signal may be divided into m parts and be supplied.

An audio signal among signals received by the tuner 2004 is transmitted to an audio signal amplifier circuit 2009 and is supplied to a speaker 2013 through an audio signal processing circuit 2010. A control circuit 2011 receives control data on a receiving station (reception frequency) or volume from an input portion 2012 and transmits the signal to the tuner 2004 and the audio signal processing circuit 2010.

Figure 33:
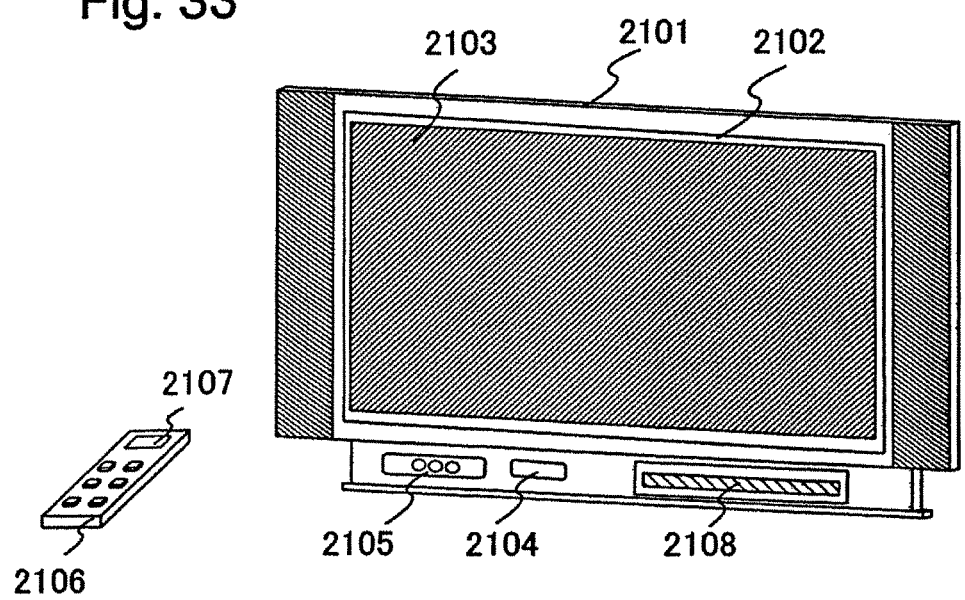
FIG. 33 is a view showing an electronic device to which the invention is applied.

A TV set can be completed by incorporating an EL module including such external circuits into a housing 2101 as shown in FIG. 33. A display screen 2021 is formed by using an EL display module, and a speaker 2202, an operating switch 2024, and the like may be provided as accessory equipment. In this manner, a TV set can be completed in accordance with the invention.

In addition, reflected light of light entering externally may be blocked by using a wave plate and a polarizing plate. A λ/4 plate or a λ/2 plate are used as the wave plate, and may be designed to be able to control light. A module has a stacked structure of a TFT element substrate, a light emitting element, a sealing substrate (sealing material), a wave plate (a λ/4 plate or a λ/2 plate), and a polarizing plate, and light emitted from a light emitting element passes therethrough and is emitted outside the polarizing plate side. The wave plate and the polarizing plate may be provided on an a side of to which light is emitted. In the case of a dual emission light emitting display device which emits light to both sides, the wave plate and the polarizing plate can be provided on both sides. In addition, an anti-reflective film may be provided outside the polarizing plate. Accordingly, a high definition precise image can be displayed.

A display panel 2102 utilizing an EL element is incorporated in the housing 2101. Not only can ordinary TV broadcasting be received by a receiver 2105, but also one-way data communication (from a transmitter to a receiver) or two-way data communication (between a transmitter and a receiver or between receivers) can be achieved by connecting to a communication network with or without a wire through a modem 2104. The TV set can be operated by a switch incorporated in the housing or a separately provided remote control unit 2106, and a display portion 2107 showing information to be outputted may be included in the remote control unit.

Further, the TV set may also have a sub screen 2108 formed of a second display panel which displays channels or volume, in addition to a main screen 2103. The main screen 2103 and the sub screen 2108 may be formed by using an EL display panel. Alternatively, the main screen 2103 may be formed by an EL display panel having an excellent viewing angle and the sub screen 2108 may be formed by using a liquid crystal display panel capable of displaying at low power consumption in the above structure. Further, in the case of giving priority on the low power consumption, the main screen 2103 may be formed by using a liquid crystal display panel, the sub screen 2108 may be formed by using an EL display panel which can blink. A highly reliable display device can be formed by applying the invention even when such a large substrate is used, and a large number of TFTs or electronic parts are used.

It is needless to say that the invention is not limited to a TV set and can be used for various applications particularly for a large display medium such as an information display board in a train station, an airport, or the like, or an advertisement display board on the street as well as a monitor of a personal computer.

Embodiment Mode 15

Various display devices can be manufactured by applying the invention. That is to say, the invention can be applied to various electronic devices in which the display device is incorporated in a display portion.

Such electronic devices can be given as follows: a camera such as a video camera and a digital camera, a projector, a head mounted display (a goggle type display), a car navigation system, a car stereo, a personal computer, a game machine, a portable information terminal (a mobile computer, a cellular phone, an electronic book, or the like), an image reproducing device including a recording medium (specifically, a device capable of reproducing the recording medium such as a Digital Versatile Disc (DVD) and having a display that can display the reproduced image), and the like. Examples thereof are shown in FIGS. 34A to 34C.

Figure 34A:
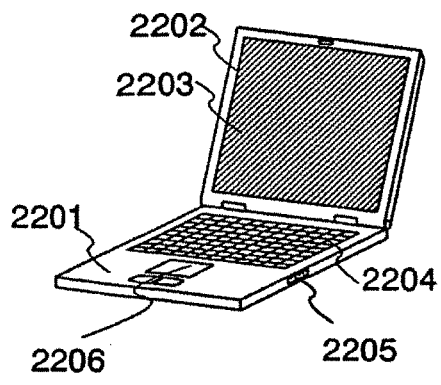
FIGS. 34A to 34C are views showing electronic devices to which the invention is applied.

FIG. 34A shows a laptop personal computer, which includes a main body 2201, a housing 2202, a display portion 2203, a keyboard 2204, an external connection port 2205, a pointing mouse 2206, and the like. The invention is applied for manufacturing the display portion 2203. When the invention is applied, a laptop personal computer having a display portion with high display quality can be manufactured at low cost.

Figure 34B:
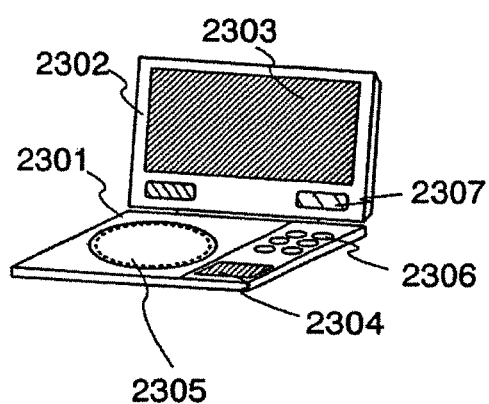

FIG. 34B shows an image reproducing device (specifically, a DVD reproducing device) including an image display portion, which includes a main body 2301, a housing 2302, a display portion A 2303, a display portion B 2304, a recording medium (a DVD or the like) reading portion 2305, an operation key 2306, a speaker portion 2307, and the like. The display portion A 2303 mainly displays image data, and the display portion B 2304 mainly displays text data. The invention is applied for manufacturing the display portion A 2303 and the display portion B 2304. When the invention is applied, an image reproducing device having an image display portion with high display quality can be manufactured at low cost.

Figure 34C:
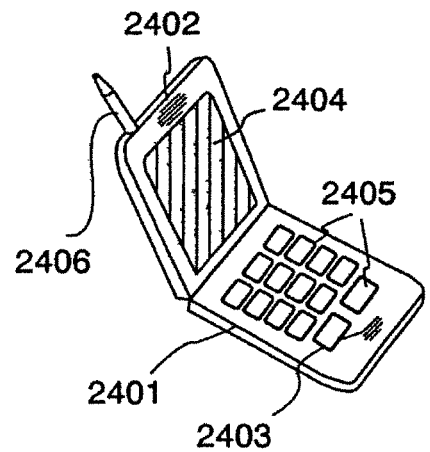

FIG. 34C shows a cellular phone, which includes a main body 2401, an audio output portion 2402, an audio input portion 2403, a display portion 2404, operating switches 2405, an antenna 2406, and the like. When a display device manufactured in accordance with the invention is applied to the display portion 2404, a cellular phone having a display portion with high display quality can be manufactured at low cost.

Figure 35A:
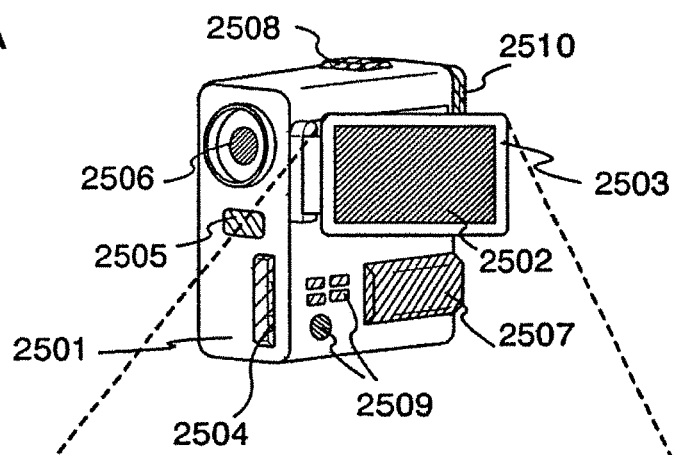
FIGS. 35A to 35C are views showing electronic devices to which the invention is applied.
Figure 35B:
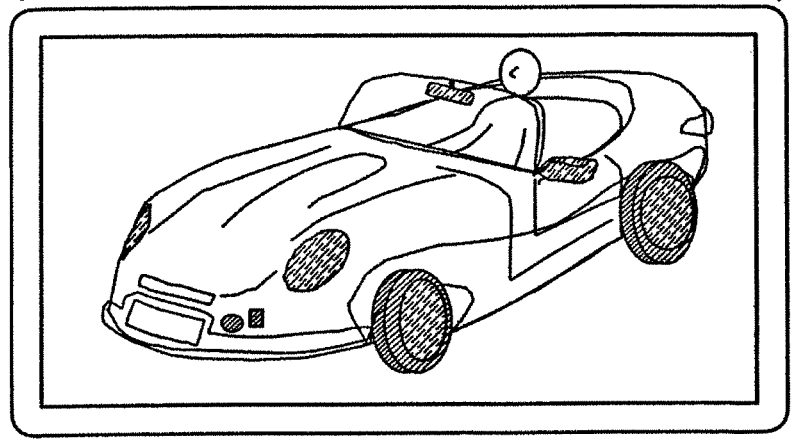
Figure 35C:
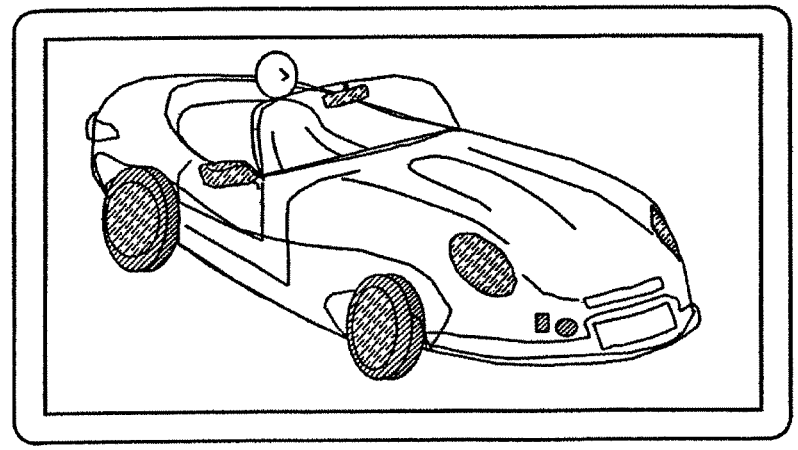

FIG. 35A shows a video camera which includes a main body 2501, a display portion 2502, a housing 2503, an external connecting port 2504, a remote control receiving portion 2505, an image receiving portion 2506, a battery 2507, an audio input portion 2508, operation keys 2509, an eyepiece portion 2510 and the like. The invention can be applied to the display portion 2502, which is a dual emission light emitting display device. FIGS. 35B and 35C show an image displayed in the display portion 2502. FIG. 35B shows an image being shot, and FIG. 35C shows an image which can be seen from the side of a vehicle being shot. Since the display device of the invention is a light transmissive type and thus an image can be displayed on both sides, the image being shot can be seen from a subject side as well. Therefore, it is also convenient to shoot a picture of oneself. In addition, the invention can be applied to a digital video camera or the like as well as a video camera for which a similar effect can be obtained. By applying the display device manufactured in accordance with the invention to the display portion 2502, a camera such as a video camera and a digital video camera having a display portion with high display quality can be manufactured at low cost. This embodiment can be freely implemented in combination with the above embodiment modes.

The present application is based on Japanese Priority Application No. 2004-353457 filed on Dec. 6, 2004 with the Japan Patent Office, the entire contents of which are hereby incorporated by reference.

EXPLANATION OF REFERENCE

100: pixel portion (display region), 101: switching TFT, 104: driving TFT, 106: EL element, 108: capacitor, 503: pixel portion (display region), 504: pixel portion (display region), 505: pixel portion (display region), 605: gate insulating layer, 606: insulating layer, 800: substrate, 801: base film, 802: conductive layer, 803: conductive layer, 804: insulating layer, 805: gate insulating layer, 806: conductive layer, 807: semiconductor layer, 808: N-type semiconductor layer, 809: channel protective film, 811: mask layer, 813: mask layer, 815: conductive layer, 816: conductive layer, 817: conductive layer, 818: through hole, 820: insulating layer, 821: electroluminescent layer, 822: conductive layer, 850: sealing substrate, 851: sealing material, 854: circuit in each pixel 860: gate wiring layer, 861: anisotropic conductive layer, 862: flexible printed circuit (FPC), 900: substrate, 903: droplet discharging unit, 904: image pickup unit, 905: head, 907: control unit, 908: memory medium, 909, image processing unit, 910: computer, 911: marker, 954: circuit in each pixel, 1001: TFT (switching TFT), 1002: TFT (driving TFT), 1003: light emitting element (EL element), 1004: capacitor, 1005: source signal line, 1006: gate signal line, 1007: power supply line, 1054: circuit in each pixel, 1154: circuit in each pixel, 1200: substrate, 1201: base film, 1202: conductive layer, 1203: conductive layer, 1205: gate insulating layer, 1206: conductive layer, 1207: semiconductor layer, 1208: N-type semiconductor layer, 1211: mask layer, 1213: mask layer, 1215: conductive layer, 1216: conductive layer, 1217: conductive layer, 1218: through hole, 1220: insulating layer, 1221: electroluminescent layer, 1222: conductive layer, 1254: circuit in each pixel, 1300: substrate, 1301: base film, 1302: gate electrode layer, 1303: gate electrode layer, 1305: gate insulating layer, 1306: conductive layer, 1307: semiconductor layer, 1311: mask layer, 1313: mask layer, 1315: conductive layer, 1316: conductive layer, 1317: conductive layer, 1320: insulating layer, 1321: electroluminescent layer, 1322: conductive layer, 1330: conductive layer, 1331: conductive layer, 1400: substrate, 1401: base film, 1402: conductive layer, 1403: conductive layer, 1405: gate insulating layer, 1406: conductive layer, 1407: semiconductor layer, 1408: N-type semiconductor layer, 1409: channel protective film, 1411: mask layer, 1413: mask layer, 1415: conductive layer; 1416: conductive layer, 1417: conductive layer, 1418: through hole, 1420: insulating layer, 1421: electroluminescent layer, 1422: conductive I layer, 1441: insulating layer, 1500: substrate, 1501: base film, 1502: conductive layer, 1503: conductive layer, 1505: gate insulating layer, 1506: conductive layer, 1507: semiconductor layer, 1508: N-type semiconductor layer, 1511: mask layer, 1513: mask layer, 1515: conductive layer, 1516: conductive layer, 1517: conductive layer, 1518: through hole, 1520: insulating layer, 1521: electroluminescent layer, 1522: conductive layer, 1600: substrate, 1601: base film, 1602: conductive layer, 1603: conductive layer, 1605: gate insulating layer, 1606: conductive layer, 1607: semiconductor layer, 1611: mask layer, 1613: mask layer, 1615: conductive layer, 1616: conductive layer, 1617: conductive layer, 1620: insulating layer, 1621: electroluminescent layer, 1622: conductive layer, 1630: conductive layer, 1631: conductive layer, 1700: substrate, 1701: base film, 1702: conductive layer, 1703: conductive layer, 1704: conductor, 1705: gate insulating layer, 1706: conductive layer, 1707: semiconductor layer, 1708: N-type semiconductor layer, 1709: channel protective film, 1711: mask layer, 1715: conductive layer, 1716: conductive layer, 1717: conductive layer, 1720: insulating layer, 1721: electroluminescent layer, 1722: conductive layer, 1850: substrate, 1851: transistor, 1852: source wiring or drain wiring, 1853: source wiring or drain wiring, 1854: electrode, 1855: electroluminescent layer, 1856: electrode, 1861: source wiring or drain wiring, 1862: source wiring or drain wiring, 1863: electrode, 1864: electroluminescent layer, 1865: electrode, 1870: source wiring or drain wiring, 1871: source wiring or drain wiring, 1872: electrode, 1873: electroluminescent layer, 1874: electrode, 1950: substrate, 1951: pixel portion, 1952: sealing material, 1953: counter substrate, 1954*a*: FPC, 1954*b*: FPC, 1954*c*: FPC, 1955*a*: driver IC, 1955*b*: driver IC, 1956*a*: FPC, 1956*b*: FPC, 1957*a*: driver IC, 1957*b*: driver IC, 1957*c*: driver IC, 2001: EL display panel, 2002: source signal line driver circuit, 2003: a gate signal line driver circuit, 2004: tuner, 2005: video signal amplifier circuit, 2007: control circuit, 2008: signal divider circuit, 2009: audio signal amplifier circuit, 2010: audio signal amplifier circuit, 2011: control circuit, 2012: input portion, 2013: speaker, 2021: display screen, 2022: speaker, 2024: operating switch, 2101: housing, 2102: display panel, 2103: main screen, 2104: modem, 2105: receiver, 2106: remote control unit, 2107: display portion, 2108: sub-display, 2201: main body, 2202: housing, 2203: display portion, 2204: keyboard, 2205: external connecting port, 2206: pointing mouse, 2301: main body, 2302: housing, 2303: display portion A, 2304: display portion B, 2306: operating key, 2307: speaker portion, 2401: main body, 2402: audio output portion, 2403: audio input portion, 2404: display portion, 2405: operating switches, 2406: antenna, 2501: main body, 2502: display portion, 2503: housing, 2504: external connecting port, 2505: remote control receiving portion, 2506: receiving portion, 2507: battery, 2508: audio input portion, 2509: operating keys

What is claimed is:

1. A semiconductor device comprising:
   a first pixel over a first substrate, wherein the first pixel comprises:
      a first electrode over the first substrate;
      an insulating layer over the first electrode;
      an electroluminescent layer over the first electrode and the insulating layer; and
      a second electrode over the electroluminescent layer and the insulating layer;
   a second pixel over the first substrate;
   a third pixel over the first substrate;
   a fourth pixel over the first substrate;
   a first power supply line electrically connected to the first pixel and the second pixel;
   a second power supply line electrically connected to the first power supply line;
   a third power supply line electrically connected to the third pixel and the fourth pixel and electrically connected to the second power supply line, wherein the second power supply line intersects with the first power supply line and the third power supply line;
   a first line electrically connected to the first pixel and the third pixel;
   a second line electrically connected to the second pixel and the fourth pixel;
   a gate signal line driver circuit, wherein a first terminal of the gate signal line driver circuit is electrically connected to the first line and the second line; and
   a second substrate fixed to the first substrate with a sealing material without interposing the insulating layer between the sealing material and the first substrate.

2. A display module comprising the semiconductor device according to claim 1, wherein the display module comprises a flexible printed circuit electrically connected to a conductive layer on the first substrate.

3. The semiconductor device according to claim 1, further comprising:
   a fifth pixel adjacent to the second pixel;
   a first source signal line electrically connected to the first pixel;
   a second source signal line electrically connected to the second pixel; and
   a third source signal line electrically connected to the fifth pixel.

4. The semiconductor device according to claim 1, further comprising:
   a fifth pixel over the first substrate; and
   a third line electrically connected to the fifth pixel,
   wherein a second terminal of the gate signal line driver circuit is electrically connected to the third line.

5. The semiconductor device according to claim 1, wherein the first pixel comprises a top gate type thin film transistor electrically connected to the first electrode.

6. A cellular phone comprising the semiconductor device according to claim 1.

7. A semiconductor device comprising:
   a first pixel over a first substrate, wherein the first pixel comprises:
      a first electrode over the first substrate;
      a first insulating layer over the first electrode;
      an electroluminescent layer over the first electrode and the first insulating layer;
      a second electrode over the electroluminescent layer and the first insulating layer;
      a semiconductor layer over the first substrate;
      a second insulating layer over the semiconductor layer; and
      a gate electrode over the second insulating layer;
   a second pixel over the first substrate;
   a third pixel over the first substrate;
   a fourth pixel over the first substrate;
   a first power supply line electrically connected to the first pixel and the second pixel;
   a second power supply line electrically connected to the first power supply line;
   a third power supply line electrically connected to the third pixel and the fourth pixel, and electrically connected to the second power supply line, wherein the second power supply line intersects with the first power supply line and the third power supply line;
   a first line electrically connected to the first pixel and the third pixel;
   a second line electrically connected to the second pixel and the fourth pixel;
   a gate signal line driver circuit, wherein a first terminal of the gate signal line driver circuit is electrically connected to the first line and the second line; and
   a second substrate fixed to the first substrate with a sealing material without interposing the second insulating layer between the sealing material and the first substrate.

8. A display module comprising the semiconductor device according to claim 7, wherein the display module comprises a flexible printed circuit electrically connected to a conductive layer on the first substrate.

9. The semiconductor device according to claim 7, further comprising:
   a fifth pixel adjacent to the second pixel;
   a first source signal line electrically connected to the first pixel;
   a second source signal line electrically connected to the second pixel; and
   a third source signal line electrically connected to the fifth pixel.

10. The semiconductor device according to claim 7, further comprising:
    a fifth pixel over the first substrate; and
    a third line electrically connected to the fifth pixel,
    wherein a second terminal of the gate signal line driver circuit is electrically connected to the third line.

11. A cellular phone comprising the semiconductor device according to claim 7.

12. A semiconductor device comprising:
    a first pixel over a first substrate, wherein the first pixel comprises:
       a first electrode over the first substrate;
       a first insulating layer over the first electrode;
       an electroluminescent layer over the first electrode and the first insulating layer;
       a second electrode over the electroluminescent layer and the first insulating layer;
       a second insulating layer over the first substrate;
       a semiconductor layer over the second insulating layer;
       a third insulating layer over the semiconductor layer; and
       a gate electrode over the third insulating layer;
    a second pixel over the first substrate;
    a third pixel over the first substrate;

a fourth pixel over the first substrate;
a first power supply line electrically connected to the first pixel and the second pixel;
a second power supply line electrically connected to the first power supply line;
a third power supply line electrically connected to the third pixel and the fourth pixel and electrically connected to the second power supply line, wherein the second power supply line intersects with the first power supply line and the third power supply line;
a first line electrically connected to the first pixel and the third pixel;
a second line electrically connected to the second pixel and the fourth pixel;
a gate signal line driver circuit, wherein a first terminal of the gate signal line driver circuit is electrically connected to the first line and the second line; and
a second substrate fixed to the first substrate with a sealing material, wherein the second insulating layer is interposed between the sealing material and the first substrate.

13. A display module comprising the semiconductor device according to claim 12, wherein the display module comprises a flexible printed circuit electrically connected to a conductive layer on the first substrate.

14. The semiconductor device according to claim 12, further comprising:
a fifth pixel adjacent to the second pixel;
a first source signal line electrically connected to the first pixel;
a second source signal line electrically connected to the second pixel; and
a third source signal line electrically connected to the fifth pixel.

15. The semiconductor device according to claim 12, wherein the second insulating layer comprises a photocatalytic substance.

16. The semiconductor device according to claim 12, further comprising:
a fifth pixel over the first substrate; and
a third line electrically connected to the fifth pixel,
wherein a second terminal of the gate signal line driver circuit is electrically connected to the third line.

17. A cellular phone comprising the semiconductor device according to claim 12.

18. A semiconductor device comprising:
a first pixel over a first substrate, wherein the first pixel comprises:
a top gate type thin film transistor over the first substrate, wherein the top gate type thin film transistor comprises a semiconductor layer comprising polysilicon;
a first electrode over the first substrate, the first electrode electrically connected to the top gate type thin film transistor;
an insulating layer over the first electrode and the top gate type thin film transistor;
an electroluminescent layer over the first electrode and the insulating layer, the electroluminescent layer comprising an organic material; and
a second electrode over the electroluminescent layer and the insulating layer;
a second pixel over the first substrate;
a third pixel over the first substrate;
a fourth pixel over the first substrate;
a first power supply line electrically connected to the first pixel and the second pixel;
a second power supply line electrically connected to the first power supply line;
a third power supply line electrically connected to the third pixel and the fourth pixel and electrically connected to the second power supply line, wherein the second power supply line intersects with the first power supply line and the third power supply line;
a first line electrically connected to the first pixel and the third pixel;
a second line electrically connected to the second pixel and the fourth pixel;
a gate signal line driver circuit, wherein a first terminal of the gate signal line driver circuit is electrically connected to the first line and the second line; and
a second substrate fixed to the first substrate with a sealing material without interposing the insulating layer between the sealing material and the first substrate.

19. A display module comprising the semiconductor device according to claim 18, wherein the display module comprises a flexible printed circuit electrically connected to a conductive layer on the first substrate.

20. The semiconductor device according to claim 18, further comprising:
a fifth pixel adjacent to the second pixel;
a first source signal line electrically connected to the first pixel;
a second source signal line electrically connected to the second pixel; and
a third source signal line electrically connected to the fifth pixel.

21. The semiconductor device according to claim 18, further comprising:
a second insulating layer comprising a photocatalytic substance between the first substrate and the top gate type thin film transistor.

22. The semiconductor device according to claim 18, further comprising:
a fifth pixel over the first substrate; and
a third line electrically connected to the fifth pixel,
wherein a second terminal of the gate signal line driver circuit is electrically connected to the third line.

23. A cellular phone comprising the semiconductor device according to claim 18.

* * * * *

UNITED STATES PATENT AND TRADEMARK OFFICE
CERTIFICATE OF CORRECTION

PATENT NO.        : 8,547,315 B2
APPLICATION NO.   : 13/540664
DATED             : October 1, 2013
INVENTOR(S)       : Yasunori Yoshida et al.

It is certified that error appears in the above-identified patent and that said Letters Patent is hereby corrected as shown below:

In the Specification

Column 10, line 34, "or, polycrystalline" should read --or polycrystalline--.
Column 16, line 34, "Manufactured." should read --manufactured.--.
Column 26, line 59, "VyR." should read --Vy1R.--.
Column 29, line 3, "R, G;" should read --R, G,--.
Column 29, line 58, "Vyn)," should read --Vym),--.
Column 36, line 21, "1000 Torn" should read --1000 Torr--.
Column 40, line 8, "method, In" should read --method. In--.
Column 47, line 5, "atmospheric 80 pressure," should read --atmospheric pressure,--.

Signed and Sealed this
Eighteenth Day of February, 2014

Michelle K. Lee
*Deputy Director of the United States Patent and Trademark Office*